(12) United States Patent
Itonaga et al.

(10) Patent No.: US 10,553,637 B2
(45) Date of Patent: *Feb. 4, 2020

(54) SEMICONDUCTOR DEVICE, MANUFACTURING METHOD THEREOF, AND ELECTRONIC APPARATUS

(71) Applicant: Sony Corporation, Tokyo (JP)

(72) Inventors: Kazuichiroh Itonaga, Tokyo (JP); Machiko Horiike, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/121,332

(22) Filed: Sep. 4, 2018

(65) Prior Publication Data

US 2019/0074319 A1 Mar. 7, 2019

Related U.S. Application Data

(63) Continuation of application No. 15/718,349, filed on Sep. 28, 2017, now Pat. No. 10,115,763, which is a
(Continued)

(30) Foreign Application Priority Data

Dec. 15, 2010 (JP) ................................ 2010-279833

(51) Int. Cl.
*H01L 27/146* (2006.01)
*H04N 5/374* (2011.01)
(Continued)

(52) U.S. Cl.
CPC .. *H01L 27/14647* (2013.01); *H01L 21/76898* (2013.01); *H01L 23/481* (2013.01); *H01L 23/552* (2013.01); *H01L 27/1464* (2013.01); *H01L 27/1469* (2013.01); *H01L 27/14603* (2013.01); *H01L 27/14634* (2013.01); *H01L 27/14636* (2013.01); *H01L 27/14638* (2013.01); *H01L 27/14687* (2013.01); *H04N 5/374* (2013.01); *H01L 31/02002* (2013.01); *H01L 2224/08145* (2013.01);
(Continued)

(58) Field of Classification Search
CPC ......... H01L 27/14647; H01L 27/14603; H01L 27/14634; H01L 27/14687; H01L 27/1464; H01L 27/1469
See application file for complete search history.

(56) References Cited

U.S. PATENT DOCUMENTS 10,115,763 B2 * 10/2018 Itonaga ............ H01L 21/76898

* cited by examiner

*Primary Examiner* — Matthew L Reames
(74) *Attorney, Agent, or Firm* — Sheridan Ross P.C.

(57) ABSTRACT

A semiconductor device, which is configured as a backside illuminated solid-state imaging device, includes a stacked semiconductor chip which is formed by bonding two or more semiconductor chip units to each other and in which, at least, a pixel array and a multi-layer wiring layer are formed in a first semiconductor chip unit and a logic circuit and a multi-layer wiring layer are formed in a second semiconductor chip unit; a semiconductor-removed region in which a semiconductor section of a part of the first semiconductor chip unit is completely removed; and a plurality of connection wirings which is formed in the semiconductor-removed region and connects the first and second semiconductor chip units to each other.

13 Claims, 53 Drawing Sheets

Related U.S. Application Data continuation of application No. 14/248,948, filed on Apr. 9, 2014, now Pat. No. 9,812,490, which is a continuation of application No. 13/312,261, filed on Dec. 6, 2011, now Pat. No. 8,742,524.

(51) Int. Cl.
*H01L 21/768* (2006.01)
*H01L 23/48* (2006.01)
*H01L 23/552* (2006.01)
*H01L 31/02* (2006.01)

(52) U.S. Cl.
CPC ............... *H01L 2224/24147* (2013.01); *H01L 2224/45147* (2013.01); *H01L 2224/48* (2013.01); *H01L 2224/80001* (2013.01); *H01L 2224/80896* (2013.01); *H01L 2224/82* (2013.01); *H01L 2224/8203* (2013.01); *H01L 2224/92* (2013.01); *H01L 2924/00011* (2013.01); *H01L 2924/00014* (2013.01); *H01L 2924/01004* (2013.01); *H01L 2924/01005* (2013.01); *H01L 2924/01015* (2013.01); *H01L 2924/01047* (2013.01); *H01L 2924/13091* (2013.01); *H01L 2924/3011* (2013.01)

151

20

21

SEMICONDUCTOR DEVICE, MANUFACTURING METHOD THEREOF, AND ELECTRONIC APPARATUS

CROSS-REFERENCE TO RELATED APPLICATIONS

This application is a continuation of U.S. patent application Ser. No. 15/718,349, filed Sep. 28, 2017, which is a continuation of U.S. patent application Ser. No. 14/248,948, filed Apr. 9, 2014, now U.S. Pat. No. 9,812,490, which is a continuation of U.S. patent application Ser. No. 13/312,261, filed Dec. 6, 2011, now U.S. Pat. No. 8,742,524, which claims priority to Japanese Patent Application Serial No. JP 2010-279833, filed in the Japan Patent Office on Dec. 15, 2010, the entire disclosures of which are hereby incorporated herein by reference.

BACKGROUND

The present disclosure relates to a semiconductor device such as a solid-state imaging device, a manufacturing method thereof, and an electronic apparatus, such as a camera, including the solid-state imaging device.

As a solid-state imaging device, there is known an amplification type solid-state imaging device such as an MOS, such as a CMOS (Complementary Metal Oxide Semiconductor), image sensor. Further, there is known a charge transfer type solid-state imaging device such as a CCD (Charge Coupled Device) image sensor. These solid-state imaging devices are widely used in digital still cameras, digital video cameras, or the like. In recent years, as solid-state imaging devices mounted in mobile apparatuses such as portable telephones with a camera or PDAs (Personal Digital Assistants), MOS image sensors have widely been used in terms of low power voltage and power consumption.

In the MOS solid-state imaging device, a unit pixel includes a photodiode serving as a photoelectric conversion unit and a plurality of pixel transistors. The MOS solid-state imaging device includes a pixel array (pixel region) including the plurality of unit pixels arranged in a two-dimensional array shape and a peripheral circuit region. The plurality of pixel transistors are formed as MOS transistors and includes three transistors, that is, a transmission transistor, a reset transistor, an amplification transistor or four transistors further including a selection transistor.

Hitherto, as such a MOS solid-state imaging device, there have been suggested various solid-state imaging devices in which a semiconductor chip including a pixel array, in which a plurality of pixels is arranged, and a semiconductor chip including a logic circuit performing signal processing are electrically connected to each other and are thus configured as a single device. For example, Japanese Unexamined Patent Application Publication No. 2006-49361 discloses a semiconductor module in which a backside illuminated image sensor chip including a micro-pad in each pixel cell and a signal processing chip including micro-pads, in which a signal processing circuit is formed, are connected to each other by micro-bumps.

International Publication No. WO2006/129762 discloses a semiconductor image sensor module in which a first semiconductor chip including an image sensor, a second semiconductor chip including an analog/digital converter array, and a third semiconductor chip including a memory element array are stacked. The first semiconductor chip and the second semiconductor chip are connected to each other via a bump which is a conductive connection conductor. The second semiconductor chip and the third semiconductor chip are connected to each other by a through contact perforated through the second semiconductor chip.

As disclosed in Japanese Unexamined Patent Application Publication No. 2006-49361, there have been suggested various techniques for consolidating different circuit chips such as the image sensor chip and the logic circuit performing signal processing. In the related techniques, substantially finished functional chips are connected to each other via formed through connection holes. Alternatively, the chips are connected to each other via bumps.

SUMMARY

The applicant has suggested a solid-state imaging device in which a semiconductor chip unit including a pixel array and a semiconductor chip unit including a logic circuit are bonded to each other, so that the respective semiconductor chips exert sufficient performance and mass production and low cost are thus achieved. The solid-state imaging device is formed by bonding a first semiconductor chip unit including a half-finished pixel array and a second semiconductor chip unit including a half-finished logic circuit, thinning the first semiconductor chip unit, and then connecting the pixel array and the logic circuit. The pixel array and the logic circuit are connected by forming a connection conductor connected to a wiring of the first semiconductor chip unit, a through connection conductor perforated through the first semiconductor chip unit and connected to a wiring of the second semiconductor chip unit, and a connection wiring formed as a connection conductor connecting both the connection conductors to each other. Thereafter, the finished product is divided into chips, and thus the solid-state imaging device is configured as a backside illuminated solid-state imaging device.

In the solid-state imaging device, the connection conductor and the through connection conductor are formed so as to be buried in through holes perforated through a silicon substrate of the first semiconductor chip unit with an insulation film interposed therebetween. The cross-sectional areas of the connection conductor and the through connection conductor are relatively broad. For this reason, when parasitic capacitance caused between the silicon substrate and the connection conductor and the through connection conductor is not ignored, it has been proved that the parasitic capacitance may deteriorate a driving speed of a circuit and thus may cause deterioration in high performance of the solid-state imaging device.

In the solid-state imaging device having a configuration in which the bonded semiconductor chip units are connected to each other by the connection conductor and the through connection conductor, a pair of conductors (the connection conductor and the through connection conductor) is connected to each wiring (that is, routing wiring) corresponding to each vertical signal line. At this time, ground capacity and adjacent coupling capacitance occur as the parasitic capacitance. For example, the ground capacity is parasitic capacitance between a wiring and a semiconductor substrate with a ground potential. The adjacent coupling capacitance is parasitic capacitance between adjacent routing wirings or a pair of adjacent conductors. The ground capacity can be resolved when power is enhanced or a buffer circuit flowing current is provided. However, the adjacent coupling capacitance may not be resolved due to interference with an adjacent line.

The problems with the parasitic capacitance may occur even in a semiconductor device in which semiconductor chip units each including a semiconductor integrated circuit are bonded to each other and the semiconductor chip units are connected to each other by a connection conductor and a through connection conductor.

It is desirable to provide a semiconductor device such as a solid-state imaging device and a manufacturing method thereof capable of reducing parasitic capacitance and achieving high performance. Further, it is desirable to provide an electronic apparatus such as a camera including the solid-state imaging device.

According to an embodiment of the disclosure, there is provided a semiconductor device including a stacked semiconductor chip which is formed by bonding two or more semiconductor chip units to each other and in which at least a pixel array and a multi-layer wiring layer are formed in a first semiconductor chip unit and a logic circuit and a multi-layer wiring layer are formed in a second semiconductor chip unit. The first semiconductor ship unit includes a semiconductor-removed region in which a semiconductor section of a part of the first semiconductor chip unit is completely removed. The semiconductor device according to the embodiment of the disclosure includes a plurality of connection wirings which is formed in the semiconductor-removed region and connects the first and second semiconductor chip units to each other. Thus, the semiconductor device is configured as a backside illuminated solid-state imaging device.

In the semiconductor device according to the embodiment of the disclosure, the semiconductor-removed region is formed such that the semiconductor section of a part of the first semiconductor chip having a pixel array is completely removed. The connection wirings connecting the first and second semiconductor chip units are formed in the semiconductor-removed region. Thus, the parasitic capacitance between the connection wirings and the semiconductor can be reduced.

According to another embodiment of the disclosure, there is provided a method of manufacturing a semiconductor device. The method includes bonding two or more semiconductor wafers at least including a first semiconductor wafer and a second semiconductor wafer. In the first semiconductor wafer, a pixel array and a multi-layer wiring layer are formed in a region serving as a first semiconductor chip unit. In the second semiconductor wafer, a logic circuit and a multi-layer wiring layer are formed in a region serving as a second semiconductor chip unit. The method further includes forming a semiconductor-removed region by completely removing a semiconductor section of a part of the region serving as the first semiconductor chip unit in the first semiconductor wafer. The method further includes forming a plurality of connection wirings connecting the first and second semiconductor chip units in the semiconductor-removed region and dividing the semiconductor wafers formed as a finished product into chips. Thus, the backside illuminated solid-state imaging device is manufactured.

In the method of manufacturing the semiconductor device according to the embodiment of the disclosure, two or more semiconductor wafers are bonded to each other, the semiconductor section of a part of the region serving as the first semiconductor chip unit having the pixel array is completely removed, the connection wirings connecting the first and second semiconductor chip units to each other are formed in the semiconductor-removed region. Thus, it is possible to manufacture the backside illuminated solid-state imaging device capable of reducing the parasitic capacitance between the connection wirings and the semiconductor.

According to still another embodiment of the disclosure, there is provided an electronic apparatus including a solid-state imaging device; an optical system guiding incident light to a photoelectric conversion unit of the solid-state imaging device; a signal processing circuit processing a signal output from the solid-state imaging device. The solid-state imaging device includes a stacked semiconductor chip which is formed by bonding two or more semiconductor chip units to each other and in which a pixel array and a multi-layer wiring layer are formed at least in a first semiconductor chip unit and a logic circuit and a multi-layer wiring layer are formed at least in a second semiconductor chip unit. The first semiconductor chip unit includes a semiconductor-removed region in which a semiconductor section of a part of the first semiconductor chip unit is completely removed. The solid-state imaging device according to the embodiment of the disclosure further includes a plurality of connection wirings which is formed in the semiconductor-removed region and connects the first and second semiconductor chip units to each other. The solid-state imaging device is configured as the backside illuminated solid-state imaging device.

The electronic apparatus according to the embodiment of the disclosure includes the backside illuminated solid-state imaging device with the above-described configuration as the solid-state imaging device. Accordingly, the solid-state imaging device is capable of reducing the parasitic capacitance between the semiconductor and the connection wiring connecting the first and second semiconductor chip units.

According to still another embodiment of the disclosure, there is provided a semiconductor device including a stacked semiconductor chip which is formed by bonding two or more semiconductor chip units to each other and in which at least a first semiconductor integrated circuit and a multi-layer wiring layer are formed in a first semiconductor chip unit and a second semiconductor integrated circuit and a multi-layer wiring layer are formed in a second semiconductor chip unit. The first semiconductor chip unit includes a semiconductor-removed region in which a semiconductor section of a part of the first semiconductor chip unit is completely removed. The semiconductor device according to the embodiment of the disclosure further includes a plurality of connection wirings which is formed in the semiconductor-removed region and connects the first and second semiconductor chip units to each other.

In the semiconductor device according to the embodiment of the disclosure, the semiconductor-removed region in which the semiconductor section of a part of the first semiconductor chip unit is completely removed is formed and the connection wirings connecting the first and second semiconductor chip units, in which a semiconductor integrated circuit is formed in the semiconductor-removed region, to each other are formed. Thus, it is possible to reduce the parasitic capacitance between the connection wirings and the semiconductor.

According to the semiconductor device according to the embodiment of the disclosure, it is possible to reduce the parasitic capacitance between the semiconductor and the connection wirings connecting the first and second semiconductor chip units to each other. Accordingly, the backside illuminated solid-state imaging device formed by the bonded chips can be realized with high performance.

According to the method of manufacturing the semiconductor device according to the embodiment of the disclosure, it is possible to reduce the parasitic capacitance between the semiconductor and the connection wirings connecting the first and second semiconductor chip units to each other. Accordingly, the backside illuminated solid-state imaging device formed by the bonded chips can be realized with high performance.

According to the electronic apparatus according to the embodiment of the disclosure, it is possible to reduce the parasitic capacitance and to provide the backside illuminated solid-state imaging device formed by the bonded chips with high performance. Accordingly, it is possible to provide an electronic apparatus such as a high-quality camera.

According to the semiconductor device according to the embodiment of the disclosure, it is possible to reduce the parasitic capacitance between the semiconductor and the connection wirings connecting the first and second semiconductor chip units to each other. Accordingly, the semiconductor integrated circuit device formed by the bonded chips can be realized with high performance.

DETAILED DESCRIPTION OF EMBODIMENTS

Hereinafter, modes for carrying out the present disclosure (hereinafter, referred to as embodiments) will be described. The description will be made in the following order.

1. Example of Overall Configuration of MOS Solid-state Imaging Device
2. First Embodiment (Example of Configuration of Solid-state Imaging Device and Example of Manufacturing Method Thereof)
3. Second Embodiment (Example of Configuration of Solid-state Imaging Device and Example of Manufacturing Method Thereof)
4. Third Embodiment (Example of Configuration of Solid-state Imaging Device and Example of Manufacturing Method Thereof)
5. Fourth Embodiment (Example of Configuration of Solid-state Imaging Device)
6. Fifth Embodiment (Example of Configuration of Solid-state Imaging Device)
7. Sixth Embodiment (Example of Configuration of Solid-state Imaging Device)
8. Seventh Embodiment (Example of Configuration of Solid-state Imaging Device)
9. Eighth Embodiment (Example of Configuration of Semiconductor Device)
10. Ninth Embodiment (Example of Configuration of Semiconductor Device)
11. Tenth Embodiment (Example of Configuration of Semiconductor Device)
12. Eleventh Embodiment (Example of Configuration of Electronic Device)

1. Example of Overall Configuration of MOS Solid-State Imaging Device

Figure 1:
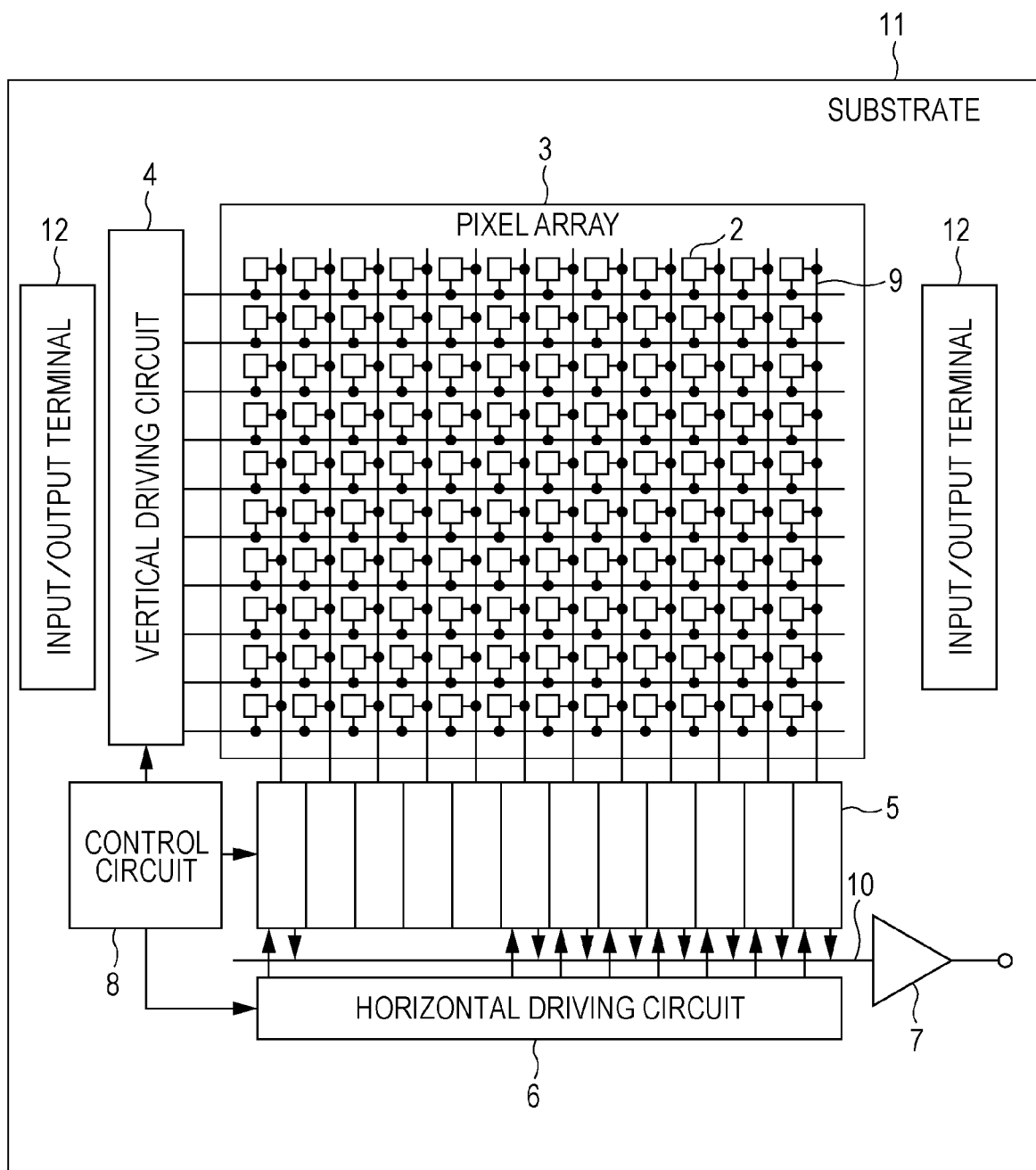
FIG. 1 is a diagram of the overall configuration of an example of a MOS solid-state imaging device applied to embodiments of the disclosure.

FIG. 1 is a diagram of the overall configuration of a MOS solid-state imaging device applied to a semiconductor device according to embodiments of the disclosure. The MOS solid-state imaging device is applied to a solid-state imaging device according to respective embodiments. As shown in FIG. 1, an exemplary solid-state imaging device 1 includes a pixel array (so-called pixel region) 3, in which pixels 2 including a plurality of photoelectric conversion units are regularly arranged in a 2-dimensional array form on a semiconductor substrate 11 such as a silicon substrate, and a peripheral circuit section. The pixel 2 includes the photoelectric conversion units such as photodiodes and a plurality of pixel transistors (so-called MOS transistors) The plurality of pixel transistors can include, for example, three transistors: a transmission transistor, a reset transistor, and an amplification transistor. The plurality of pixel transistors can include four transistors by further providing a selection transistor. An equivalent circuit of a unit pixel has a general configuration and thus the detailed description will not be made. The pixel 2 can be configured as one unit pixel. Further, the pixel 2 has a pixel-shared structure. The pixel-shared structure is formed by a plurality of photodiodes, a plurality of transmission transistors, one shared floating diffusion, and one shared pixel transistor. That is, in the pixel-shared structure, the photodiodes and the transmission transistors forming the plurality of unit pixels share each different pixel transistor.

The peripheral circuit section includes a vertical driving circuit 4, column signal processing circuits 5, a horizontal driving circuit 6, an output circuit 7, and a control circuit 8.

The control circuit 8 receives data regarding an instruction of an input clock, an operation mode, or the like and outputs data regarding internal information or the like of the solid-state imaging device. That is, the control circuit 8 generates clock signals or control signals serving as references of the operations of the vertical driving circuit 4, the column signal processing circuits 5, the horizontal driving circuit 6, and the like in accordance with a vertical synchronization signal, a horizontal synchronization signal, and a master clock, respectively. These signals are input to the vertical driving circuit 4, the column signal processing circuit 5, the horizontal driving circuit 6, and the like.

The vertical driving circuit 4 includes, for example, shift registers, selects pixel driving wires, supplies pulses for driving the pixels to the selected pixel driving wires, and drives the pixels in a row unit. That is, the vertical driving circuit 4 sequentially selects and scans the pixels 2 of the pixel array 3 in the row unit in a vertical direction and supplies the column signal processing circuits 5, via vertical signal lines 9, with pixel signals based on signal charges generated in accordance with the amount of light received in, for example, the photodiodes serving as the photoelectric conversion units of the respective pixels 2.

The column signal processing circuit 5 is disposed in, for example, each column of the pixels 2 and performs signal processing such as a noise removing process on the signals output from the pixels 2 corresponding to one line in each pixel column, since the pixels are arranged in each column. That is, the column signal processing circuit 5 performs the signal processing such as CDS of removing fixed pattern noises unique in the pixels 2, signal amplification, and AD conversion. Horizontal selection switches (not shown) are installed in output stage of the column signal processing circuits 5 so as to be connected between the output stage and the horizontal signal lines 10.

The horizontal driving circuit 6 includes, for example, a shift register, sequentially selects the column signal processing circuits 5 by sequentially outputting horizontal scanning pulses, and outputs the pixel signals from the column signal processing circuits 5 to the horizontal signal lines 10, respectively.

The output circuit 7 performs signal processing on the signals sequentially supplied from the column signal processing circuits 5 via the horizontal signal lines 10 and outputs the processed signals. For example, the output circuit 7 sometimes buffers the signals or sometimes performs various kinds of digital signal processing such as black level adjustment and column variation correction. An input/output terminal 12 transmits and receives signals to and from the outside.

Figure 2A:
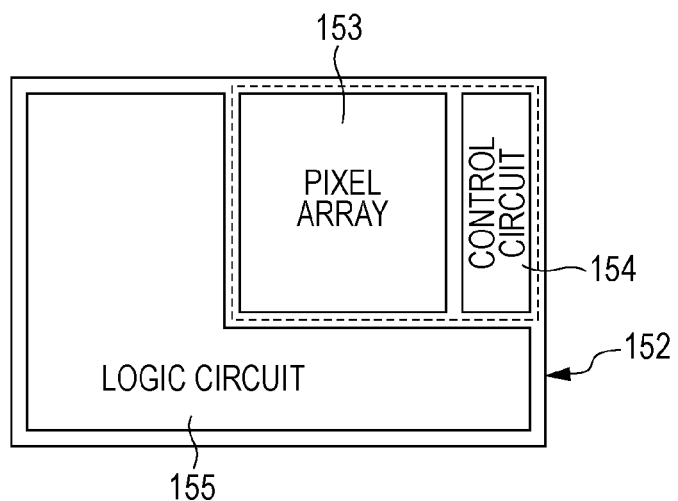
FIGS. 2A to 2C are schematic diagrams of a solid-state imaging device according to the embodiments of the disclosure and a solid-state imaging device according to the related art.
Figure 2B:
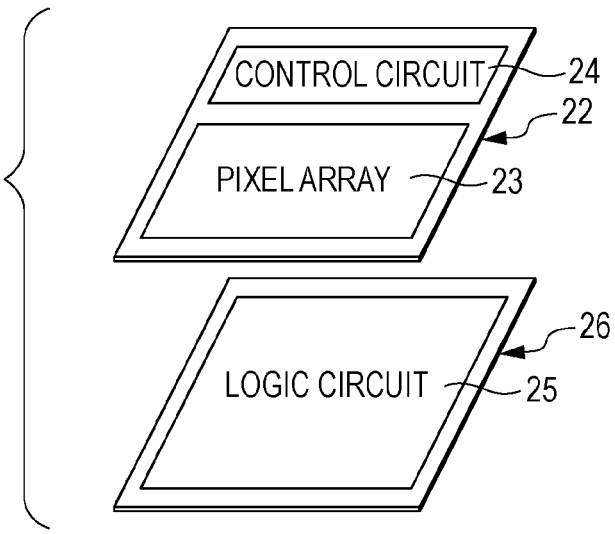
Figure 2C:
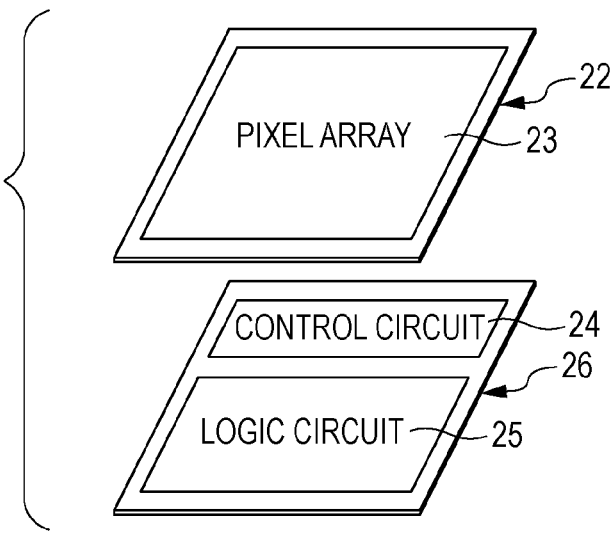

FIGS. 2A to 2C are diagrams of the basic overall configurations of the MOS solid-state imaging device according to the embodiments of the disclosure. In a MOS solid-state imaging device 151 according to the related art, a pixel array 153, a control circuit 154, and a logic circuit 155 performing signal processing are mounted in one semiconductor chip 152, as shown in FIG. 2A. In general, the pixel array 153 and the control circuit 154 form an image sensor 156. On the other hand, in a MOS solid-state imaging device 20 according to an embodiment of the disclosure, a pixel array 23 and a control circuit 24 are mounted in a first semiconductor chip unit 22 and a logic circuit 25 including a signal processing circuit which performs signal processing is mounted in a second semiconductor chip unit 26, as shown in FIG. 2B. The first semiconductor chip unit 22 and the second semiconductor chip unit 26 are electrically connected to each other to form a single semiconductor chip for the MOS solid-state imaging device 20. In a MOS solid-state imaging device 21 according to another embodiment of the disclosure, a pixel array 23 is mounted in a first semiconductor chip unit 22, and a control circuit 24 and a logic circuit 25 including a signal processing circuit are mounted in a second semiconductor chip unit 26, as shown in FIG. 2C. The first semiconductor chip unit 22 and the second semiconductor chip unit 26 are electrically connected to each other to form a single semiconductor chip for the MOS solid-state imaging device 21.

Although not illustrated, two or more semiconductor chip units may be bonded to each other depending on the configuration of the MOS solid-state imaging device. For example, a semiconductor chip unit including a memory element array and a semiconductor chip unit including another circuit element may be added as well as the first and second semiconductor chip units described above, and the three or more semiconductor chip units may be bonded to each other to form a single chip for the MOS solid-state imaging device.

2. First Embodiment

Example of Configuration of Solid-State Imaging Device

Figure 3:
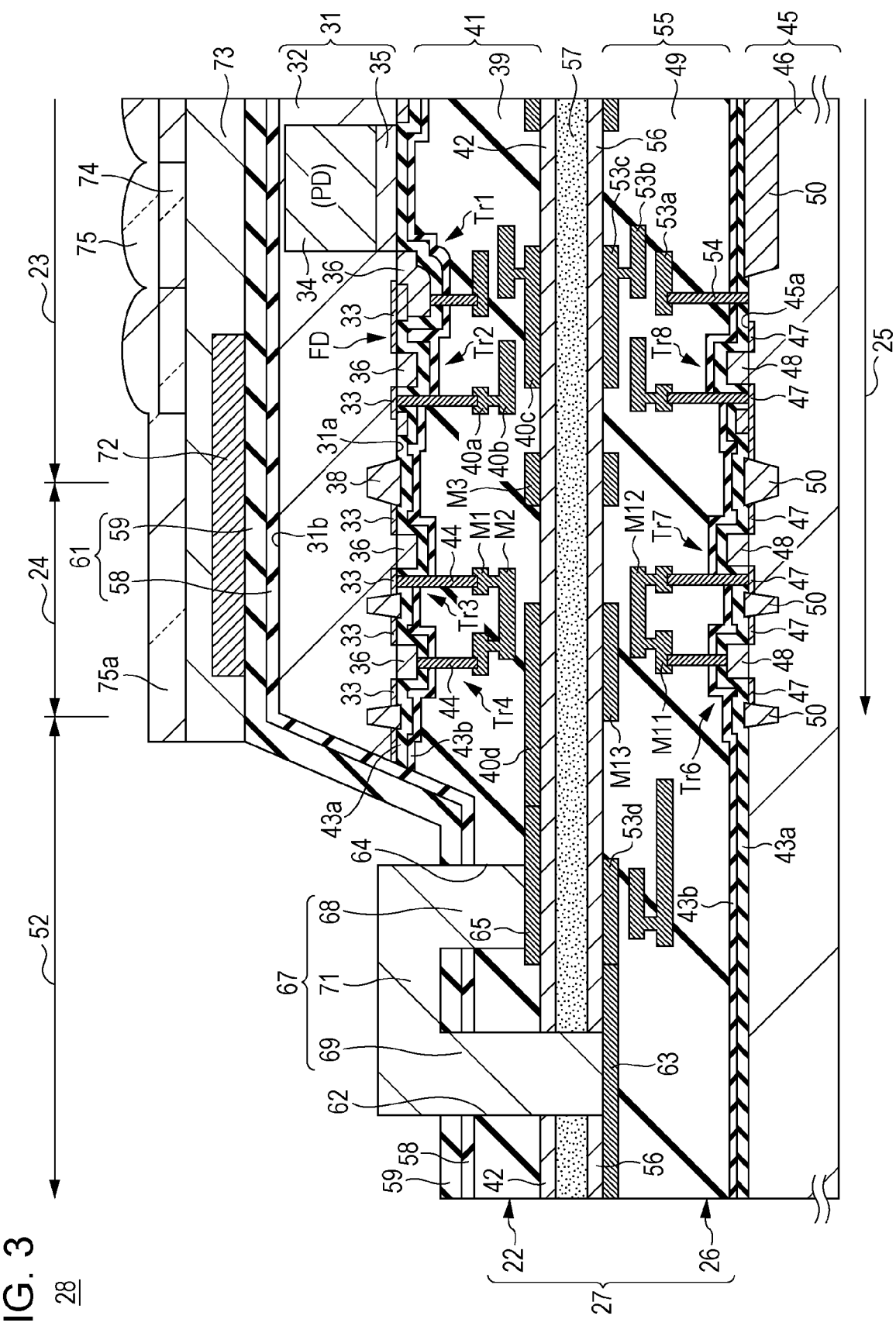
FIG. 3 is a diagram of the overall configuration of the main units of a solid-state imaging device according to a first embodiment of the disclosure.

FIG. 3 is a diagram of a semiconductor device, that is, a MOS solid-state imaging device according to a first embodiment of the disclosure. A solid-state imaging device 28 according to the first embodiment includes a stacked semiconductor chip 27 in which a first semiconductor chip unit 22 including a pixel array 23 and a control circuit 24 and a second semiconductor chip unit 26 including a logic circuit 25 are bonded to each other. The first semiconductor chip unit 22 and the second semiconductor chip unit 26 are bonded to each other so that multi-layer wiring layers 41 and 55 face each other. The semiconductor chip units are bonded to each other by an adhesive layer 57 with protective films 42 and 56 interposed therebetween. The semiconductor chip units may be bonded to each other by plasma jointing.

Figure 15A:
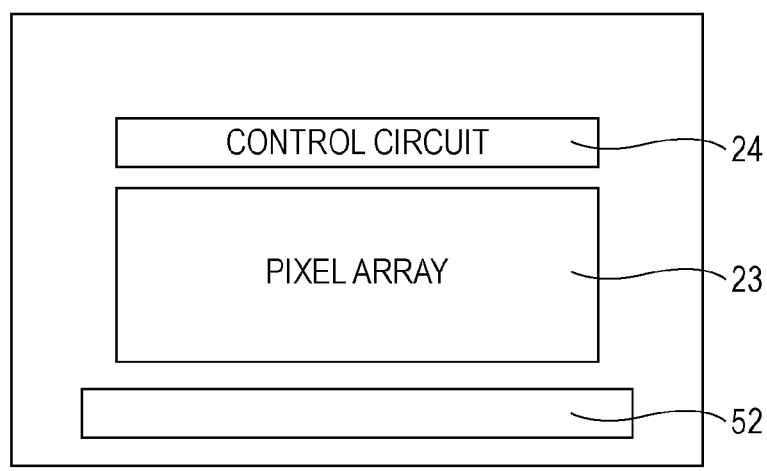
FIGS. 15A and 15B are schematic plan views of the position of a semiconductor removal region according to the embodiment of the disclosure.

In this embodiment, a semiconductor section of a part of the first semiconductor chip unit 22 is completely removed to form a semiconductor-removed region 52. In the semiconductor-removed region 52, a connection wiring 67 is formed to connect the first semiconductor chip unit 22 to the second semiconductor chip unit 26. The semiconductor-removed region 52 is a whole region which includes a part where each connection wiring 67 connected to a routing wiring 40d corresponding to each vertical signal line of the pixel array 23 is formed. The semiconductor-removed region 52 is formed outside the pixel array 23, as shown in FIG. 15A. The semiconductor-removed region 52 corresponds to a so-called electrode pad region. In FIG. 15A, the semiconductor-removed region 52 is formed vertically outside the pixel array 23.

In the first semiconductor chip unit 22, the photodiode (PD) serving as the photoelectric conversion unit, the pixel array 23 including a plurality of pixel transistors Tr1 and Tr2, and the control circuit 24 including MOS transistors Tr3 and Tr4 are formed in a thinned first semiconductor substrate 31. The representative pixel transistors Tr1 and Tr2 and the representative MOS transistors Tr3 and Tr4 are illustrated. On a surface 31a of the semiconductor substrate 31, a multi-layer wiring layer 41 is formed in which wirings 40 [40a, 40b, and 40c] formed of three-layer metal M1 to M3 are disposed with an inter-layer insulation film 39 interposed therebetween in this embodiment. The pixel transistors Tr1 and Tr2 and the MOS transistors Tr3 and Tr4 of the control circuit 24 will be described below in detail when a method of manufacturing the pixel transistors Tr1 and Tr2 and the MOS transistors Tr3 and Tr4 is described.

In the second semiconductor chip unit 26, the logic circuit 25 including MOS transistors Tr6 to Tr8 is formed on a second semiconductor substrate 45. On a surface 45a of the semiconductor substrate 45, a multi-layer wiring layer 55 is formed in which wirings 53 [53a, 53b, and 53c] formed of three-layer metal M11 to M13 are disposed with an inter-layer insulation film 49 interposed therebetween in this embodiment. The MOS transistors Tr6 and Tr8 will be described below in detail when a method of manufacturing MOS transistors Tr6 and Tr8 is described.

In the semiconductor-removed region 52 of the first semiconductor chip unit 22, the entire first semiconductor substrate 31 is removed by, for example, etching. A stacked insulation film 61 formed by, for example, a silicon oxide ($SiO_2$) film 58 and a silicon nitride (SiN) film 59 is formed by extending from the bottom surface and the side surface of the semiconductor-removed region 52 to the surface of the semiconductor substrate. The stacked insulation film 61 serves as both a protective insulation film which protects the semiconductor substrate 31 exposed toward the side surface of a concave portion of the semiconductor-removed region 52 and an anti-reflection film for the pixels.

In the semiconductor-removed region 52, a connection hole 64 is formed so as to extend from the silicon nitride film 59 to a first connection pad 65 electrically connected to a wiring of the multi-layer wiring layer 41 in the first semiconductor chip unit 22, in this example, the routing wiring 40d formed of the third layer metal M3. Further, a through connection hole 62 is formed so as to be perforated through the multi-layer wiring layer 41 of the first semiconductor chip unit 22 and to extend to a second connection pad 63 electrically connected to a wiring of the multi-layer wiring layer 55 in the second semiconductor chip unit 26, in this example, a routing wiring 53d formed of the third layer metal M13.

The connection wiring 67 includes a connection conductor 68 buried in the connection holes 64 and 62 and electrically connected to the first connection pad 65, a through connection conductor 69 electrically connected to the second connection pad 63, and a connection conductor 71 electrically connecting the upper ends of the connection conductor 68 and the through connection conductor 69.

A light-shielding film 72 covering a region where it is necessary to shield light is formed on a rear surface 31b serving as a light-incident surface of the photodiode 34 of the first semiconductor chip unit 22. Further, a fattened film 73 is formed so as to cover the light-shielding film 72, on-chip color filters 74 are formed on the flattened film 73 so as to correspond to the respective pixels, and on-chip micro-lenses 75 are formed on the on-chip color filter 74, so that the backside illuminated solid-state imaging device 28 is formed. The connection conductor 71 exposed to the outside of the connection wiring 67 serves as an electrode pad connected to an external wiring with a bonding wire interposed therebetween.

Example of Method of Manufacturing Solid-State Imaging Device

FIGS. 4 to 14 are diagrams of a method of manufacturing the solid-state imaging device 28 according to the first embodiment.

Figure 4:
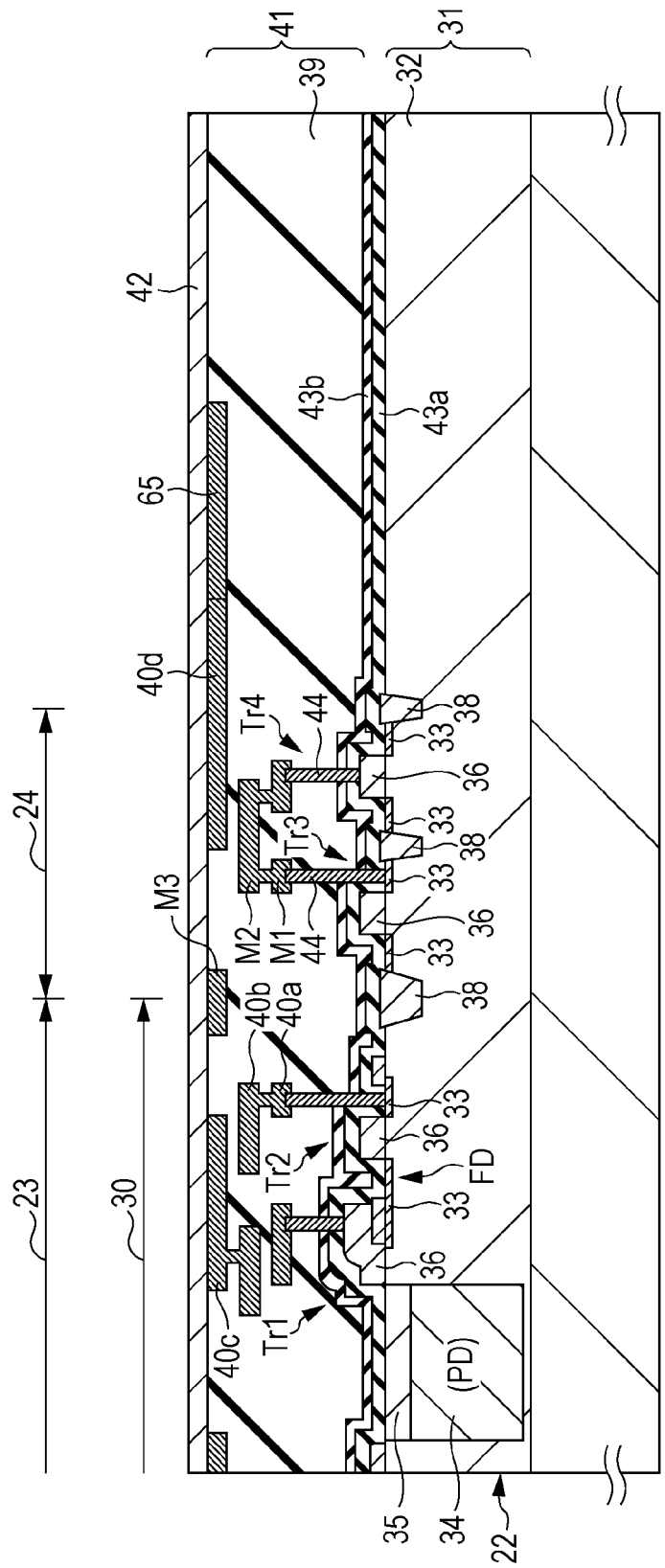
FIG. 4 is a diagram of an example of a process (part 1) of manufacturing the solid-state imaging device according to the first embodiment.

As shown in FIG. 4, a half-finished image sensor, that is, the pixel array 23 and the control circuit 24 are formed in the regions of the respective chip units of the first semiconductor wafer (hereinafter, also referred to as a semiconductor substrate) 31. That is, a photodiode (PD) serving as the photoelectric conversion unit of each pixel is formed in the region where each chip unit of the semiconductor substrate (for example, a silicon substrate) 31 is formed. Source/drain regions 33 of each pixel transistor is formed in a semiconductor well region 32. The semiconductor well region 32 is formed by introducing first conductive type impurities, for example, p-type impurities and the source/drain regions 33 is formed by introducing second conductive type impurities, for example, n-type impurities. The photodiode (PD) and the source/drain regions 33 of each pixel transistor are formed by implanting ions from the surface of the substrate.

The photodiode (PD) is formed so as to include an n-type semiconductor region 34 and a p-type semiconductor region 35 on the side of the surface of the substrate. By forming the gate electrodes 36, which form a pixel, on the surface of the substrate with a gate insulation film interposed therebetween, the pixel transistors Tr1 and Tr2 are formed by the gate electrodes 36 and a pair of source/drain regions 33. In FIG. 4, two pixel transistors Tr1 and Tr2 are illustrated as the representative pixel transistors of the plurality of pixel transistors. The pixel transistor Tr1 adjacent to the photodiode (PD) corresponds to a transmission transistor and the source/drain regions thereof correspond to a floating diffusion (FD). The respective unit pixels 30 are isolated from each other by an element isolation region 38. For example, the element isolation region 38 is formed with an STI (Shallow Trench Isolation) structure formed by burying an insulation film such as a SiO2 film in a groove formed in the substrate.

On the other hand, on the side of the control circuit 24, the MOS transistors forming the control circuit are formed on the semiconductor substrate 31. In FIG. 4, the MOS transistors Tr3 and Tr4 are illustrated as the representative MOS transistors forming the control circuit 23. The MOS transistors Tr3 and Tr4 are formed by the n-type source/drain regions 33 and the gate electrodes 36 formed with the gate insulation film interposed therebetween.

Next, the inter-layer insulation film 39 of the first layer is formed on the surface of the semiconductor substrate 31, and then connection holes are formed in the inter-layer insulation film 39 to form connection conductors 44 connected to respective transistors. When the connection conductors 44 with different heights are formed, a first insulation thin film 43a such as a silicon oxide film and a second insulation thin film 43b, such as a silicon nitride film, serving as an etching stopper are laminated on the entire surface including the upper surfaces of the transistors. The inter-layer insulation film 39 of the first layer is formed on the second insulation thin film 43b. Connection holes with different depths are selectively formed in the first inter-layer insulation film 39 up to the second insulation film 43b serving as the etching stopper. Subsequently, connection holes are formed so as to be continuous to connection holes by electively etching the first insulation thin film 43a and the second insulation thin film 43b with the same film thickness in the respective units. Then, the connection conductors 44 are buried in the respective connection holes.

Next, the multi-layer wiring layer 41 is formed by forming the wirings 40 [40a, 40b, and 40c] formed by, in this embodiment, the three-layer metals M1 to M3 with the inter-layer insulation film 39 interposed therebetween so as to be connected to the respective connection conductors 44. The wirings 40 are formed of copper (Cu). In general, the respective copper wirings are covered with a barrier metal film which prevents Cu diffusion. Accordingly, a cap film of the copper wirings 40, a so-called protective film 42 is formed on the multi-layer wiring layer 41. The first semiconductor substrate 31 including the pixel array 23 and the control circuit 24 as the half-finished products is formed through the previously performed processes.

Figure 5:
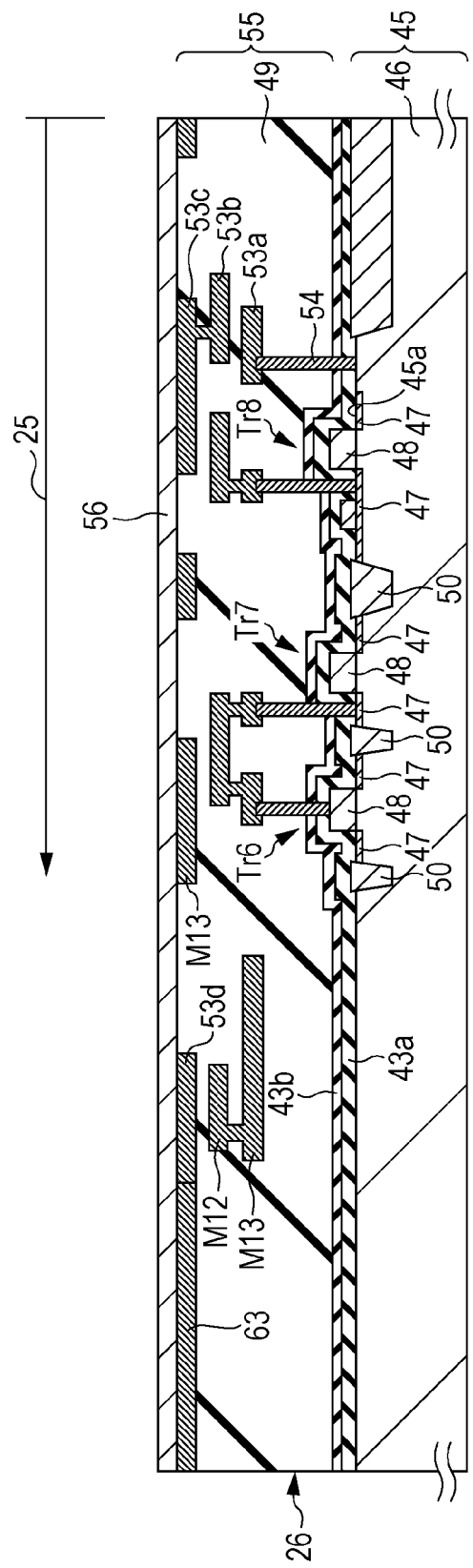
FIG. 5 is a diagram of an example of a process (part 2) of manufacturing the solid-state imaging device according to the first embodiment.

On the other hand, as shown in FIG. 5, the half-finished logic circuit 25 including the signal processing circuit, which performs signal processing, is formed in the region where each chip unit of the second semiconductor substrate (semiconductor wafer) 45 is formed. That is, in the p-type semiconductor well region 46 on the surface of the semiconductor substrate (for example, a silicon substrate) 45, the plurality of MOS transistors forming a logic circuit is formed so as to be isolated by element isolation regions 50. Here, MOS transistors Tr6, Tr7, and Tr8 are the representative MOS transistors of the plurality of MOS transistors. The MOS transistors Tr6, Tr7, and Tr8 each include a pair of n-type source/rain regions 47 and a gate electrode 48 formed with a gate insulation film interposed therebetween.

The logic circuit 25 can be configured with CMOS transistors. The element isolation region 50 is formed with an STI structure formed by burying an insulation film such as a SiO2 film in a groove formed in the substrate.

Next, the inter-layer insulation film 49 of the first layer is formed on the surface of the semiconductor substrate 45, and then connection holes are formed in the inter-layer insulation film 49 to form connection conductors 54 connected to respective transistors. When the connection conductors 54 with different heights are formed, a first insulation thin film 43a such as a silicon oxide film and a second insulation thin film 43b, such as a silicon nitride film, serving as an etching stopper are laminated on the entire surface including the upper surfaces of the transistors, as described above. The inter-layer insulation film 49 of the first layer is formed on the second insulation thin film 43b. Connection holes with different depths are selectively formed in the first inter-layer insulation film 39 up to the second insulation film 43b serving as the etching stopper. Subsequently, connection holes are formed so as to be continuous to connection holes by electively etching the first insulation thin film 43a and the second insulation thin film 43b with the same film thickness in the respective units. Then, the connection conductors 44 are buried in the respective connection holes.

Next, the multi-layer wiring layer 55 is formed by forming the wirings 53 [53a, 53b, and 53c] formed by, in this embodiment, the three-layer metals M11 to M13 with the inter-layer insulation film 49 interposed therebetween so as to be connected to the respective connection conductors 54. The wirings 53 are formed of copper (Cu). As described above, a cap film of the copper wirings 53, a so-called protective film 56 is formed on the multi-layer wiring layer 49. The second semiconductor substrate 45 including the logic circuit 25 as the half-finished product is formed through the previously performed processes.

Figure 6:
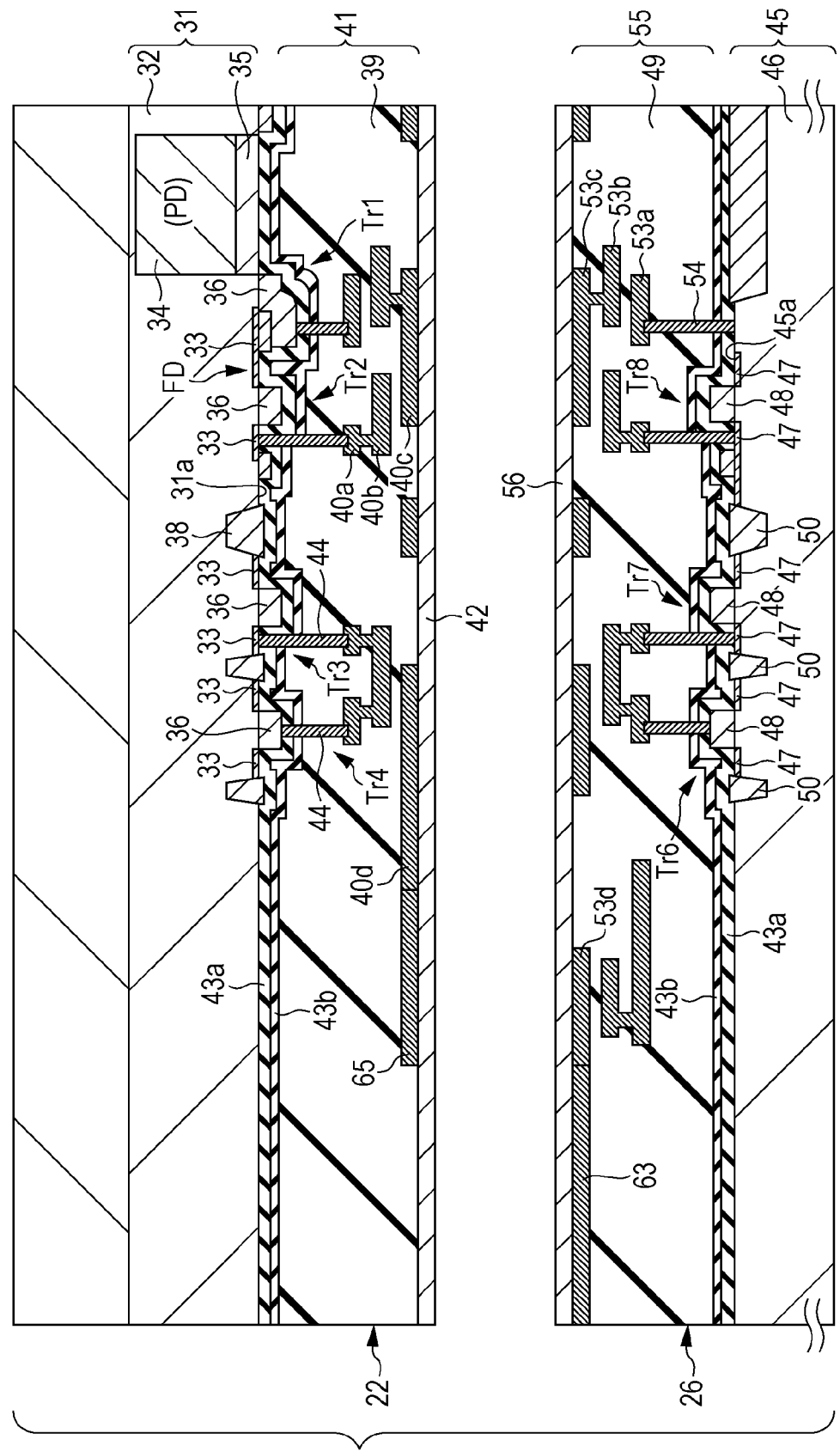
FIG. 6 is a diagram of an example of a process (part 3) of manufacturing the solid-state imaging device according to the first embodiment.
Figure 7:
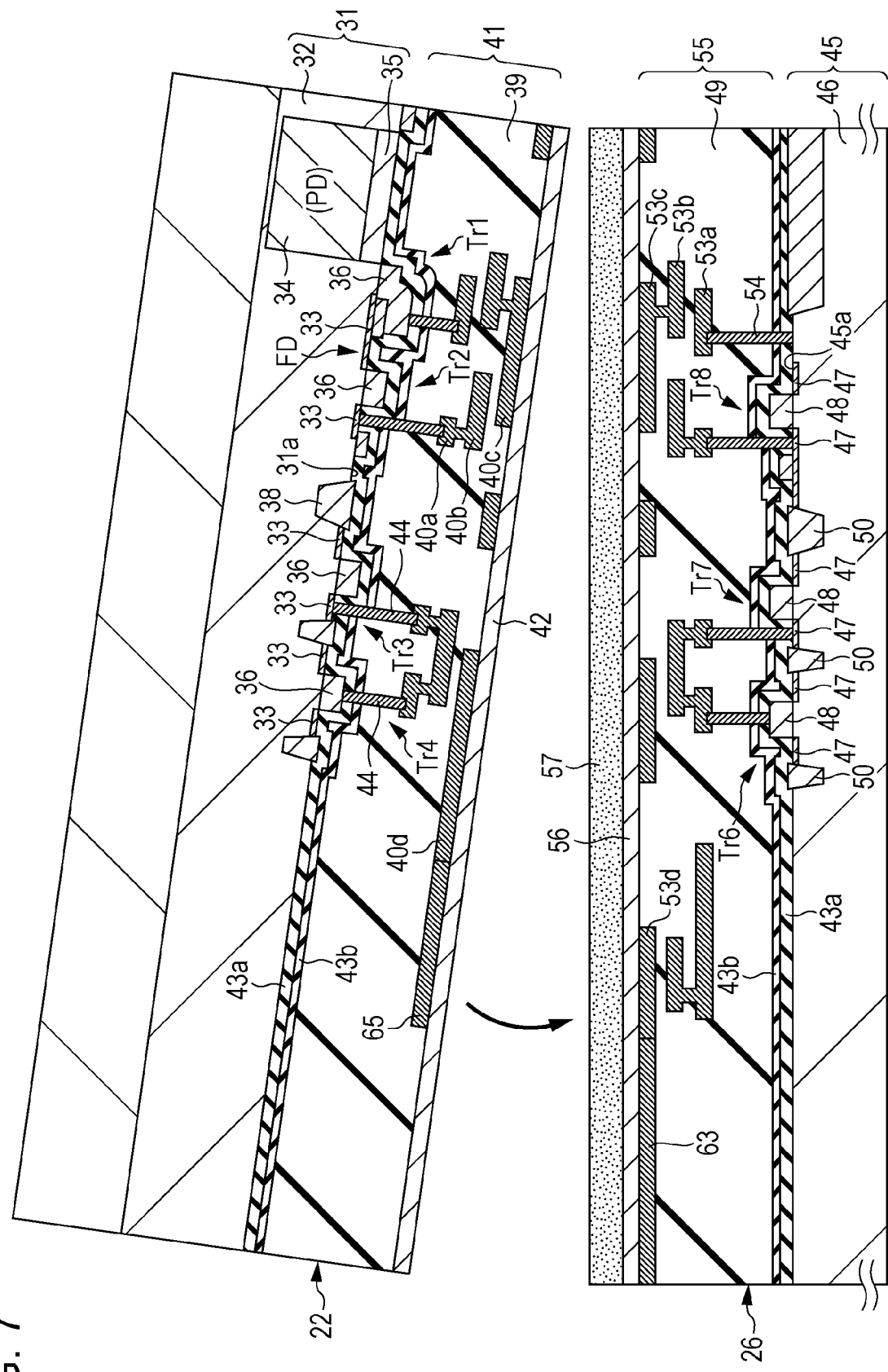
FIG. 7 is a diagram of an example of a process (part 4) of manufacturing the solid-state imaging device according to the first embodiment.

Next, as shown in FIG. 6, the first semiconductor substrate 31 and the second semiconductor substrate 45 are boned to each other so that the multi-layer wiring layers 41 and 45 face each other. The semiconductor substrates are bonded to each other by, for example, by plasma jointing or an adhesive. In this example, the semiconductor substrates are bonded to each other by an adhesive. When an adhesive is used, as shown in FIG. 7, an adhesive layer 58 is formed on one of adhesion surfaces of the first semiconductor substrate 31 and the second semiconductor substrate 45, and then both the semiconductor substrates are superimposed and adhered to each other with the adhesive layer 58 interposed therebetween. That is, the first semiconductor substrate 31 and the second semiconductor substrate 45 are bonded to each other.

When both the semiconductor substrates are bonded to each other by plasma jointing, although not illustrated, a plasma TEOS film, a plasma SiN film, a SiON film (block film), a Sic film, or the like is formed on each of the bonding surfaces of the first semiconductor wafer 31 and the second semiconductor wafer 45. The bonding surfaces on which this film is formed are subjected to plasma processing, are superimposed, and then are subjected to annealing processing, so that both the semiconductor substrates are bonded to each other. The bonding is preferably performed through a low-temperature process at a temperature equal to or less than 400° C., which does not have an influence on the wirings or the like.

Figure 8:
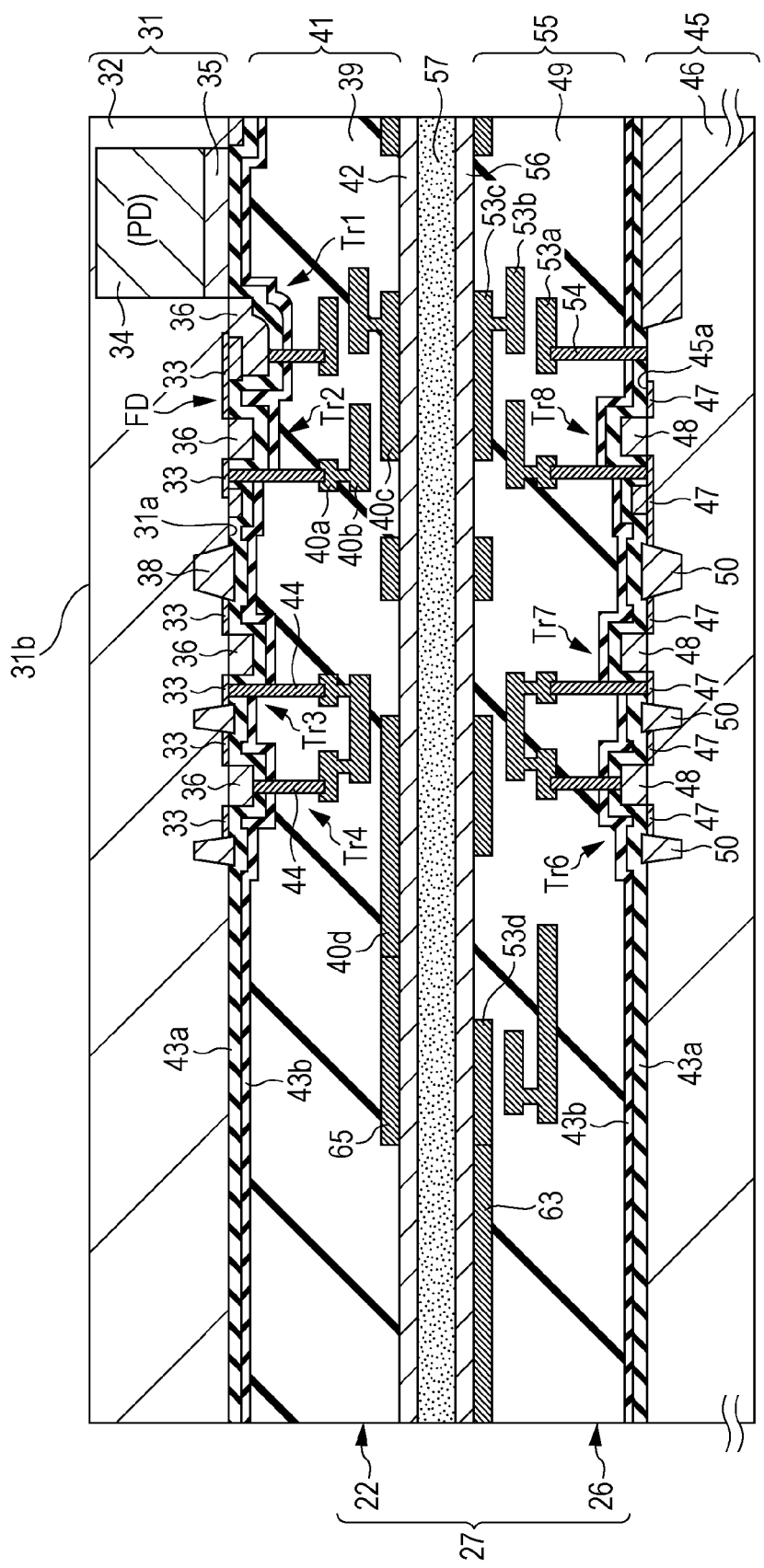
FIG. 8 is a diagram of an example of a process (part 5) of manufacturing the solid-state imaging device according to the first embodiment.

Next, as shown in FIG. 8, the first semiconductor substrate 31 is thinned by grinding or polishing from the rear surface 31b of the first semiconductor substrate 31. The thinning is performed so as to face photodiode (PD). After the thinning, a p-type semiconductor layer preventing dark current is formed on the rear surface of the photodiode (PD). The thickness of the semiconductor substrate 31 is, for example, about 600 µm, but is thinned up to, for example, about 3 µm to about 5 µm. According to the related art, the thinning is performed by bonding a separately prepared supporting substrate. In this embodiment, however, the first semiconductor substrate 31 is thinned by using the second semiconductor substrate 45 including the logic circuit 25 as a supporting substrate. The rear surface 31b of the first semiconductor substrate 31 serves as a light-incident surface when the solid-state imaging device is configured as the backside illuminated solid-state imaging device.

Figure 9:
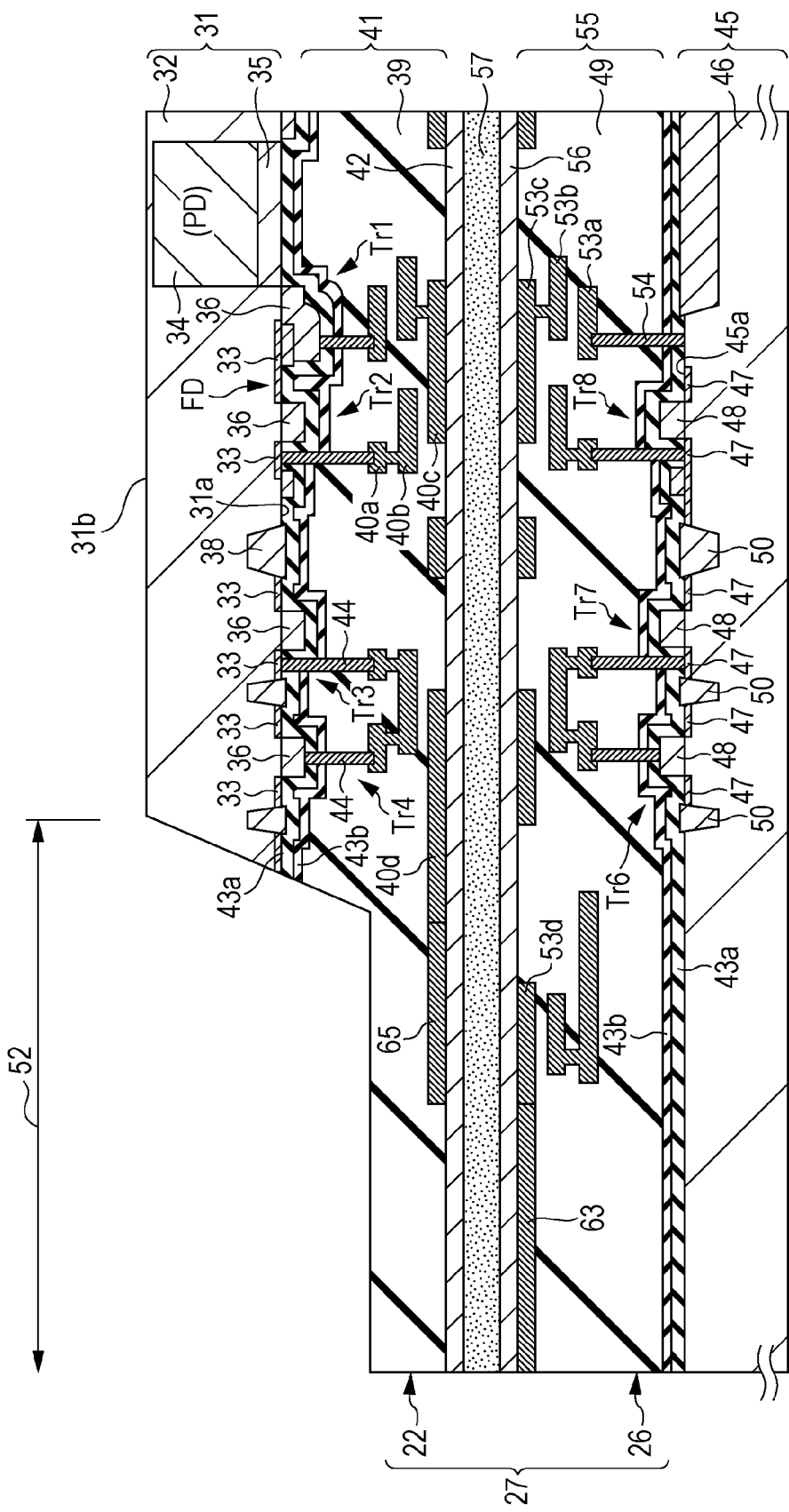
FIG. 9 is a diagram of an example of a process (part 6) of manufacturing the solid-state imaging device according to the first embodiment.

Next, as shown in FIG. 9, in the first semiconductor substrate 31 and the second semiconductor substrate 45 bonded to each other, the semiconductor-removed region 52 is formed by completely removing a semiconductor section of a part of the region serving as the finished first semiconductor chip unit, that is, the partial semiconductor substrate 31. The semiconductor-removed region 52 is a whole region including a portion in which each connection writing connected to the routing wiring 40d corresponding to each vertical signal line of the pixel array and is formed outside the pixel array 23, as shown in FIG. 15A. In FIG. 15A, the semiconductor-removed region 52 is formed vertically outside the pixel array 23.

Figure 10:
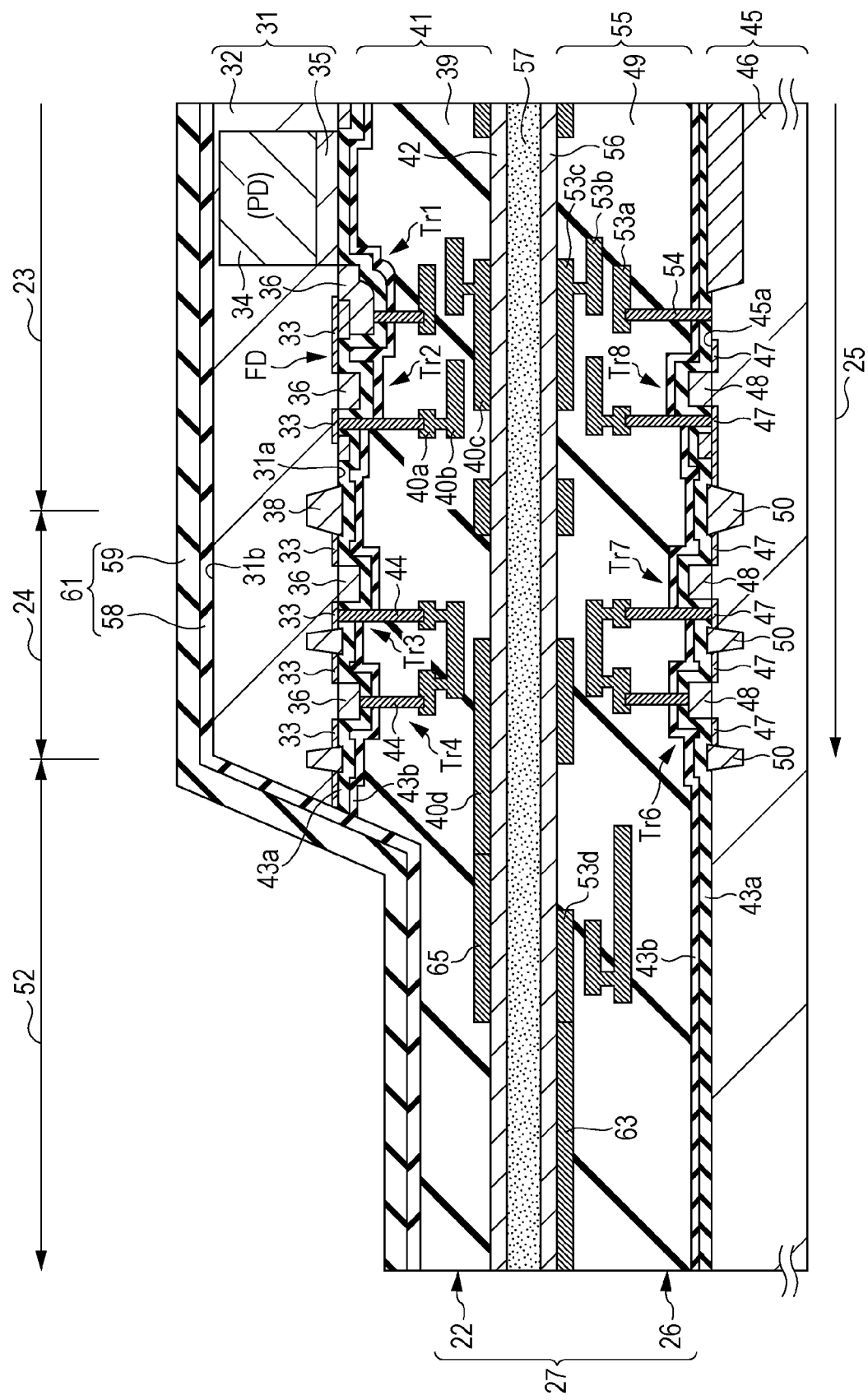
FIG. 10 is a diagram of an example of a process (part 7) of manufacturing the solid-state imaging device according to the first embodiment.

Next, as shown in FIG. 10, a stacked insulation film 61 of a silicon oxide ($SiO_2$) film 58 and a silicon nitride (SiN) film 59 is deposited across the rear surface (light-incident surface) of the control circuit 24 and the pixel array 23 from the inner surface of the semiconductor-removed region 52. The stacked insulation film 61 serves as not only a protective film of the semiconductor side surface of the semiconductor-removed region 52 and but also an anti-reflection film in the pixel array 23.

Figure 11:
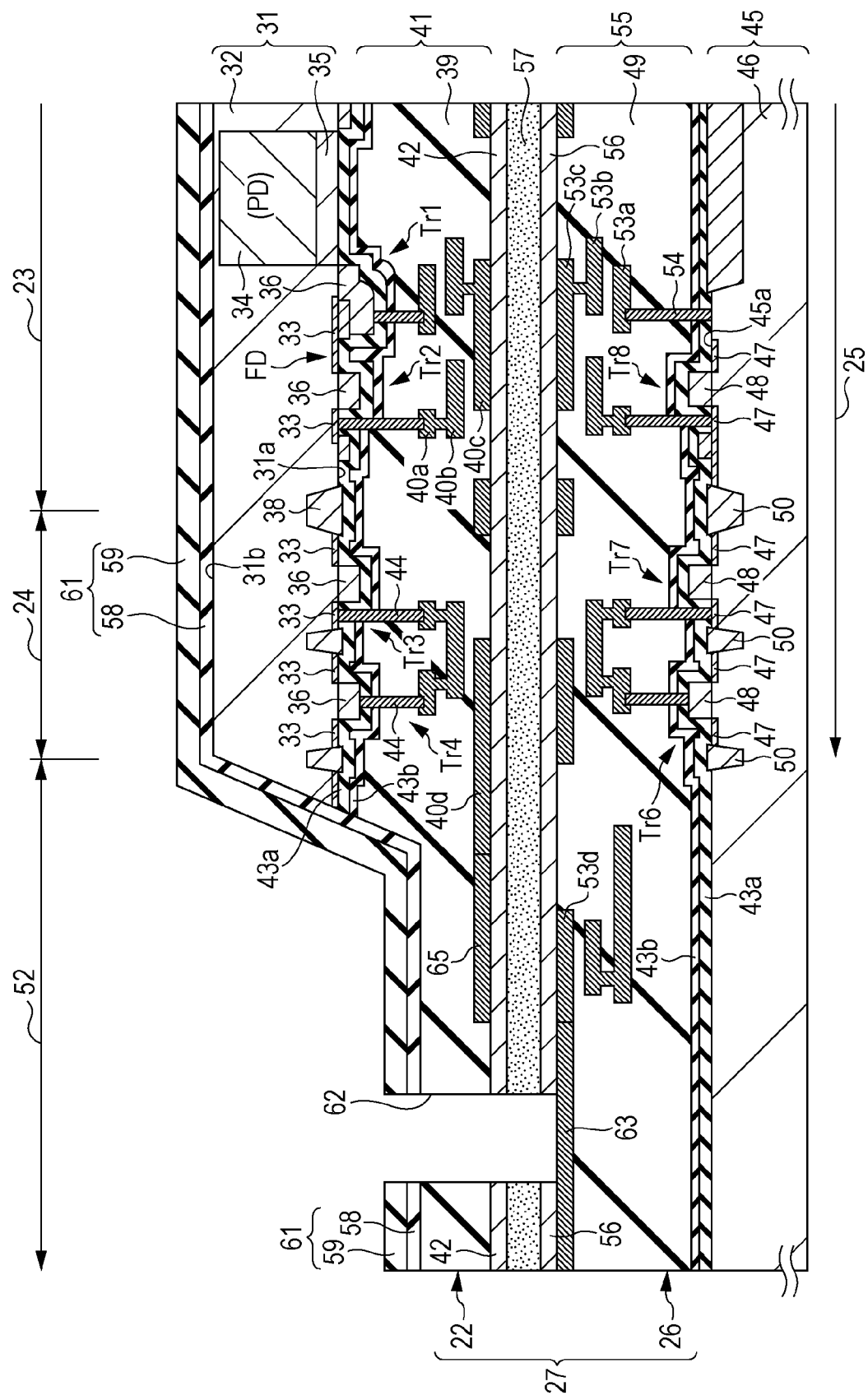
FIG. 11 is a diagram of an example of a process (part 8) of manufacturing the solid-state imaging device according to the first embodiment.

Next, as shown in FIG. 11, in the semiconductor-removed region 52, through connection holes 62, which reach the second connection pad 63 connected to a writing 53 of the multi-layer wiring layer 55 of the second semiconductor substrate 45, are perforated through the multi-layer wiring layer 41 of the first semiconductor substrate 31 from the stacked insulation film 61. The through connection holes 62 of this example reach the second connection pad 63 electrically connected to the uppermost layer of the multi-layer wiring layer, that is, the wiring 53d formed of the third layer metal M13. The plurality of through connection holes 62 is formed by the number corresponding to the number of vertical signals of the pixel array 23. The writing 53d formed of the third layer metal M13 connected to the second connection pad 63 serves as a routing writing corresponding to the vertical signal line. In this example, the second connection pad 63 is formed of the third layer metal M13 and is continuously formed in the routing wirings 53d corresponding to the vertical signal lines.

Figure 12:
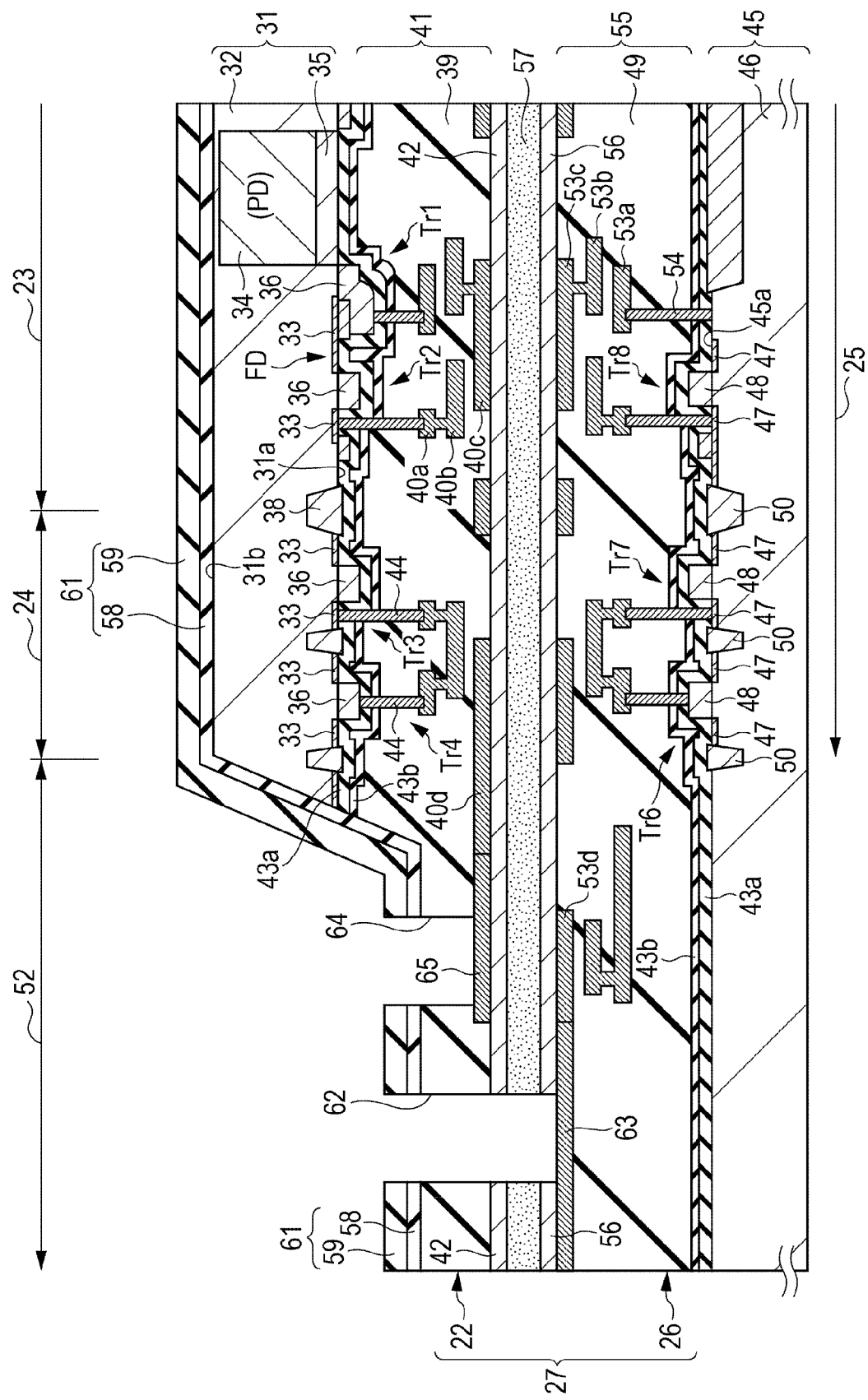
FIG. 12 is a diagram of an example of a process (part 9) of manufacturing the solid-state imaging device according to the first embodiment.

Next, as shown in FIG. 12, the connection holes 64, which reach the first connection pad 65 connected to the writing 40 of the multi-layer wiring layer 41 of the first semiconductor substrate 31 from the stacked insulation film 61, are formed in the semiconductor-removed region 52. In this example, the connection holes 64 are formed so as to reach the first connection pad 65 electrically connected to the wiring 40d formed of the third layer metal M3 of the multi-layer wiring layer 41. The plurality of connection holes 64 is formed by the number corresponding to the number of vertical signal lines of the pixel array 23. The wiring 40d formed of the third layer metal M3 connected to the first connection pad 65 serves as a routing wiring corresponding to the vertical signal line. In this example, the first connection pad 65 is continuously formed in the routing wirings 40*d* formed of the third layer metal M3 and corresponding to the vertical signals.

Figure 13:
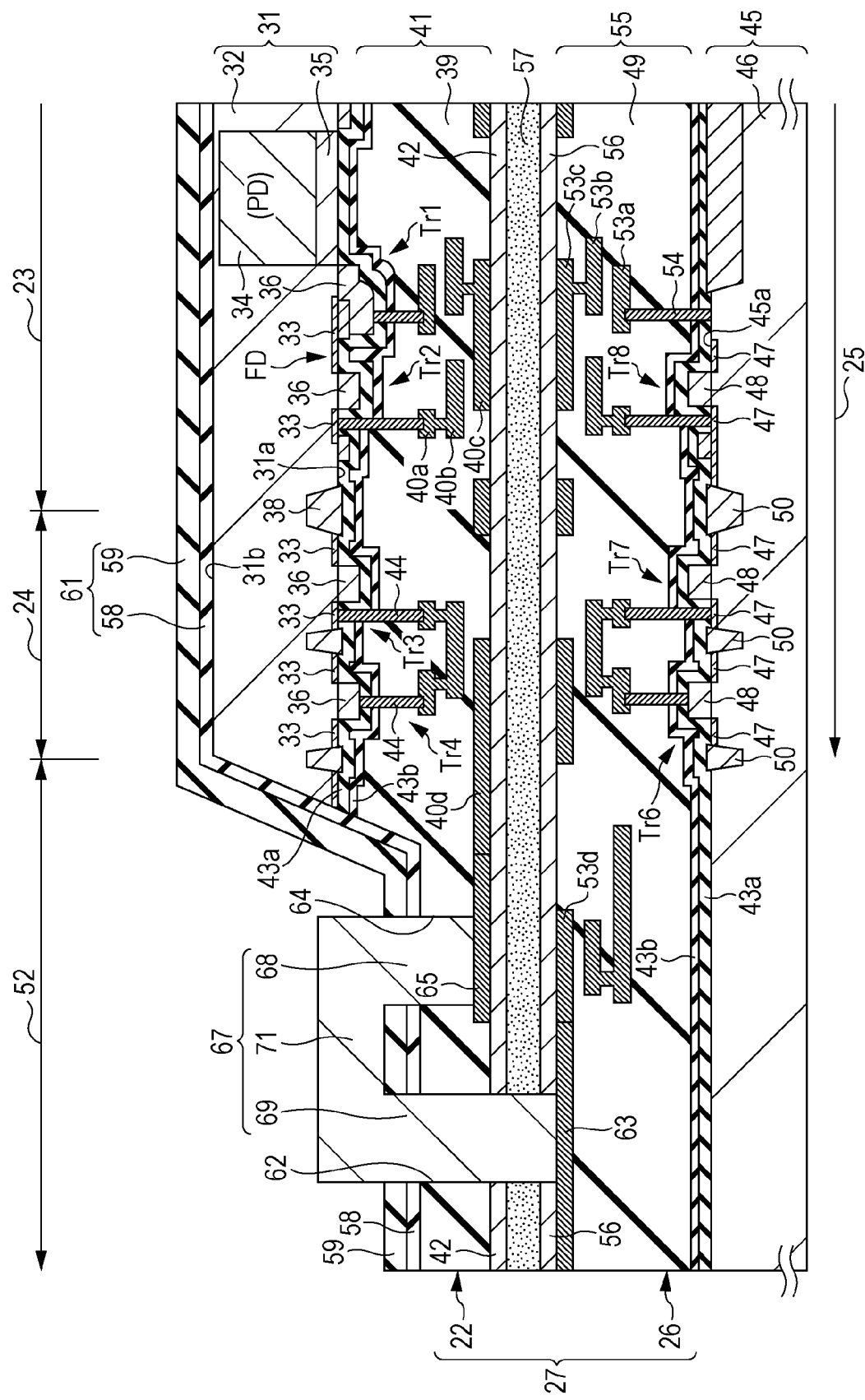
FIG. 13 is a diagram of an example of a process (part 10) of manufacturing the solid-state imaging device according to the first embodiment.

Next, as shown in FIG. 13, the connection writing 67 is formed to electrically connect the second connection pad 63 to the first connection pad 65. That is, a conductive film is formed on the entire rear surface of the first semiconductor substrate 31 so as to be buried in both the connection holes 62 and 64, and then the connection wiring 67 is formed by etch-back or patterning. The connection wiring 67 includes the connection conductor 68, which is buried in the connection hole 64 and is connected to the first connection pad 65, and the through connection conductor 69, which is buried in the through connection hole 62 and is connected to the second connection pad. The connection wiring 67 further includes the connection conductor 71 which electrically connects the connection conductor 68 to the through connection conductor 69 on the bottom surface exposed to the semiconductor-removed region. The connection conductor 68, the through connection conductor 69, and the connection conductor 71 are integrally formed of the same metal. The connection wiring 67 can be formed of metal, such as tungsten (W), aluminum (Al), or gold (Au) via barrier metal (TiN or the like), which can be patterned.

Figure 14:
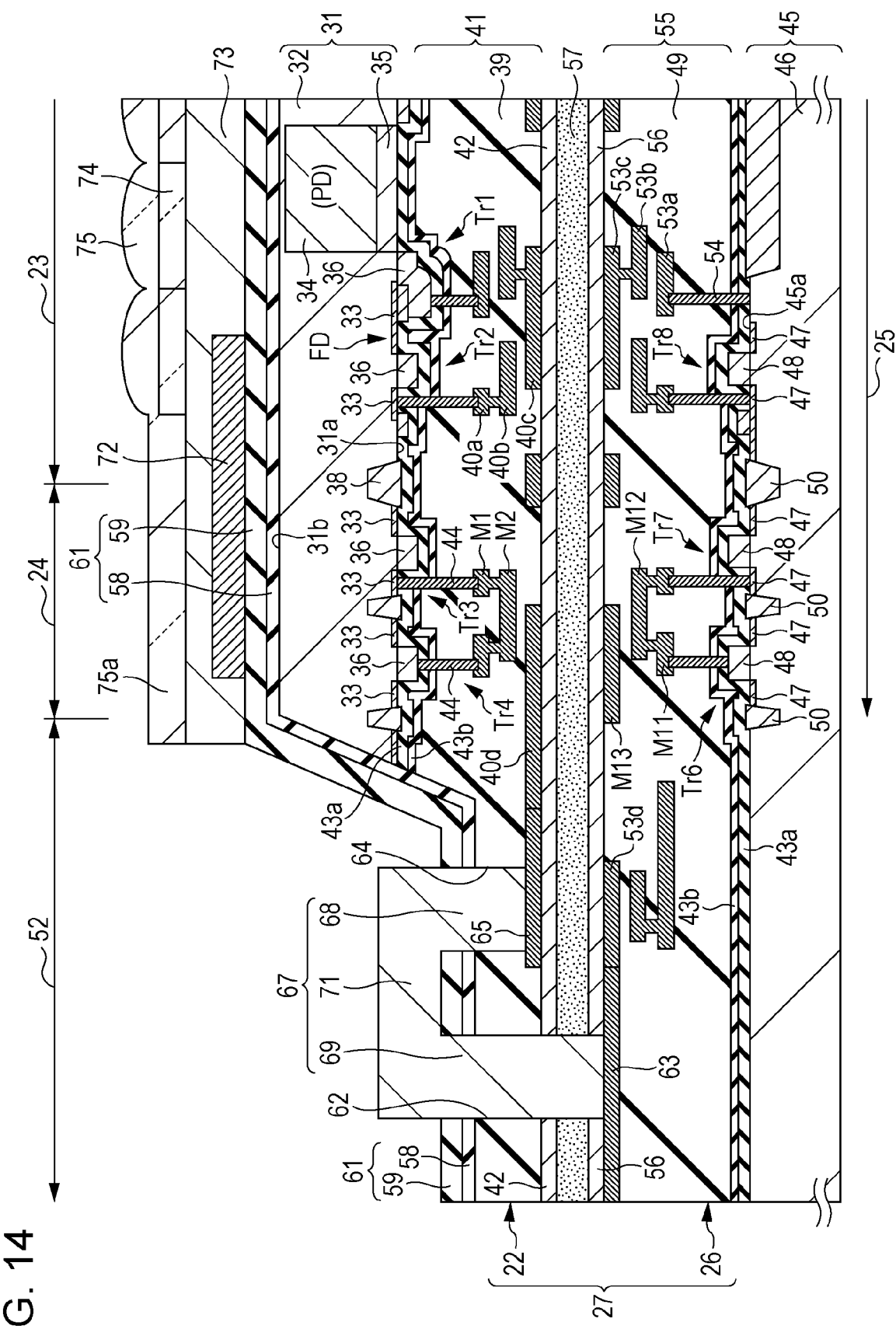
FIG. 14 is a diagram of an example of a process (part 11) of manufacturing the solid-state imaging device according to the first embodiment.

Next, as shown in FIG. 14, the light-shielding film 72 is formed on a region where it is necessary to shield light. The light-shielding film 72 is formed on the control circuit 24, as schematically illustrated in the drawing, but may be also formed on the pixel transistors. The light-shielding film 72 can be formed of metal such as tungsten (W). The flattened film 73 is formed across the pixel array 23 so as to cover the light-shielding film 72. The on-chip color filters 74 of, for example, red (R), green (G), and blue (B) are formed on the flattened film 73 so as to correspond to the respective pixels, and the on-chip micro-lenses 75 are formed on the on-chip color filters 74. In the first semiconductor substrate 31, the pixel array 23 and the control circuit 25 are formed as the finished products. The connection conductor 71 of the connection writing 67 serves as an electrode pad exposed to the outside. In the second semiconductor substrate 45, the logic circuit 25 is formed as the finished product.

Next, the semiconductor substrates are divided into chips, and thus the backside illuminated solid-state imaging apparatus 28 of a target is obtained, as shown in FIG. 3. The electrode pad formed by the connection conductor 71 of the connection wiring 67 of the backside illuminated solid-state imaging apparatus 28 is connected to an external writing by wire bonding.

According to the solid-state imaging device and the manufacturing method thereof according to the first embodiment, the pixel array 23 and the control circuit 24 are formed in the first semiconductor chip unit 22 and the logic circuit 25 performing signal processing is formed in the second semiconductor chip unit 26. In this way, since the pixel array function and the logic function are realized in the different chip units, optimum processing techniques can be used for the pixel array 23 and the logic circuit 25. Accordingly, since the respective functions of the pixel array 23 and the logic circuit 25 can be sufficiently achieved, the solid-state imaging device with high performance can be provided.

In this embodiment, particularly, a part of the first semiconductor chip unit 22, that is, the semiconductor section of the region where the connection conductor and the through connection conductor are formed is completely removed. Since the connection conductor 68 and the through connection conductor 69 are formed in the semiconductor-removed region 52 where the semiconductor section is removed, the parasitic capacitance is reduced between the semiconductor substrate 31 and the connection conductor 68 and the through connection conductor 69, thereby providing the solid-state imaging device with more performance.

When the configuration shown in FIG. 2C is utilized, only the pixel array 23 receiving light may be formed in the first semiconductor chip unit 22, and the control circuit 24 and the logic circuit 25 may be formed isolated and formed in the second semiconductor chip unit 26. Thus, the optimum processing techniques can be independently selected in the manufacturing of the semiconductor chip units 22 and 26 and the area of a product module can be reduced.

In the first embodiment, the half-finished first semiconductor substrate 31 including the pixel array 23 and the control circuit 24 and the half-finished second semiconductor substrate 45 including the logic circuit 25 are bonded to each other, and then the first semiconductor substrate 31 is thinned. That is, the second semiconductor substrate 45 is used as the supporting substrate of the first semiconductor substrate 31 when the first semiconductor substrate 31 is thinned. Thus, the members can be saved and the manufacturing steps can be reduced.

In this embodiment, since the first semiconductor substrate 31 is thinned and the through connection holes 62 and the connection holes 64 are formed in the semiconductor-removed region 52 where the semiconductor section is removed, the aspect ratio of the holes is reduced and the connection holes 62 and 64 can be formed with high precision. Accordingly, the solid-state imaging apparatus with high performance can be manufactured with high precision.

3. Second Embodiment

Example of Configuration of Solid-State Imaging Device

Figure 16:
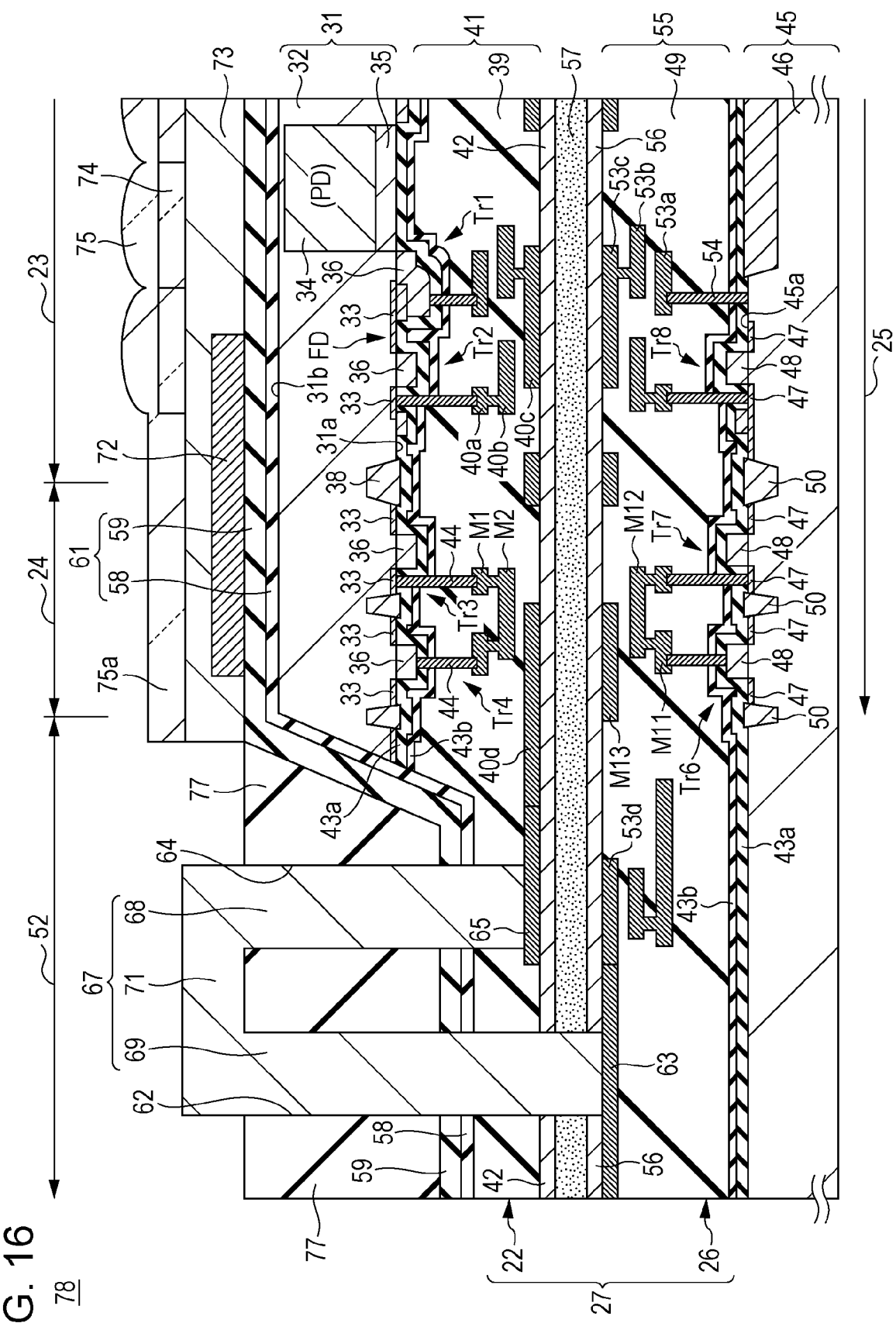
FIG. 16 is a diagram of the overall configuration of the main units of a solid-state imaging device according to a second embodiment of the disclosure.

FIG. 16 is a diagram of a semiconductor device, that is, a MOS solid-state imaging apparatus according to a second embodiment of the disclosure. A solid-state imaging apparatus 78 according to the second embodiment has configuration in which the stacked semiconductor chip 27 is formed such that the first semiconductor chip unit 22 including the pixel array 23 and the control circuit 24 and the second semiconductor chip unit 26 including the logic circuit 25 are bonded to each other. The first semiconductor chip unit 22 and the second semiconductor chip unit 26 are bonded to each other so that the multi-layer wiring layers 41 and 55 face each other.

In this embodiment, the semiconductor-removed region 52 where the semiconductor section of a part of the first semiconductor chip unit 22 is completely removed is formed and the stacked insulation film 61 extending from the inner surface of the semiconductor-removed region 52 to the rear surface 31*b* of the semiconductor substrate 31 is formed. A flattened insulation film 77 flush with the surface of the stacked insulation film 61 on the semiconductor substrate 31 is formed in semiconductor-removed region 52. The etching rate of the flattened insulation film 77 is different from that of the silicon nitride film 59 on the surface of the stacked insulation film 61. For example, the flattened insulation film 77 is formed as an insulation film such as a silicon oxide film.

The connection holes 64 and the through connection holes 62 reaching the first connection pad 65 and the second connection pad 63 are formed through the flattened insulation film 77. The connection wiring 67 connecting the first connection pad 65 and the second connection pad 63 is formed through both the connection holes 64 and 62. The connection wiring 67 includes the connection conductor 68 buried in the connection holes 64 and 62 and electrically connected to the first connection pad 65, the through connection conductor 69 electrically connected to the second connection pad 63, and the connection conductor 71 electrically connecting the upper ends of the connection conductor 68 and the through connection conductor 69. The connection conductor 68, the through connection conductor 69, and the connection conductor 71 are integrally formed of metal. The connection conductor 71 is formed on the flattened insulation film 77.

The other configuration is the same as the configuration described in the first embodiment. The same reference numerals are given to constituent elements corresponding to those of FIG. 3 and the description thereof will not be repeated.

Example of Method of Manufacturing Solid-State Imaging Device

FIGS. 17 to 24 are diagrams of a method of manufacturing the solid-state imaging device 78 according to the second embodiment.

Figure 17:
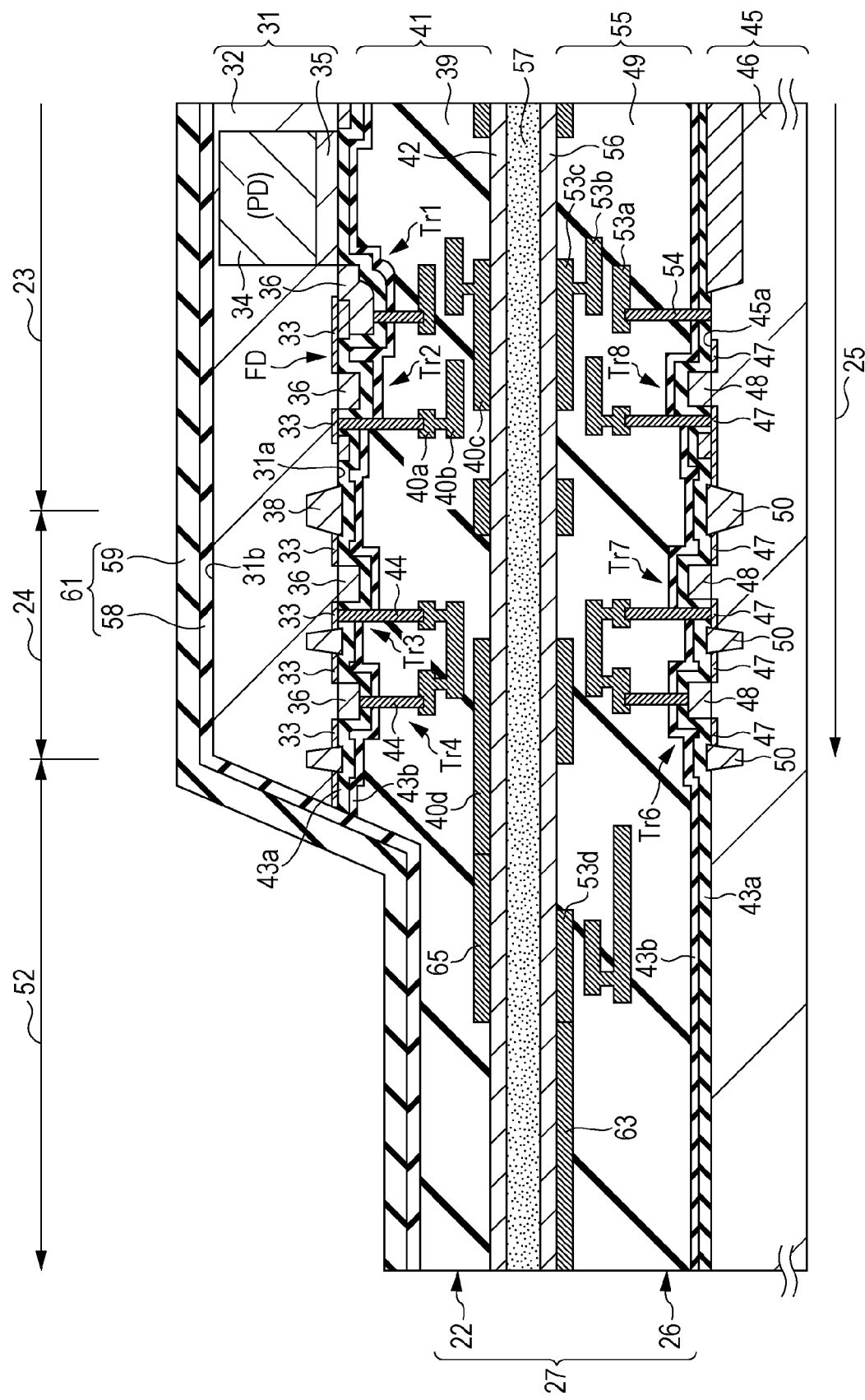
FIG. 17 is a diagram of an example of a process (part 1) of manufacturing the solid-state imaging device according to the second embodiment.

In FIG. 17, the configuration of the solid-state imaging device 78 is the same as the configuration described in the method of manufacturing the solid-state imaging device 28 with reference to FIG. 10 according to the above-described first embodiment. Since the steps up to FIG. 17 are the same as those from FIG. 4 to FIG. 10, the detailed description will not be repeated.

In the step of FIG. 17, the stacked insulation film 61 of the silicon oxide (SiO2) film 58 the a silicon nitride (SiN) film 59 is deposited across the rear surface (light-incident surface) of the control circuit 24 and the pixel array 23 from the inner surface of the semiconductor-removed region 52.

Figure 18:
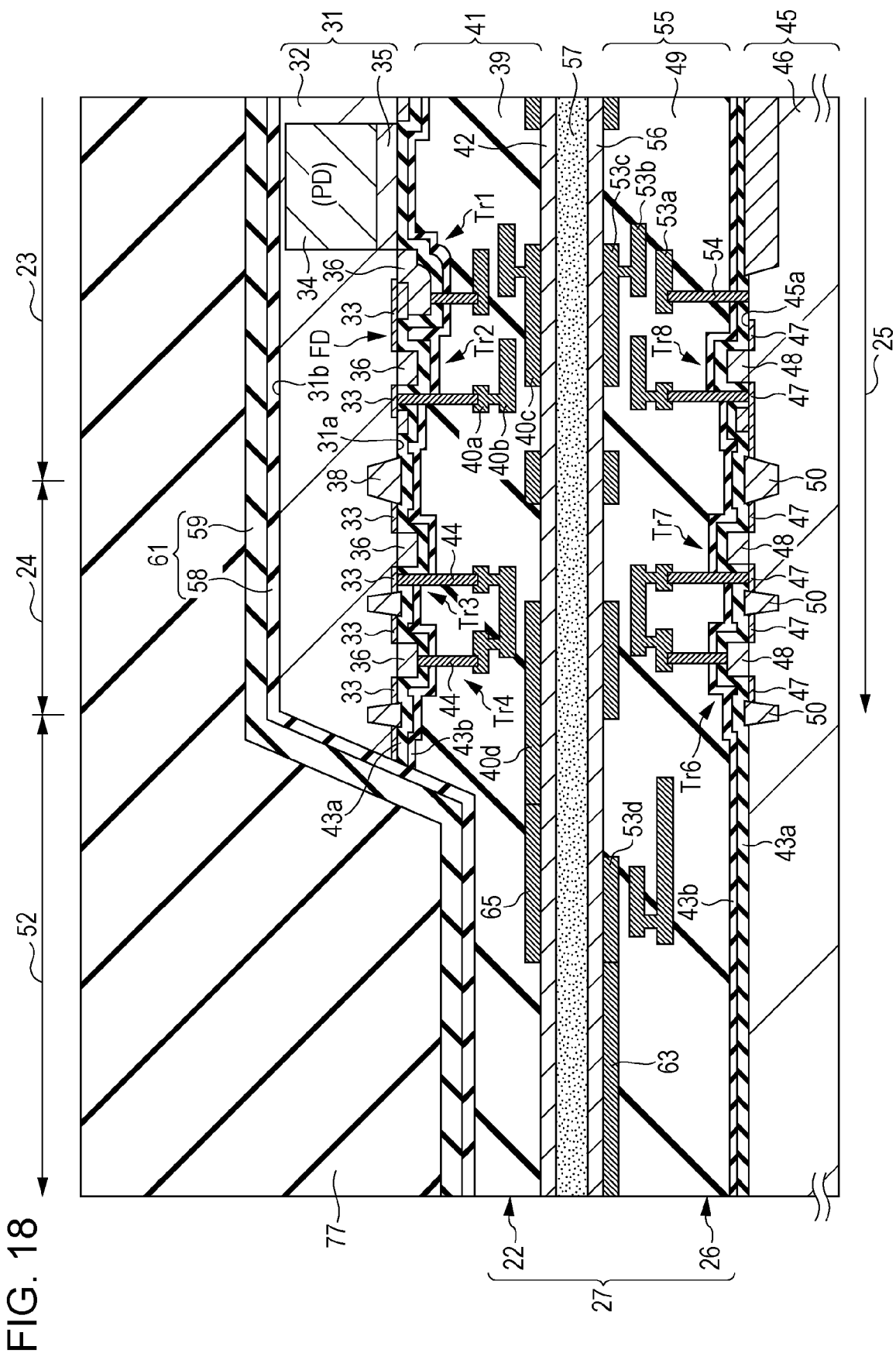
FIG. 18 is a diagram of an example of a process (part 2) of manufacturing the solid-state imaging device according to the second embodiment.

Next, as shown in FIG. 18, the insulation film 77 such as a silicon oxide film is stacked on the entire rear surface of the semiconductor substrate 31 so as to be buried in the semiconductor-removed region 52.

Figure 19:
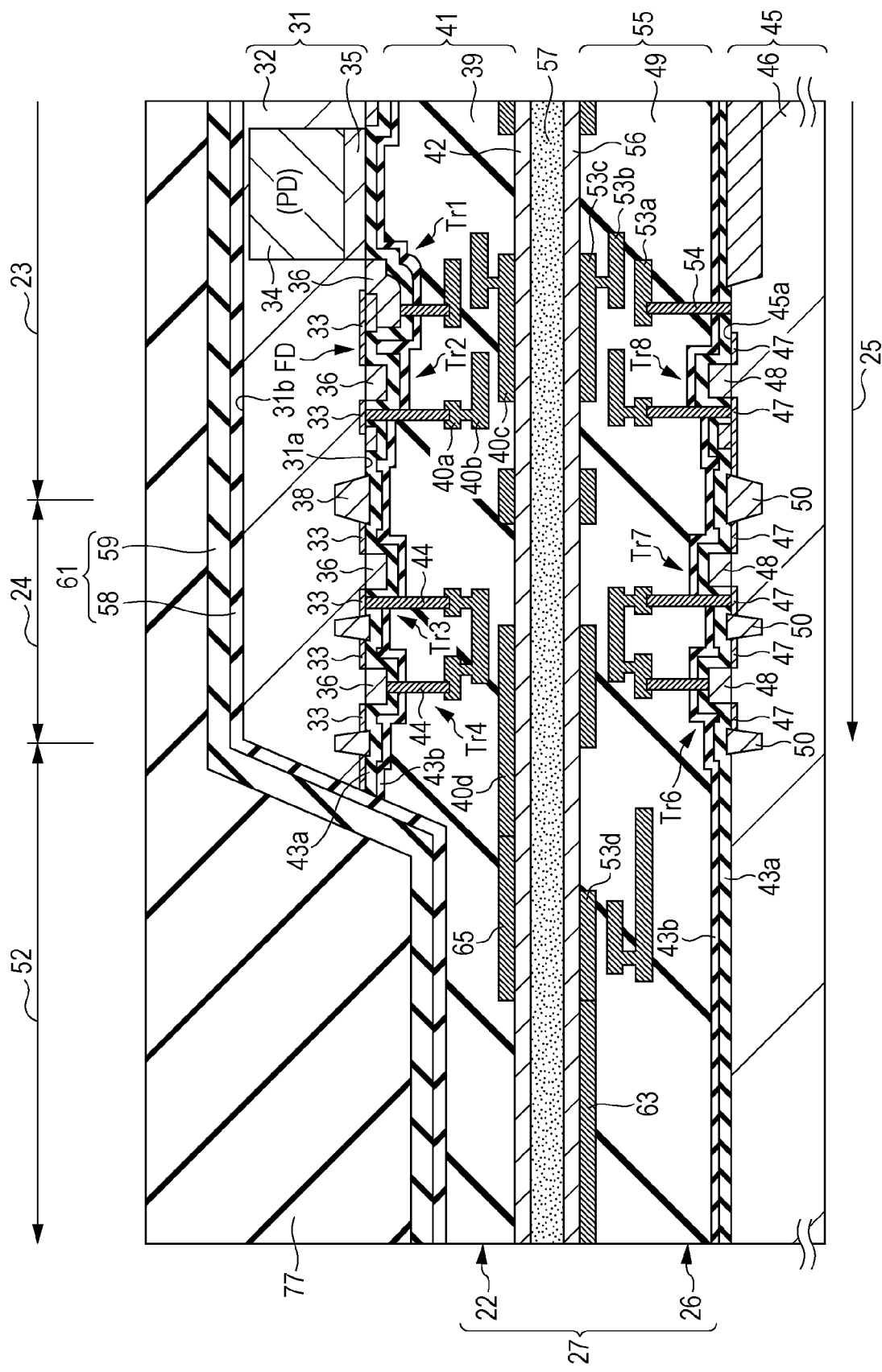
FIG. 19 is a diagram of an example of a process (part 3) of manufacturing the solid-state imaging device according to the second embodiment.

Next, as shown in FIG. 19, the insulation film 77 is polished up to a certain thickness by a chemical mechanical polishing (CMP) method.

Figure 20:
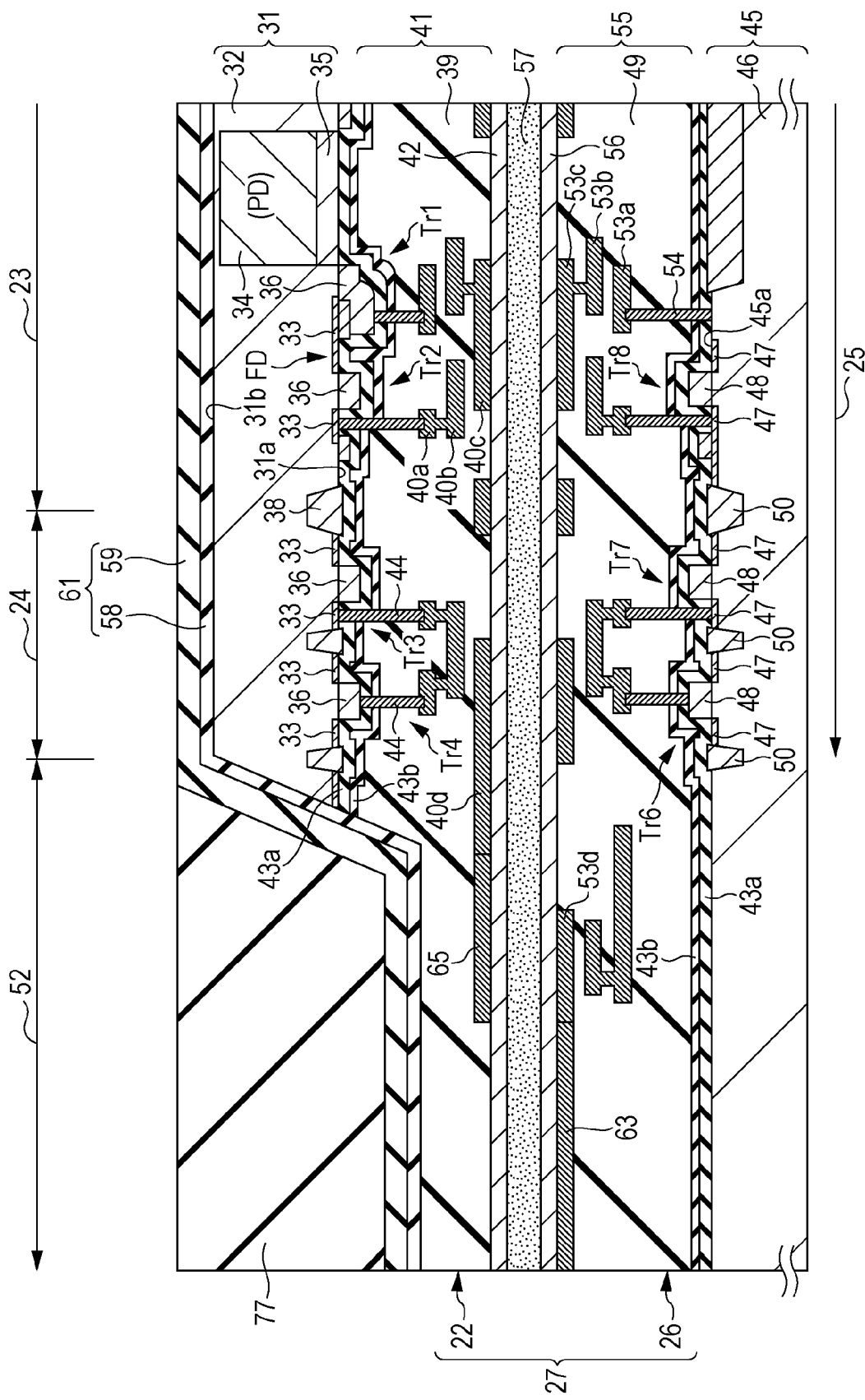
FIG. 20 is a diagram of an example of a process (part 4) of manufacturing the solid-state imaging device according to the second embodiment.

Next, as shown in FIG. 20, the insulation film 77 is etched up to the silicon nitride film 59 with hydrofluoric acid by a wet etching method and is flattened so as to be flush with the silicon nitride film 59. At this time, the silicon nitride film 59 serves as an etching stopper film.

Figure 21:
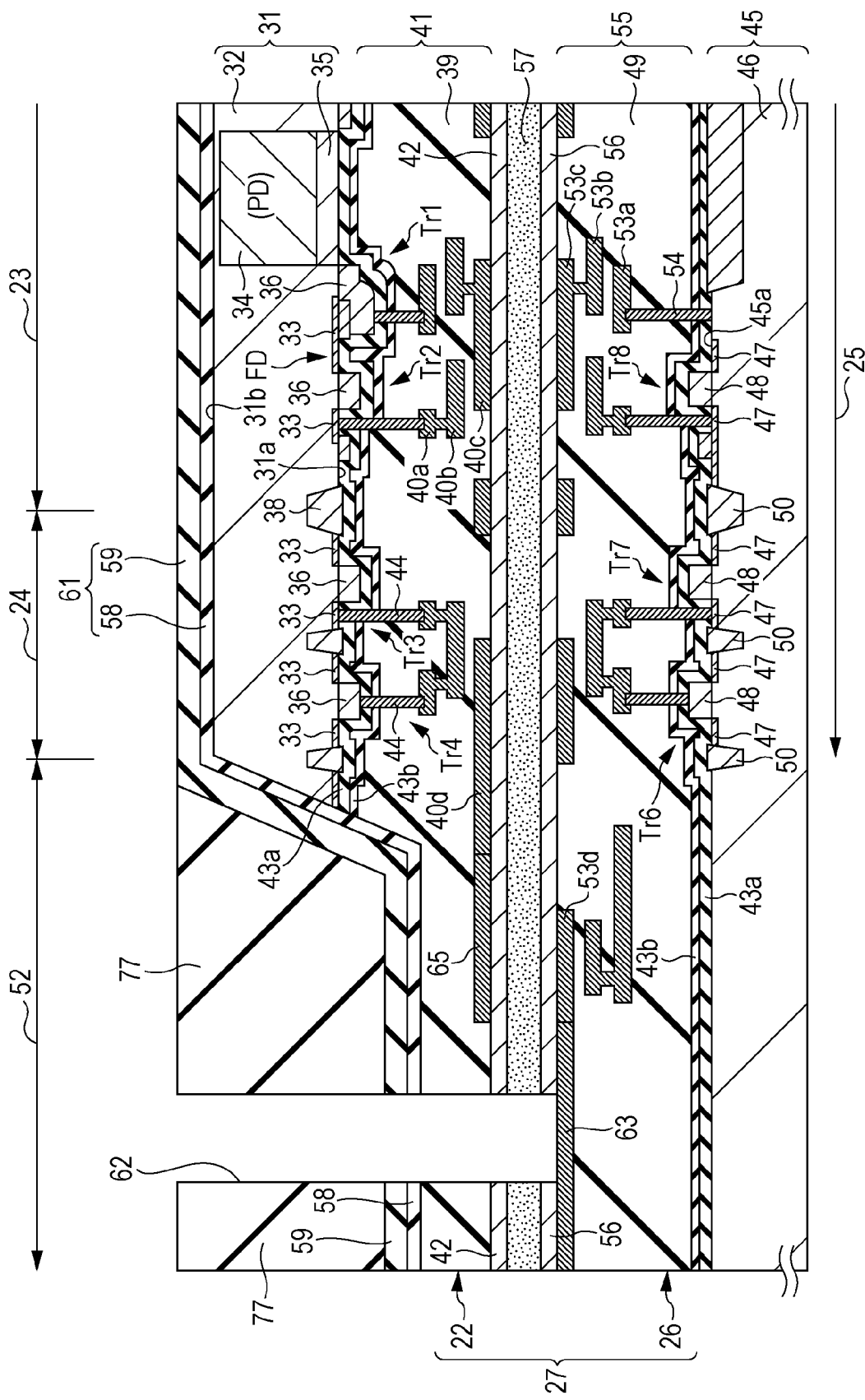
FIG. 21 is a diagram of an example of a process (part 5) of manufacturing the solid-state imaging device according to the second embodiment.

Next, as shown in FIG. 21, the connection holes 62, which are perforated through the insulation film 77 and the multi-layer writing layer 41 and reach the second connection pad 63 connected to the writing 53d of the multi-layer wiring layer 55 of the second semiconductor substrate 45, are formed in the semiconductor-removed region 52. In this example, as described above, the connection holes 62 are formed so as to reach the second connection pad 63 electrically connected to the uppermost layer of the multi-layer wiring layer 55, that is, the wiring 53d formed of the third layer metal M13. The plurality of connection holes 62 is formed by the number corresponding to the number of vertical signal lines of the pixel array 23. The wiring 53d formed of the third layer metal M13 connected to the second connection pad 63 serves as a routing wiring corresponding to the vertical signal line. In this example, the second connection pad 63 is continuously formed in the routing wirings 53d formed of the third layer metal M13 and corresponding to the vertical signals.

Figure 22:
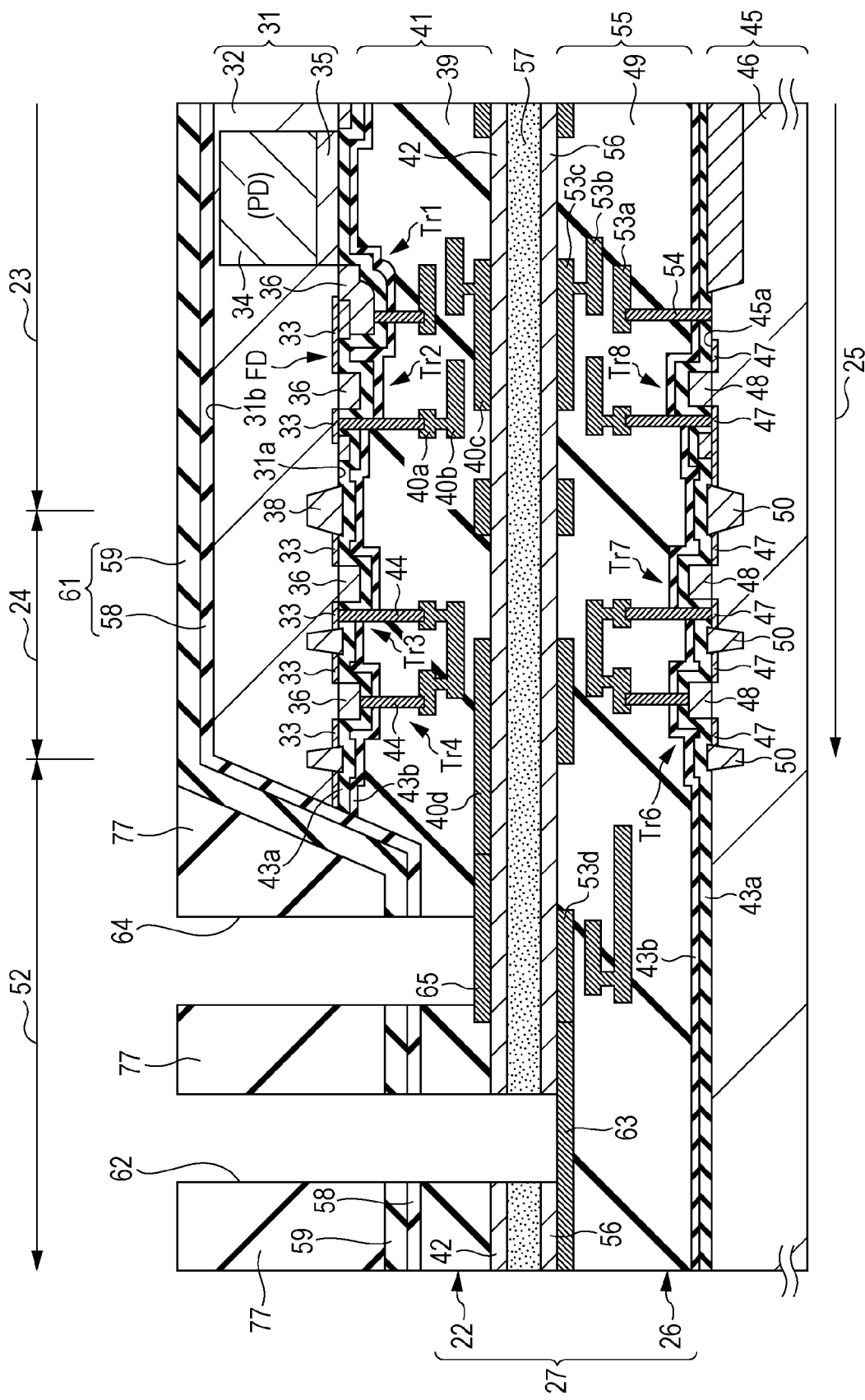
FIG. 22 is a diagram of an example of a process (part 6) of manufacturing the solid-state imaging device according to the second embodiment.

Next, as shown in FIG. 22, the connection holes 64, which reach the first connection pad 65 from the insulation film 77, are formed in the semiconductor-removed region 52. In this example, the connection holes 64 are formed so as to reach the first connection pad 65 electrically connected to the wiring 40d formed of the third layer metal M3 of the multi-layer wiring layer 41. The plurality of connection holes 64 is formed by the number corresponding to the number of vertical signal lines of the pixel array 23. The wiring 40d formed of the third layer metal M3 connected to the first connection pad 65 serves as a routing wiring corresponding to the vertical signal line. In this example, the first connection pad 65 is continuously formed in the routing wirings 40d formed of the third layer metal M3 and corresponding to the vertical signals.

Figure 23:
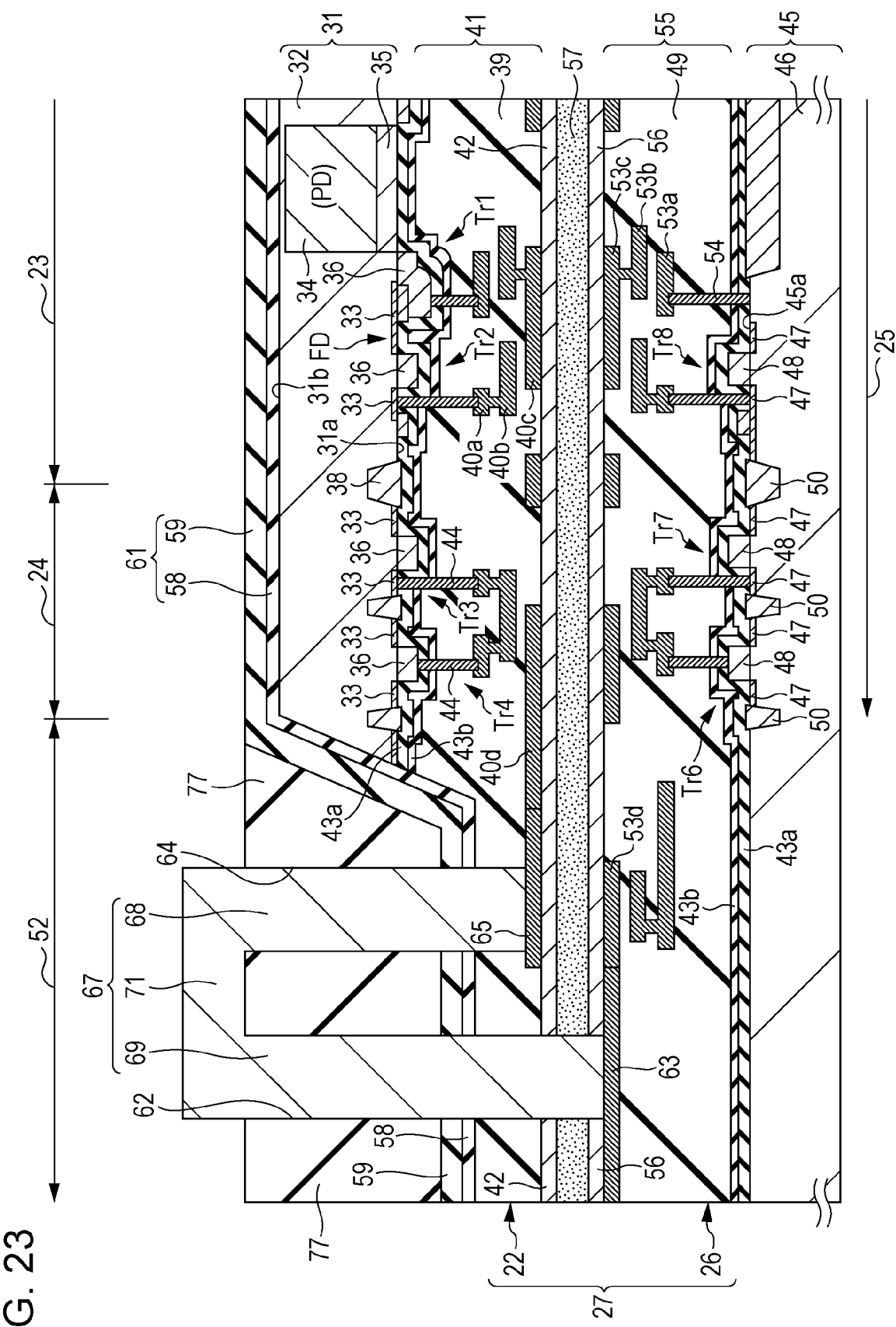
FIG. 23 is a diagram of an example of a process (part 7) of manufacturing the solid-state imaging device according to the second embodiment.

Next, as shown in FIG. 23, the connection writing 67 is formed to electrically connect the second connection pad 63 to the first connection pad 65. That is, a conductive film is formed on the insulation film 77 and the entire rear surface of the first semiconductor substrate 31 so as to be buried in both the connection holes 62 and 64, and then the connection wiring 67 is formed by etch-back or patterning. The connection wiring 67 includes the connection conductor 68, which is buried in the connection hole 64 and is connected to the first connection pad 65, and the through connection conductor 69, which is buried in the through connection hole 62 and is connected to the second connection pad. The connection wiring 67 further includes the connection conductor 71 which electrically connects the connection conductor 68 to the through connection conductor 69 on the flattened insulation film 77. The connection conductor 68, the through connection conductor 69, and the connection conductor 71 are integrally formed of the same metal so as to serve as a conductive film. The connection wiring 67 can be formed of metal, such as tungsten (W), aluminum (Al), or gold (Au) via barrier metal (TiN or the like), which can be patterned.

Figure 24:
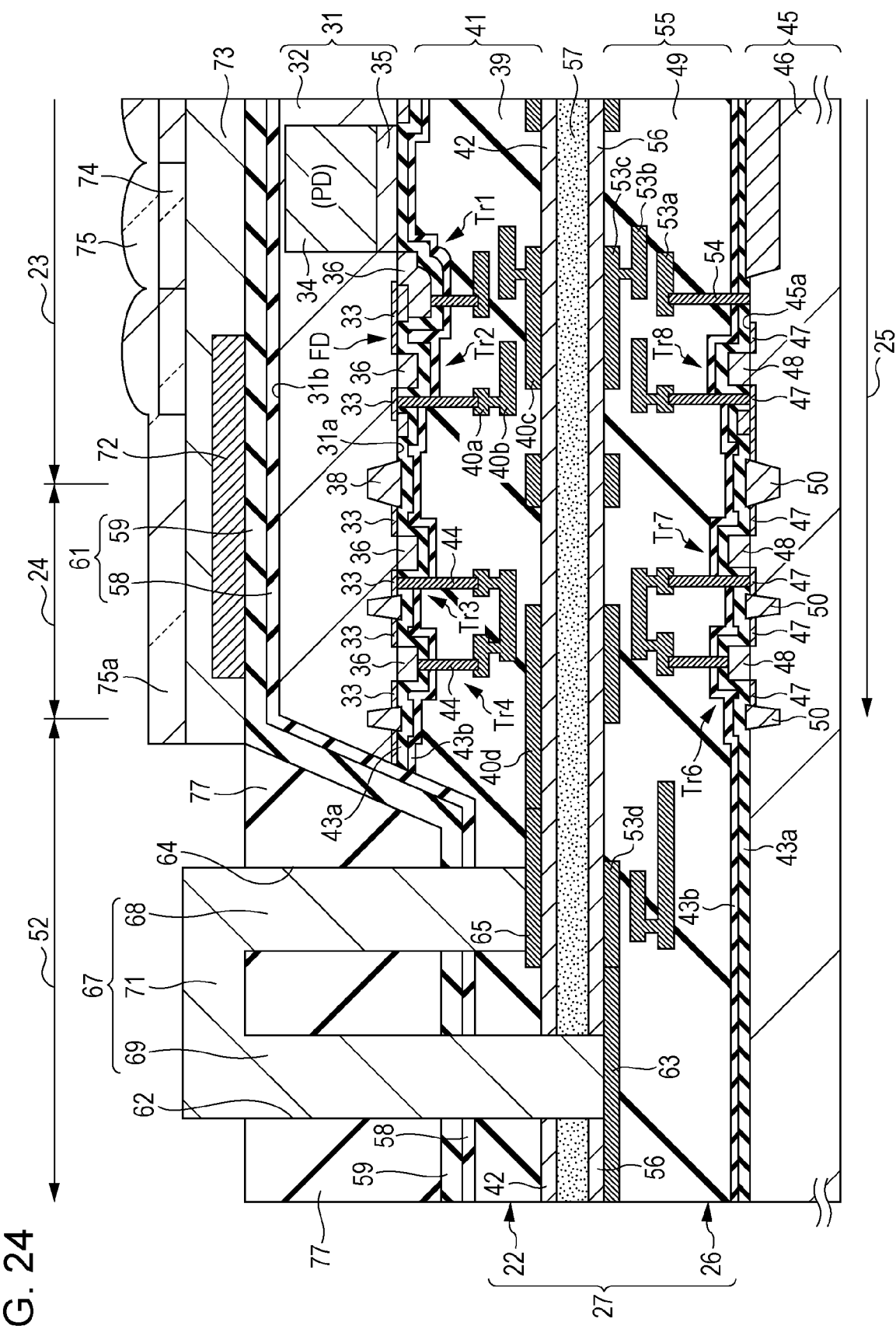
FIG. 24 is a diagram of an example of a process (part 8) of manufacturing the solid-state imaging device according to the second embodiment.

Next, as shown in FIG. 24, the light-shielding film 72 is formed on a region where it is necessary to shield light. The light-shielding film 72 is formed on the control circuit 24, as schematically illustrated in the drawing, but may be also formed on the pixel transistors. The light-shielding film 72 can be formed of metal such as tungsten (W). The flattened film 73 is formed across the pixel array 23 so as to cover the light-shielding film 72. The on-chip color filters 74 of, for example, red (R), green (G), and blue (B) are formed on the flattened film 73 so as to correspond to the respective pixels, and the on-chip micro-lenses 75 are formed on the on-chip color filters 74. In the first semiconductor substrate 31, the pixel array 23 and the control circuit 25 are formed as the finished products. The connection conductor 71 of the connection writing 67 serves as an electrode pad exposed to the outside. In the second semiconductor substrate 45, the logic circuit 25 is formed as the finished product.

Next, the semiconductor substrates are divided into chips, and thus the backside illuminated solid-state imaging apparatus 78 of a target is obtained, as shown in FIG. 16.

According to the solid-state imaging device 78 and the manufacturing method thereof according to the second embodiment, a part of the first semiconductor chip unit 22, that is, the semiconductor section of the region where the connection conductor 68 and the through connection conductor 69 are formed is completely removed and the insulation film 77 is buried in the removed semiconductor-removed region 52. Since the connection conductor 68 and the through connection conductor 69 are buried in the connection hole 64 and the through connection hole 62 formed in the insulation film 77, the connection conductors 68 and 69 are distant from the side surface of the semiconductor substrate 31 due to the insulation film 77. Therefore, the parasitic capacitance is reduced between the semiconductor substrate 31 and the connection conductors 68 and 69. Further, the inside of the semiconductor-removed region 52 is buried in the insulation film 77, the surface of the semiconductor substrate 31 facing the side wall of the semiconductor-removed region 52 can be reliably protected mechanically in cooperation with the stacked insulation film 61. Accordingly, the solid-state imaging device can be provided with more performed.

In this embodiment, since the first semiconductor substrate 31 is thinned and the through connection holes 62 and the connection holes 64 are formed, the aspect ratio of the holes is reduced and the connection holes 62 and 64 can be formed with high precision. Accordingly, the solid-state imaging apparatus with high performance can be manufactured with high precision.

Although the other description will not be made, the same advantages as those of the first embodiment can be obtained.

4. Third Embodiment

Example of Configuration of Solid-State Imaging Device

Figure 25:
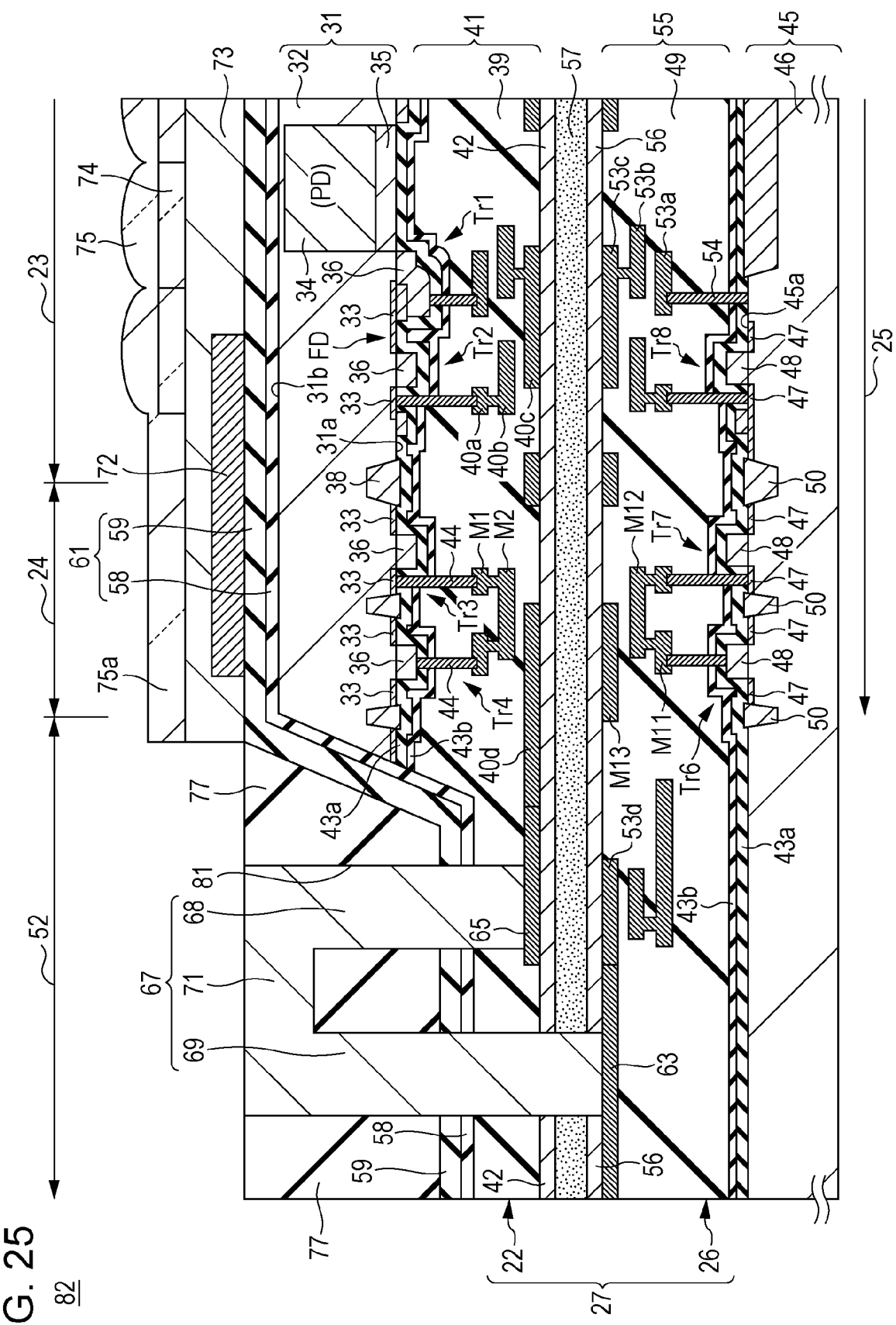
FIG. 25 is a diagram of the overall configuration of the main units of a solid-state imaging device according to a third embodiment of the disclosure.

FIG. 25 is a diagram of a semiconductor device, that is, a MOS solid-state imaging apparatus according to a third embodiment of the disclosure. A solid-state imaging apparatus 82 according to the third embodiment has configuration in which the stacked semiconductor chip 27 is formed such that the first semiconductor chip unit 22 including the pixel array 23 and the control circuit 24 and the second semiconductor chip unit 26 including the logic circuit 25 are bonded to each other. The first semiconductor chip unit 22 and the second semiconductor chip unit 26 are bonded to each other so that the multi-layer wiring layers 41 and 55 face each other.

In this embodiment, the semiconductor-removed region 52 where the semiconductor section of a part of the first semiconductor chip unit 22 is completely removed is formed and the stacked insulation film 61 extending from the inner surface of the semiconductor-removed region 52 to the rear surface of the semiconductor substrate 31 is formed. The flattened insulation film 77 flush with the surface of the stacked insulation film 61 on the semiconductor substrate 31 is formed in semiconductor-removed region 52 and a concave portion 81 with a certain depth from the surface is formed in a portion corresponding to the connection wiring 67 of the insulation film 77. The etching rate of the flattened insulation film 77 is different from that of the silicon nitride film 59 on the surface of the stacked insulation film 61. For example, the flattened insulation film 77 is formed as an insulation film such as a silicon oxide film.

The connection holes 64 and the through connection holes 62 are formed so as to reach the first connection pad 65 and the second connection pad 63 through the insulation film 77 below the concave portion 81. The connection wiring 67 connecting the first connection pad 65 and the second connection pad 63 is formed through both the connection holes 64 and 62. The connection wiring 67 includes the connection conductor 68 buried in the connection holes 64 and 62 and electrically connected to the first connection pad 65, the through connection conductor 69 electrically connected to the second connection pad 63, and the connection conductor 71 electrically connecting the upper ends of the connection conductor 68 and the through connection conductor 69. The connection conductor 68, the through connection conductor 69, and the connection conductor 71 are integrally formed of metal. The connection conductor 71 is buried in the concave portion 81 of the insulation film 77 and the surface of the connection conductor 71 is formed so as to be flush with the surface of the flattened insulation film 77.

The other configuration is the same as the configuration described in the first embodiment. The same reference numerals are given to constituent elements corresponding to those of FIG. 3 and the description thereof will not be repeated.

Example of Method of Manufacturing Solid-State Imaging Device

Figure 26:
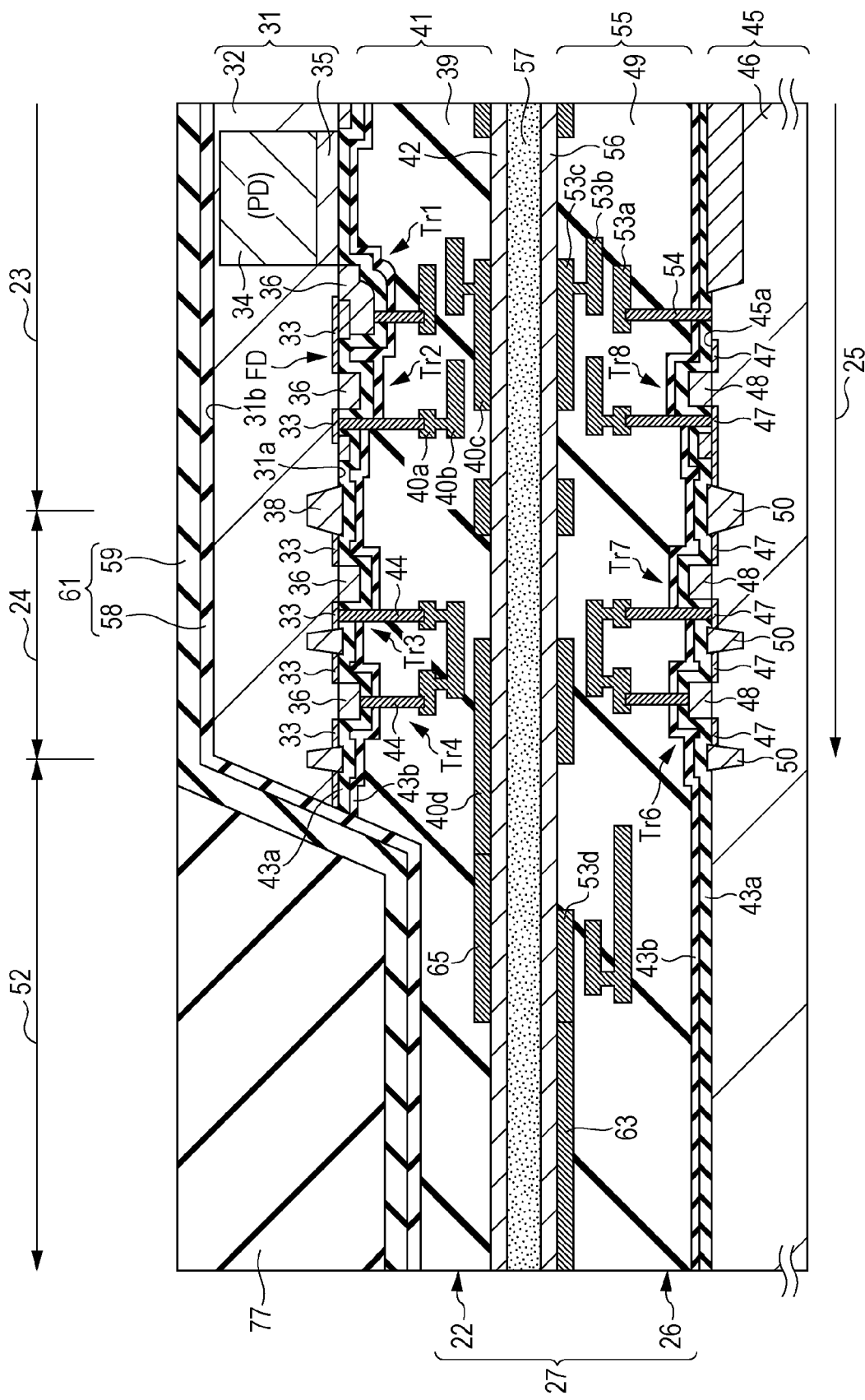
FIG. 26 is a diagram of an example of a process (part 1) of manufacturing the solid-state imaging device according to the third embodiment.

FIGS. 26 to 30 are diagrams of a method of manufacturing the solid-state imaging device 82 according to the third embodiment. In FIG. 26, the configuration of the solid-state imaging device 82 is the same as the configuration described in the method of manufacturing the solid-state imaging device 78 with reference to FIG. 20 according to the above-described second embodiment. Since the steps up to FIG. 26 are the same as those from FIG. 4 to FIG. 10 and from FIG. 17 to FIG. 20, the detailed description will not be repeated.

In a step of FIG. 26, the insulation film 77 is stacked so as to be buried in the semiconductor-removed region 52, and then the surface of the insulation film 77 is flattened by chemical mechanical polishing (CMP) and wet etching so as to be flush with the surface of the stacked insulation film 61.

Figure 27:
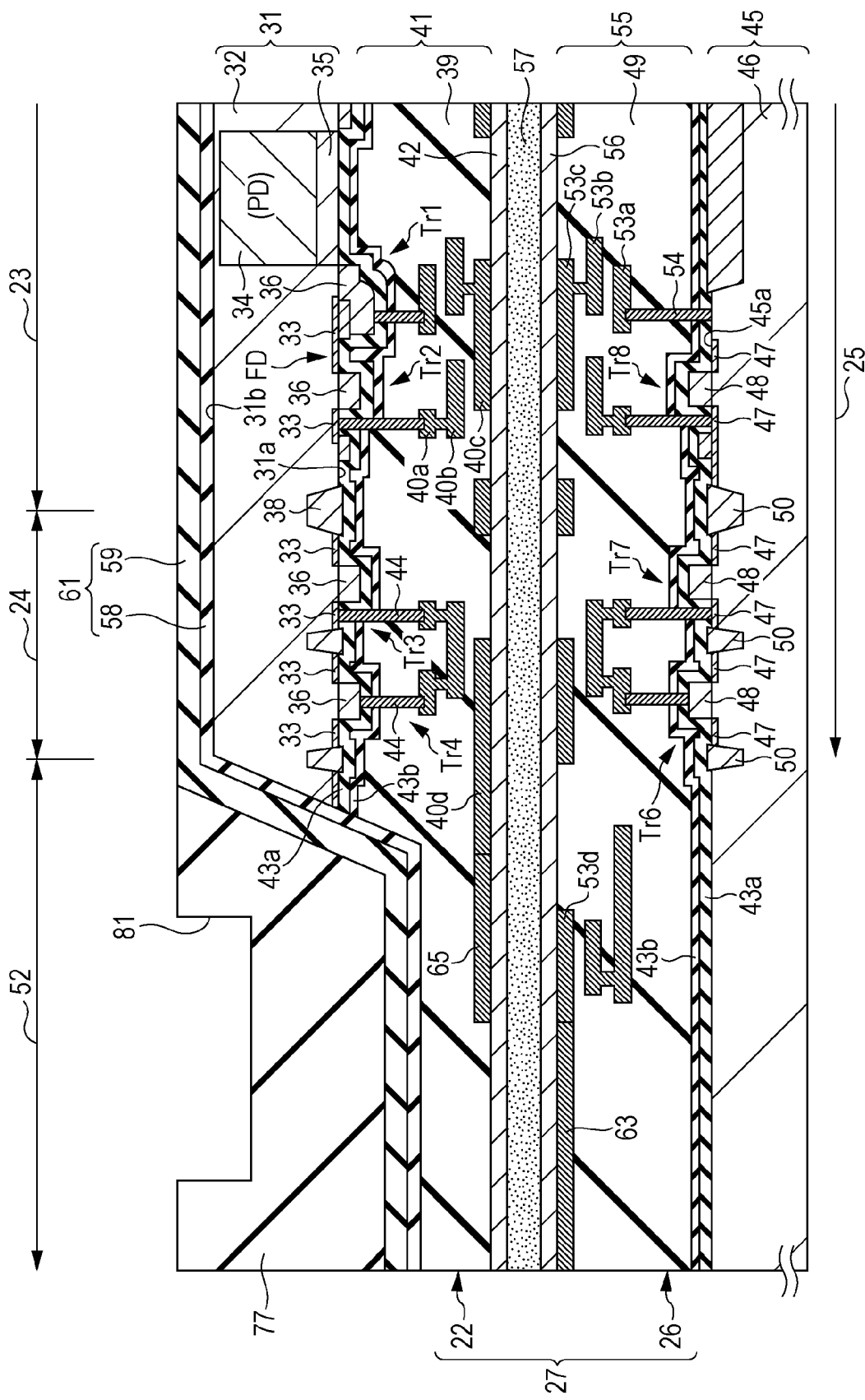
FIG. 27 is a diagram of an example of a process (part 2) of manufacturing the solid-state imaging device according to the third embodiment.

Next, as shown in FIG. 27, the concave portion 81 with a certain depth from the surface is formed in the surface of the insulation film 77 so as to correspond to the region which the connection wiring 67 is to be formed.

Figure 28:
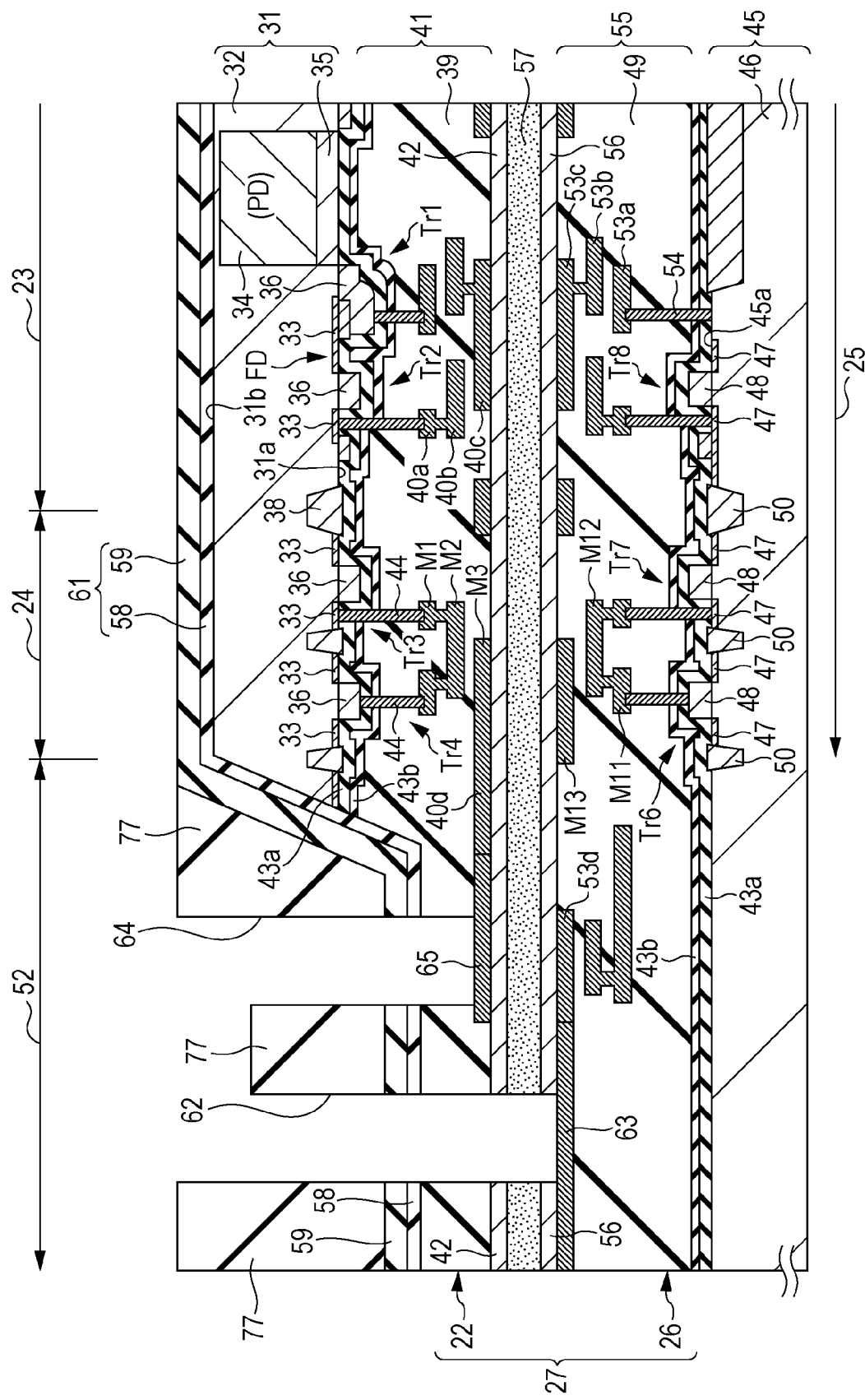
FIG. 28 is a diagram of an example of a process (part 3) of manufacturing the solid-state imaging device according to the third embodiment.

Next, as shown in FIG. 28, the through connection holes 62 are perforated through the insulation film 77 below the concave portion 81 and the multiple-layer wiring layer 41 so as to reach the second connection pad 63. In this example, as described above, the connection holes 62 are formed so as to reach the second connection pad 63 electrically connected to the uppermost layer metal of the multi-layer wiring layer 55 of the second semiconductor chip unit 26, that is, the wiring 53d of the third layer metal M13. The plurality of connection holes 62 is formed by the number corresponding to the number of vertical signal lines of the pixel array 23. The wiring 53d connected to the second connection pad 63 serves as a routing wiring corresponding to the vertical signal line. In this example, the second connection pad 63 is continuously formed in the routing wirings 53d formed of the third layer metal M13 and corresponding to the vertical signals.

Further, the connection holes 64, which reach the first connection pad 65 from the insulation film 77 below the concave portion 81, are formed in the semiconductor-removed region 52. In this example, the connection holes 64 are formed so as to reach the first connection pad 65 electrically connected to the wiring 40d formed of the third layer metal M3 of the multi-layer wiring layer 41 of the first semiconductor chip unit 22. The plurality of connection holes 64 is formed by the number corresponding to the number of vertical signal lines of the pixel array 23. The wiring 40c of the third-layer metal connected to the first connection pad 65 serves as a routing wiring corresponding to the vertical signal line. In this example, the first connection pad 65 is continuously formed in the routing wirings 40d formed of the third layer metal M13 and corresponding to the vertical signals.

Figure 29:
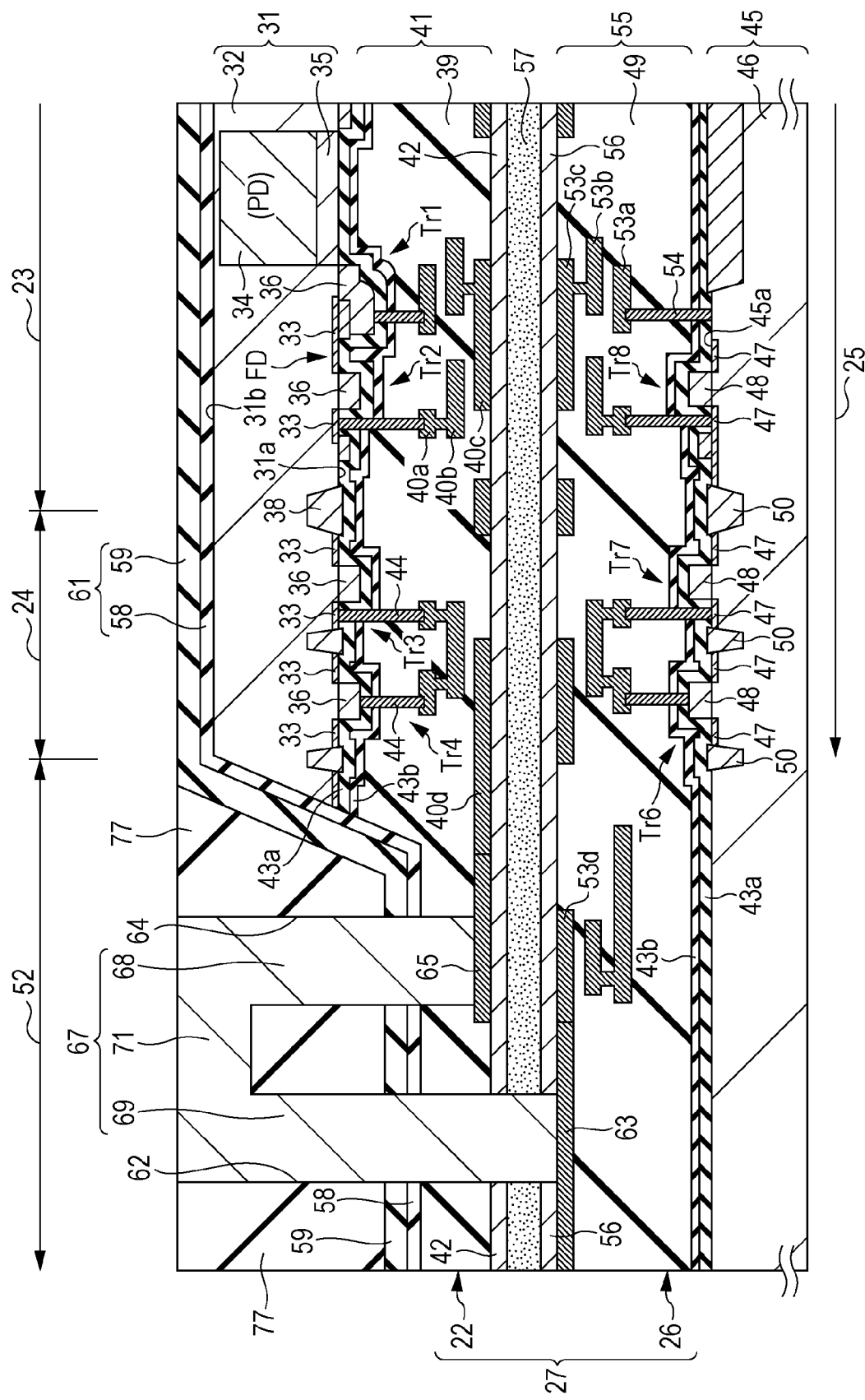
FIG. 29 is a diagram of an example of a process (part 4) of manufacturing the solid-state imaging device according to the third embodiment.

Next, as shown in FIG. 29, the connection writing 67 is formed to electrically connect the second connection pad 63 to the first connection pad 65. That is, a conductive film is formed on the insulation film 77 and the entire rear surface of the first semiconductor substrate 31 so as to be buried in the concave portion 81 and both the connection holes 62 and 64, and then the connection wiring 67 is formed by etch-back or patterning. The connection wiring 67 includes the connection conductor 68, which is buried in the connection hole 64 and is connected to the first connection pad 65, and the through connection conductor 69, which is buried in the through connection hole 62 and is connected to the second connection pad. The connection wiring 67 further includes the connection conductor 71 which electrically connects the connection conductor 68 to the through connection conductor 69. The connection conductor 71 is buried in the concave portion 81 and is flattened so as to be flush with the surface of the insulation film 77. The connection conductor 68, the through connection conductor 69, and the connection conductor 71 are integrally formed of the same metal so as to serve as a conductive film. Since the connection wiring 67 is formed by etch-back, the connection wiring 67 can be formed of copper (Cu). The connection wiring 67 can be formed of metal, such as tungsten (W), aluminum (Al), or gold (Au), via barrier metal (TiN or the like).

Figure 30:
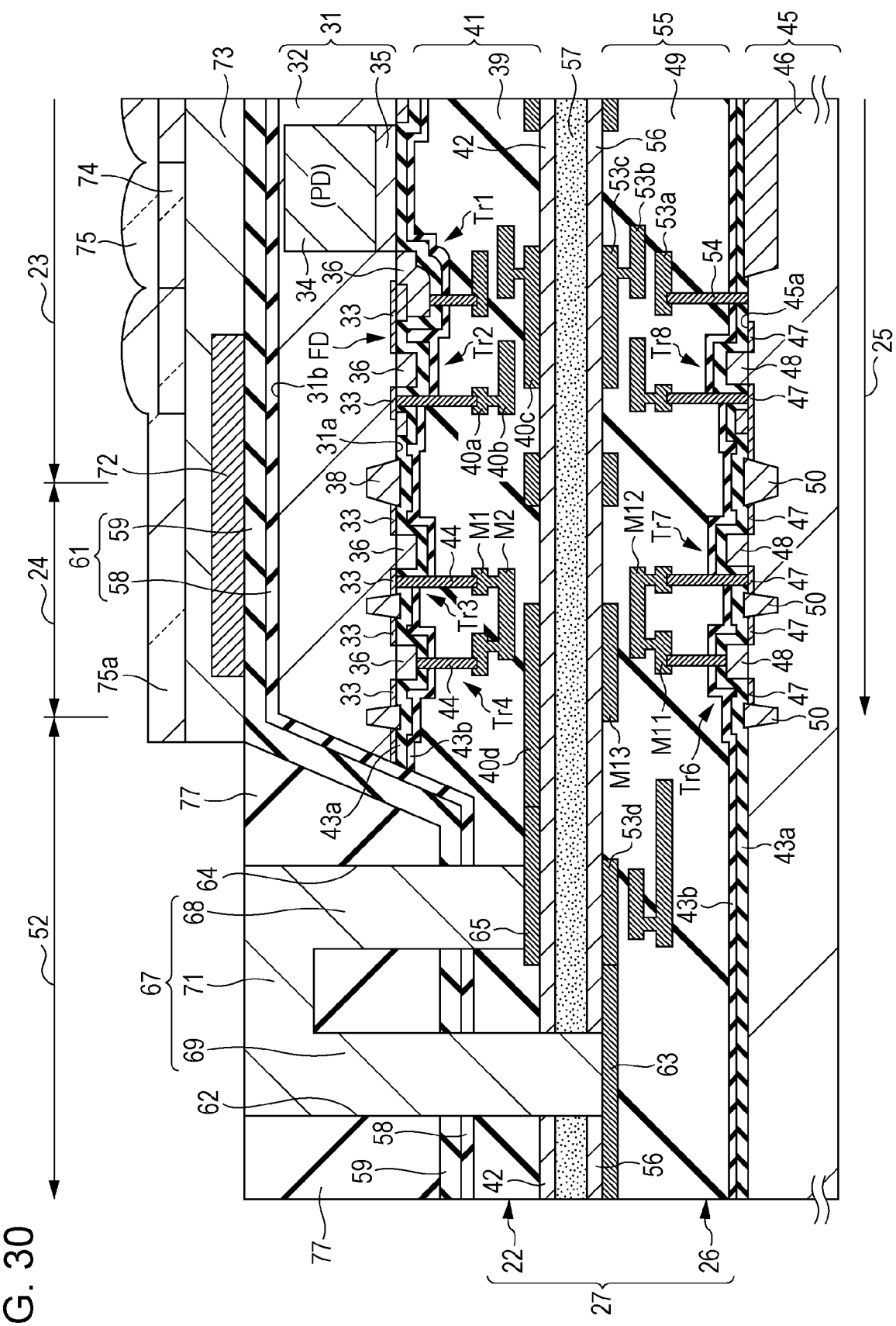
FIG. 30 is a diagram of an example of a process (part 5) of manufacturing the solid-state imaging device according to the third embodiment.

Next, as shown in FIG. 30, the light-shielding film 72 is formed on a region where it is necessary to shield light. The light-shielding film 72 is formed on the control circuit 24, as schematically illustrated in the drawing, but may be also formed on the pixel transistors. The light-shielding film 72 can be formed of metal such as tungsten (W). The flattened film 73 is formed across the pixel array 23 so as to cover the light-shielding film 72. The on-chip color filters 74 of, for example, red (R), green (G), and blue (B) are formed on the flattened film 73 so as to correspond to the respective pixels, and the on-chip micro-lenses 75 are formed on the on-chip color filters 74. In the first semiconductor substrate 31, the pixel array 23 and the control circuit 25 are formed as the finished products. The connection conductor 71 of the connection writing 67 serves as an electrode pad exposed to the outside. In the second semiconductor substrate 45, the logic circuit 25 is formed as the finished product.

Next, the semiconductor substrates are divided into chips, and thus the backside illuminated solid-state imaging apparatus 82 of a target is obtained, as shown in FIG. 25.

According to the solid-state imaging device and the manufacturing method thereof according to the third embodiment, a part of the first semiconductor chip unit 22, that is, the semiconductor section of the region where the connection conductor 68 and the through connection conductor 69 are formed is completely removed and the insulation film 77 is buried in the removed semiconductor-removed region 52. The concave portion 81 is formed in the insulation film 77 and the connection conductor 68 and the through connection conductor 69 are buried in the connection hole 64 and the through connection hole 62 formed in the insulation film 77 below the concave portion 81. Since the connection conductors 68 and 69 are distant from the side surface of the semiconductor substrate 31 due to the insulation film 77, the parasitic capacitance is reduced between the semiconductor substrate 31 and the connection conductors 68 and 69. Further, the inside of the semiconductor-removed region 52 is buried in the insulation film 77, the surface of the semiconductor substrate 31 facing the side wall of the semiconductor-removed region 52 can be reliably protected mechanically in cooperation with the stacked insulation film 61. Accordingly, the solid-state imaging device can be provided with more performed.

Since the connection conductor 71 is buried in the concave portion 81 of the insulation film 77 and the connection conductor 71 is flattened so as to be flush with the surface of the insulation film 77, the solid-state imaging apparatus with less surface step difference can be formed.

In the third embodiment, since the first semiconductor substrate 31 is thinned, the concave portion 81 is further formed in the insulation film 77, and the through connection holes 62 and the connection holes 64 are formed, the aspect ratio of the holes is reduced and the connection holes 62 and 64 can be formed with high precision. Accordingly, the solid-state imaging apparatus with high performance can be manufactured with high precision.

Although the other description will not be made, the same advantages as those of the first embodiment can be obtained.

In the above-described second and third embodiments, the configuration shown in FIG. 2C can be utilized.

According to the above-described embodiments, the two semiconductor chip units 22 and 26 are bonded to each other. Further, the solid-state imaging device according to embodiments of the disclosure, two or more semiconductor chip units may be bonded to each other. Even in two or more semiconductor chip units bonded to each other, the above-described configuration can be applied in which the semiconductor section is completely removed in the connection portion between the first semiconductor chip unit 22 including the pixel array 23 and the second semiconductor chip unit 26 including the logic circuit 25 performing signal processing.

In the configuration in which the above-described semiconductor chip units are bonded to each other, parasitic capacitance such as ground capacity adjacent coupling capacitance occurs. In particular, since the surface areas of the connection conductor 68 and the through connection conductor 69 are large, the adjacent coupling capacitance is preferably reduced in the gap between the connection conductors of the adjacent columns or the gap between the routing writings of the adjacent columns. Here, the gap between the connection conductors refers to the gap between a pair of adjacent connection conductors when the connection conductor 68 and the through connection conductor 69 are set as a pair of connection conductors. On the other hand, since the area and pitch of the first connection pad 65 and the area and pitch of the second connection pad 63 are greater than a pixel area and a pixel pitch, a practically usable layout is preferable.

Next, reduction in the pair of adjacent coupling capacities and practically usable layout will be described according to an embodiment of the disclosure.

5. Fourth Embodiment

Example of Configuration of Solid-State Imaging Device

Figure 31:
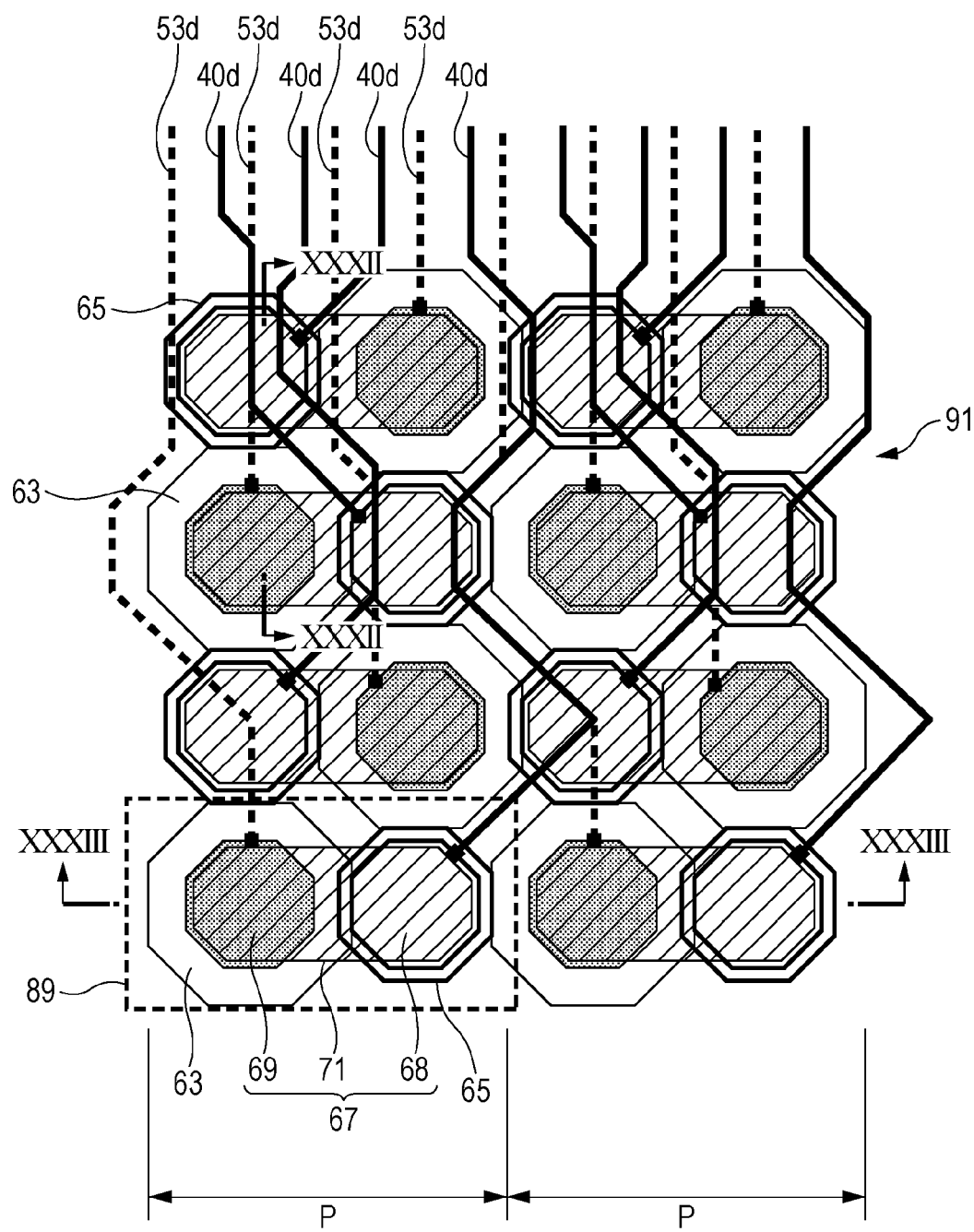
FIG. 31 is a diagram of the overall configuration of the main units of a solid-state imaging device according to a fourth embodiment of the disclosure.
Figure 32:
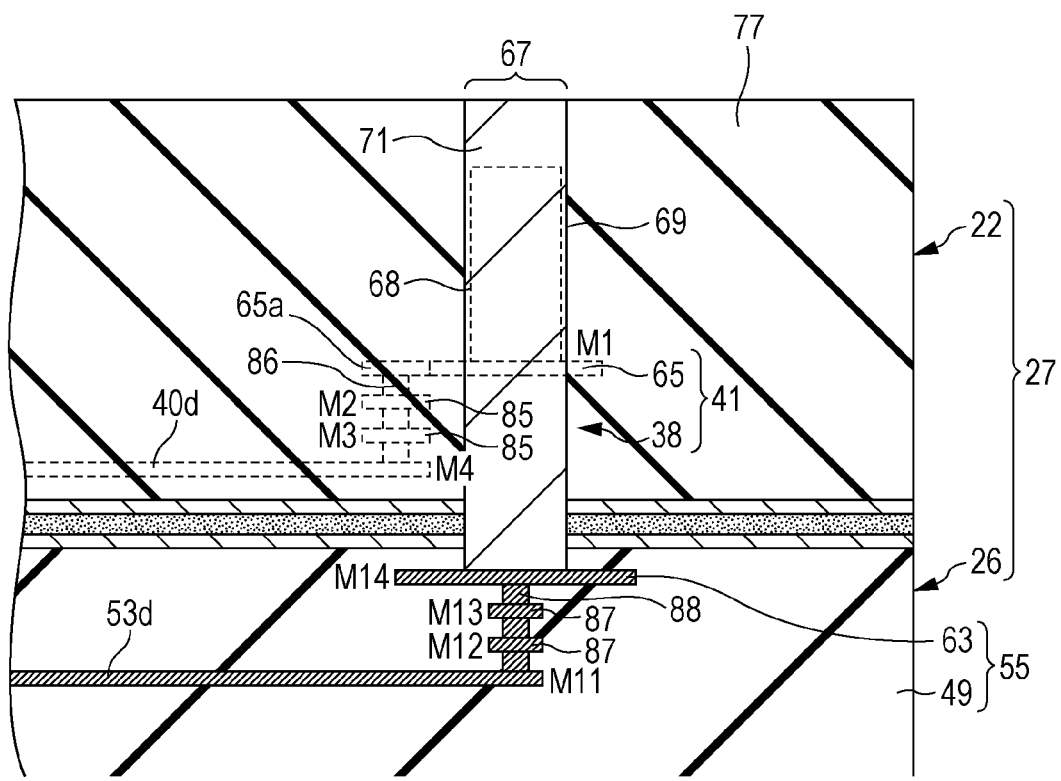
FIG. 32 is a schematic sectional view taken along the line XXXII-XXXII of FIG. 31.
Figure 33:
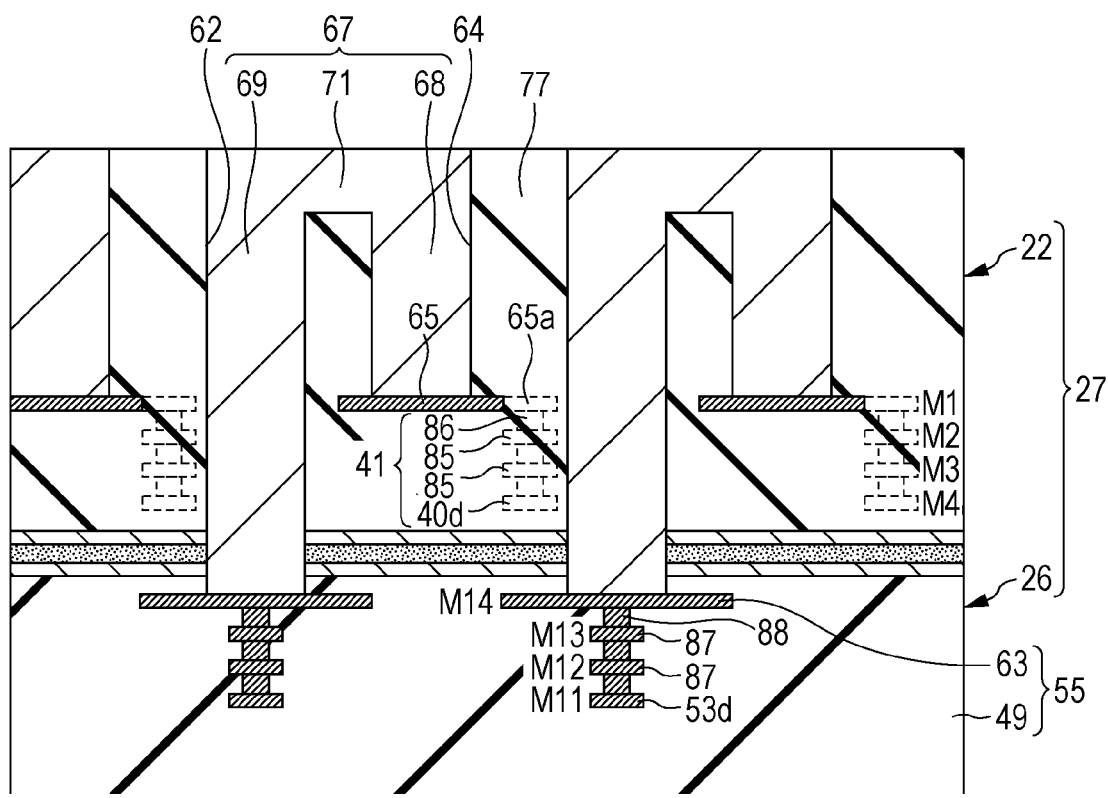
FIG. 33 is a schematic sectional view taken along the line XXXIII-XXXIII of FIG. 31.
Figure 34:
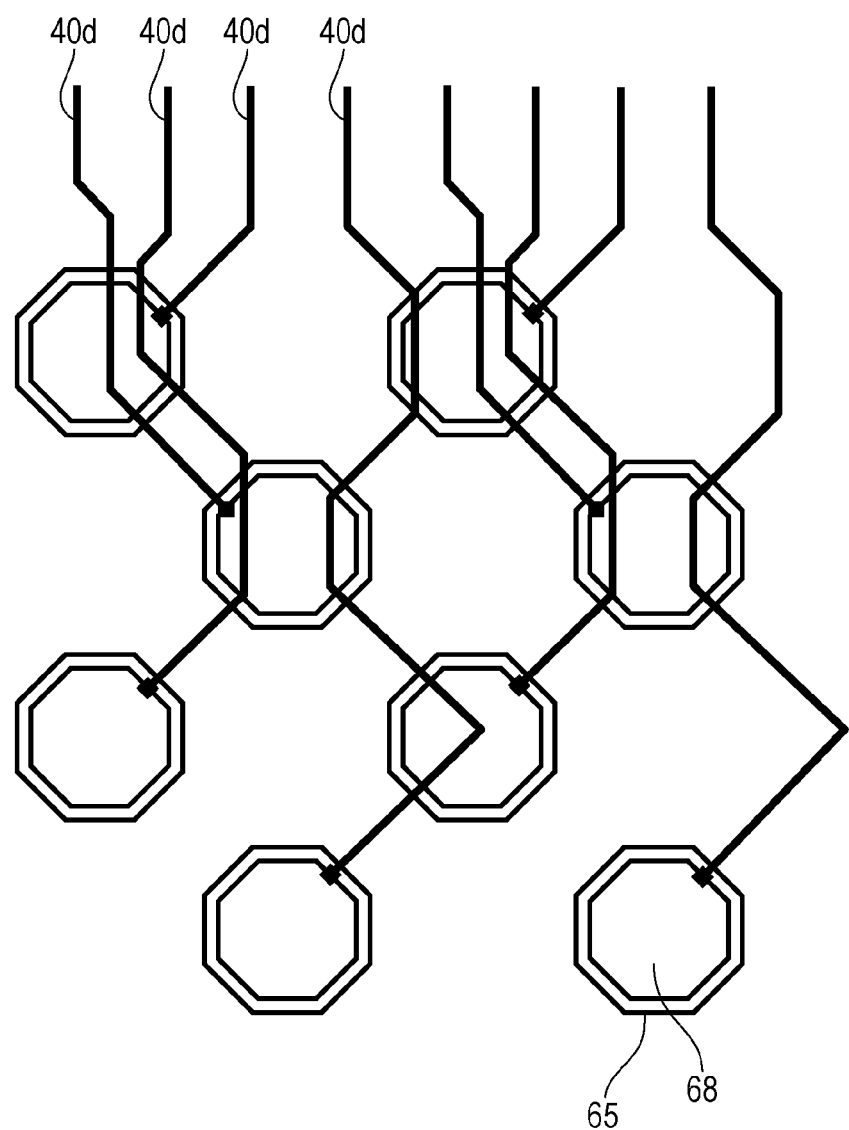
FIG. 34 is an exploded plan view of a first connection pad in FIG. 31.
Figure 35:
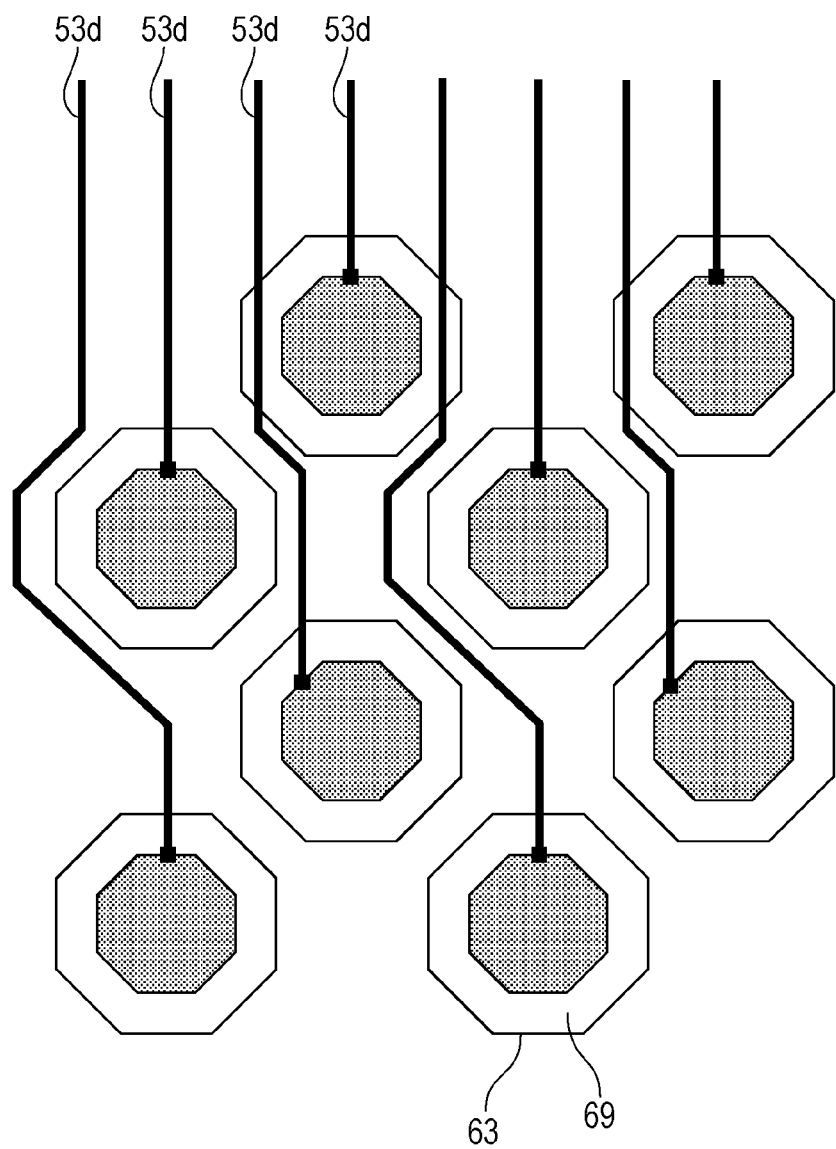
FIG. 35 is an exploded plan view of a second connection pad in FIG. 31.

FIGS. 31 to 35 are diagrams of a semiconductor device, that is, a MOS solid-state imaging device according to a fourth embodiment. In particular, FIGS. 31 to 35 show only the layout of a wiring connection section including the connection pads electrically connecting the first and second semiconductor chip units to each other. FIG. 31 is a plan view of a connection pad array. FIG. 32 is a sectional view taken along the line XXXII-XXXII of FIG. 31. FIG. 33 is a sectional view taken along the line XXXIII-XXXIII of FIG. 31. FIGS. 34 and 35 are exploded plan views of FIG. 31.

In a solid-state imaging device 84 according to the fourth embodiment, as described above, the two semiconductor chip units 22 and 26 are bonded to each other, the semiconductor section of a part of the first semiconductor chip unit 22 is removed, both the semiconductor chip units 22 and 26 are connected to each other via the connection wiring 67 in the semiconductor-removed region 52. In this embodiment, since several configurations of the above-described embodiments are applied to the other configuration other than the layout of the wiring connection section, the detailed description thereof will not be repeated.

In the fourth embodiment, writings 40 [40a, 40b, 40c, and 40d] of the multi-layer wiring 41 in the first semiconductor chip unit 22 are formed as a plurality of layers, in this example, four-layer metals M1 to M4. The first connection pad 65 is formed of the first layer metal M1 and the routing writing 40d corresponding to the vertical signal line is formed of a metal subsequent to the second layer. In this embodiment, the routing writing 40d corresponding to the vertical signal line is formed of the fourth layer metal M4. The wirings 53 [53a, 53b, 53c, and 53d] of the multi-layer wiring layer 55 in the second semiconductor chip unit 26 is formed of a plurality of layers, in this example, four-layer metals M11 to M14. The second connection pad 63 is formed of the layer subsequent to the second layer metal such as the third or fourth layer metal, in this embodiment, the fourth layer metal M14 which is the uppermost layer. The routing writing 53d corresponding to the vertical signal line is formed of a metal below the metal M14 of the connection pad 63, in this example, the first layer metal M11. In the first semiconductor chip unit 22, the first connection pad 65 formed of the first layer metal is electrically connected to the routing wiring 40d formed of the fourth layer metal through via conductors 86 and connection portions 85 formed of the second layer metal and the third layer metal. In the second semiconductor chip unit 26, the second connection pad 63 formed of the fourth layer metal is electrically connected to the routing wiring 53d formed of the first layer metal through via conductors 88 and connection portions 87 formed of the third layer metal and the second layer metal.

The second connection pad 63 has an area larger than that of the first connection pad 65 in consideration of the position deviation of the bonding of the first semiconductor chip unit 22 and the second semiconductor chip unit 26. A pair of a first connection pad 65 and a second connection pad 63 are collectively referred to as a pair of connection pads 89.

In general, the vertical signal line is disposed at each pixel pitch. However, when the pixel pitch is minute, the pitch of the pair of connection pads 89 is relatively larger than pixel pitch and it is thus difficult to dispose the wirings. Moreover, since the vertical signal lines are disposed densely, the adjacent coupling capacitance between the vertical signal line is increased and a disadvantage thus occurs. In this embodiment, a layout of the connection wirings and the vertical signal lines is realized to prevent this problems. The ground capacity is preferably 20 fF or less in one vertical signal line, one connection conductor, or one through connection conductor. Further, the adjacent coupling capacitance is preferably about 1/10 or less of the ground capacity, that is, 2 fF or less in order to avoid a streaking phenomenon.

The first connection pad 65 and the second connection pad 63 have an octagonal shape in a plan view and preferably have a regular octagonal shape. The first and second connection pads forming a pair of the connection pads 89 are arranged in a horizontal direction. The plurality of pairs of connection pads 89 are arranged in the horizontal direction in which the routing wirings 40d and 53d of the respective columns are arranged. In this example, four stages of the connection pads 89 are arranged in a vertical direction. That is, the first connection pads 65 and the second connection pads 63 having the regular octagonal shape are alternately arranged in the horizontal and vertical directions in the wiring connection portion between both the semiconductor chip units 22 and 26. Here, a connection pad array 91 is formed such that the plurality of pairs of connection pads 89 is arranged in the horizontal direction and the four stages of the connection pads 89 are arranged in the vertical direction. Hereinafter, the octagonal shape will be defined. In some cases, the octagonal first connection pad 65 integrally has a connection protrusion portion 65a partially protruding in order to supply connection with the routing wiring 40d (see FIG. 32). In this case, since the degree of the protrusion is small in consideration of the entire octagonal shape, the protrusion enters the category of the octagon.

In the connection pad array 91, the first connection pads 65 and the second connection pad 63 are arranged, for example, densely in a plan view. The first connection pads 65 and the second connection pad 63 may partially overlap each other. The connection conductor 68 and the through connection conductor 69 are connected to the first connection pads 65 and the second connection pad 63, respectively, and the first semiconductor chip unit 22 and the second semiconductor chip unit 26 are electrically connected to each other via the connection wiring 67 including the connection conductor 71 connecting both the connection conductor 68 and 69 to each other. The connection conductor 68 and the through connection conductor 69 can be formed so as to have the cross-section of the same octagonal shape as the planar surface of the corresponding connection pads 65 and 63. In this example, the connection wiring 67 is formed as in the third embodiment. That is, the insulation film 77 is buried in the semiconductor-removed region 52, and the connection conductor 65 and the through connection conductor 63 are formed so as to be perforated through the insulation film 77, and the connection conductor 71 is flattened so that the surface of the connection conductor 71 is flush with the surface of the insulation film 77.

In this embodiment, the routing wirings 40d and 53d corresponding to the vertical signal lines of four columns are connected to the first connection pads 65 and the second connection pads 63 of the four stages of the pairs of connection pads 89, respectively. In the first semiconductor chip unit 22, the first connection pad 65 is formed of the first layer metal M1 and each routing wiring 40d is formed of another layer metal, in this example, the fourth layer metal M4. Accordingly, since the routing wiring 40d can be disposed so as to cross below the first connection pad 65, a distance between the adjacent routing wirings 40d can be enlarged. Likewise, in the second semiconductor chip unit 26, the second connection pad 63 is formed of the fourth layer metal M14 and each routing wiring 53d is formed of another layer metal, in this example, the first layer metal M11. Accordingly, since the routing wiring 53d can be disposed so as to cross below the second connection pad 63, a distance between the adjacent routing wirings 53d can be enlarged.

In this embodiment, the layout is realized such that the vertical signal lines of a plurality of columns corresponding to a plurality of stages of the pairs of connection pads 89 in the vertical direction are arranged within one pitch P of the pair of connection pads 89 in the horizontal direction. In FIG. 31, the layout is realized such that the routing wirings 40*d* and 53*d* as the vertical signal lines of four columns corresponding to four stages of the pairs of connection pads 89 in the vertical direction are arranged within one pitch P of the pair of connection pads 89.

In the solid-state imaging device 84 according to the fourth embodiment, the connection pad array 91 is formed such that the planar surface shape of the first connection pad 65 and the second connection pad 63 each have the octagonal shape and the first connection pads 65 and the second connection pads 63 are alternately arranged densely in the horizontal and vertical directions. That is, the dense connection pad array 91 is formed in the wiring connection portion between both semiconductor chip units 22 and 26. Since the routing wirings 40*d* and 53*d* as the vertical signal lines of four columns are connected to the four stages of the pairs of connection pads 89 of the connection pad array 91, the gap between the adjacent routing wirings 40*d* and the gap between the routing wirings 53*d* are enlarged, thereby reducing the adjacent coupling capacitance. Further, since the insulation film 77 is present between the pair of adjacent connection conductors, the adjacent coupling capacitance between the pair of connection pads can be also reduced.

Since the connection conductor 68 is connected to the connection pad 65 formed of the first layer metal M1 in the first semiconductor chip unit 22, the depth of the connection hole is shortened and it is thus easy to process the connection hole. Further, it is easy to bury the connection conductor 68.

In the pair of connection pads 89, the area of the connection pad 63 in the second semiconductor chip unit 26 is larger than the area of the connection pad 65 of the first semiconductor chip unit 22. The positions of the connection hole 64 and the connection pad 65 in the first semiconductor chip unit 22 can match each other accurately with reference to alignment marks formed in the first semiconductor chip unit 22. On the other hand, when the first semiconductor chip unit 22 and the second semiconductor chip unit 26 are bonded to each other, there is a concern that a deviation in the bonding may occur. However, since the area of the connection pad 63 is large, the through connection hole 62 and the connection pad 63 can match each other. Accordingly, as described above, even when the position deviation of the bonding occurs, it is possible to realize the connection between the connection pads 65 and 63 and the connection conductors 64 and the through connection conductors 69.

Since the two columns and four stages of the pairs of connection pads 89 are alternately arranged in the vertical direction so that the direction of the larger connection pads 63 and the smaller connection pads 65, the connection pads 63 and 65 can be densely arranged. Thus, even when the pixel pitch is minute with miniaturization of the pixels, the routing wirings can be routed.

A wiring resistance difference caused due to a difference in the wiring length of the routing wirings of four columns is smaller in the configuration, in which the pairs of first connection pads 65 and second connection pads 63 are arranged in the horizontal direction, than in a configuration described below, in which the pairs of first connection pads 65 and second connection pads 63 are arranged in the vertical direction.

The area and the pitch of the connection pads 65 and 63 are greater than the area and the pitch of the pixels. However, since the wirings 40*d* and 53*d* can be routed by forming the layout of the connection pads 65 and 63, it is possible to provide the solid-state imaging device with high performance.

In the fourth embodiment, the adjacent coupling capacitance can be reduced likewise even when the configurations of the connection wirings 67 of the first and second embodiments are utilized.

In the fourth embodiment, the same advantages as those of the first to third embodiments can be obtained.

6. Fifth Embodiment

Example of Configuration of Solid-State Imaging Device

Figure 36:
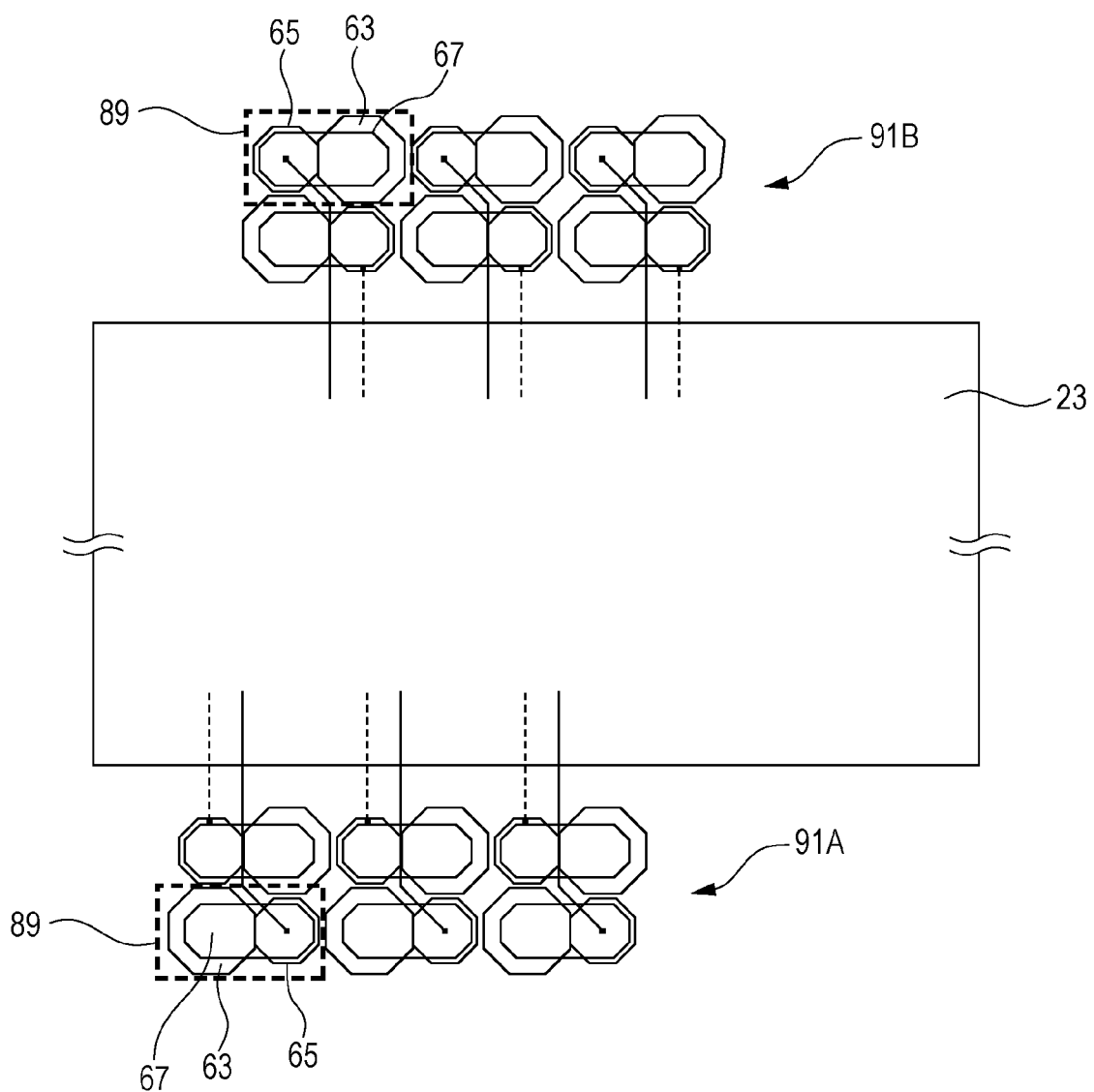
FIG. 36 is a diagram of the overall configuration of the main units of a solid-state imaging device according to a fifth embodiment of the disclosure.

FIG. 36 is a diagram of a semiconductor device according to an embodiment of the disclosure, that is, a MOS solid-state imaging device according to a fifth embodiment. In particular, FIG. 36 shows only the layout of a wiring connection section including the connection pads 65 and 63 electrically connecting the first semiconductor chip unit 22 and the second semiconductor chip unit 26 to each other.

In a solid-state imaging device 93 according to the fifth embodiment, as described above, the two semiconductor chip units 22 and 26 are bonded to each other, the semiconductor section of a part of the first semiconductor chip unit 22 is removed, both the semiconductor chip units 22 and 26 are connected to each other via the connection wiring 67 in the semiconductor-removed region 52. In this embodiment, since several configurations of the above-described embodiments are applied to the other configuration other than the layout of the wiring connection section, the detailed description thereof will not be repeated.

Figure 15B:
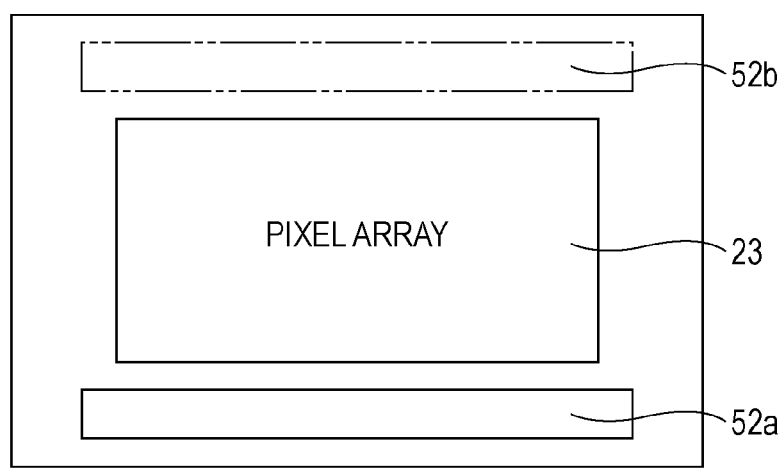

In the fifth embodiment, connection pad arrays 91A and 91B are disposed in both outsides facing each other in the vertical direction with the pixel array 23 interposed therebetween. The routing wirings 40*d* and 53*d* corresponding to the vertical signal lines are alternately connected to the connection pad arrays 91A and 91B. In this embodiment, for example, as in FIG. 31, the pairs of connection pads 89, in which the pair of first connection pad 65 and second connection pad 63 are arranged in the horizontal direction, are arranged in a plurality of stages, in this example, two stages in the horizontal direction. For example, the pairs of connection pads 89 of the connection pad arrays 91A and 91B are densely arranged. The pairs of routing wirings 40*d* and 53*d* are alternately connected to the two stages of the pairs of connection pads 89 of the connection pad arrays 91A and 91B at every two columns. Both the connection pad arrays 91A and 91B are formed in the semiconductor-removed regions 52*a* and 52*b* shown in FIG. 15B, respectively.

In FIG. 36, the planar surface of the connection pads 65 and 63 has the octagonal shape and preferably has the regular octagonal shape. However, since the gap between the wirings can be enlarged, the planar surface of the connection pads may have a rectangular shape or a hexagonal shape (preferably a regular hexagonal shape). In this embodiment, the pairs of connection pads 89 are applicable to a configuration in which pairs of connection pads in which the first connection pads 65 and the second connection pads 63 are instead arranged in the vertical direction, as described below.

In the solid-state imaging device 93 according to the fifth embodiment, the connection pad arrays 91A and 91B are arranged with the pixel array 23 interposed therebetween and the routing wirings corresponding to the vertical signal lines are alternately connected to the two stages of the pairs of connection pads 89 of the connection pad arrays 91A and 91B in every plurality of columns, in this example, every two columns. In this configuration, it is not necessary to forcibly narrow the gap between the adjacent routing wirings 40d and the gap between the adjacent routing wirings 53d. In other words, the gap between the adjacent routing wirings 40d and the gap between the adjacent routing wirings 53d can be enlarged with a sufficient space. Accordingly, the adjacent coupling capacitance can be reduced. Since a difference in the wiring length between the routing wirings is reduced, the wiring resistance difference can be further reduced.

The area and the pitch of the connection pads 65 and 63 are greater than the area and the pitch of the pixels. However, since the wirings 40d and 53d can be routed by forming the layout of the connection pads, it is possible to provide the solid-state imaging device with high performance.

In the fifth embodiment, the adjacent coupling capacitance can be reduced likewise even when the configurations of the connection wirings of the first, second, and third embodiments are utilized.

In the fifth embodiment, the same advantages as those of the first to third embodiments can be obtained.

7. Sixth Embodiment

Example of Configuration of Solid-State Imaging Device

Figure 37:
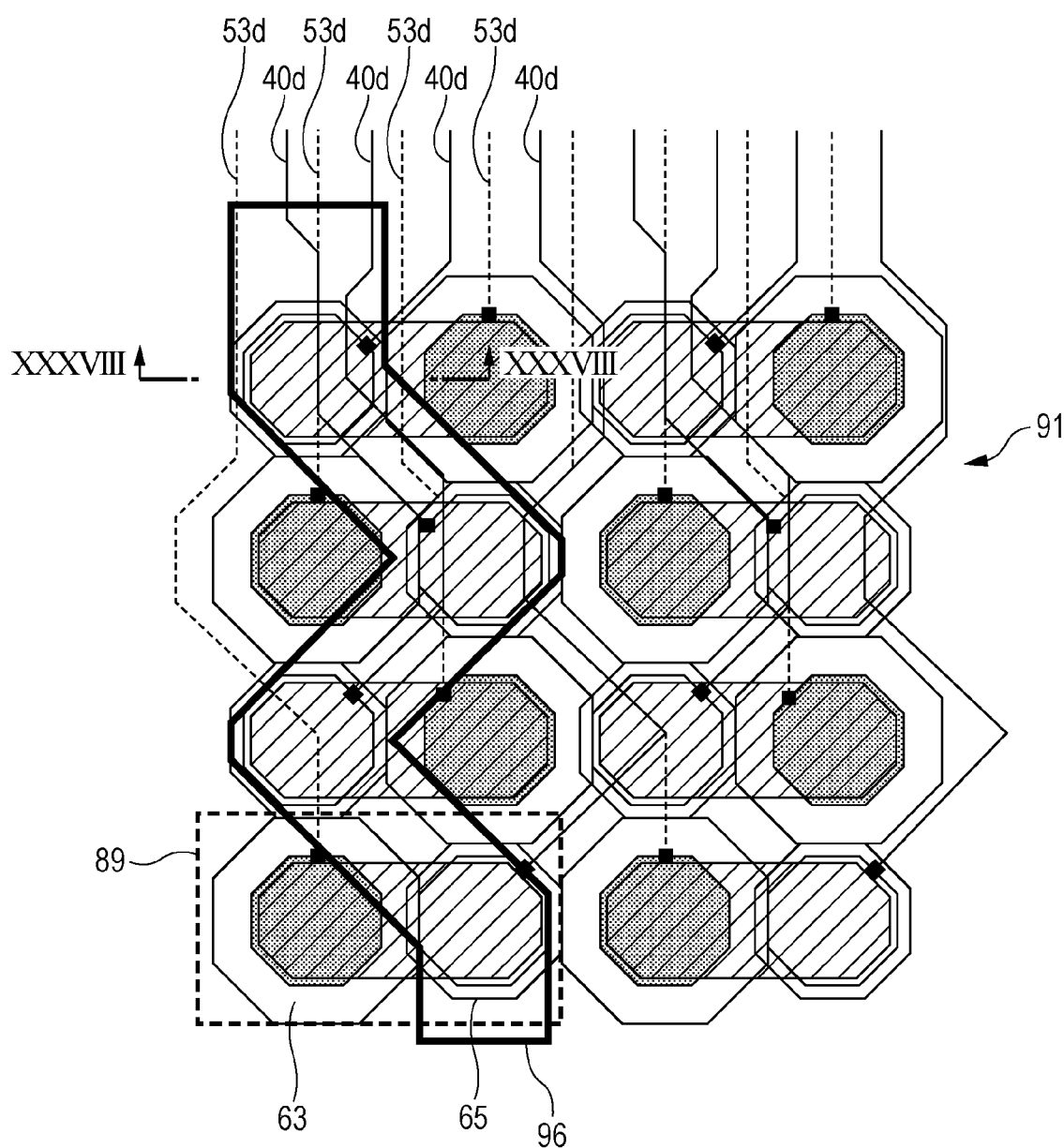
FIG. 37 is a diagram of the overall configuration of the main units of a solid-state imaging device according to a sixth embodiment of the disclosure.
Figure 38:
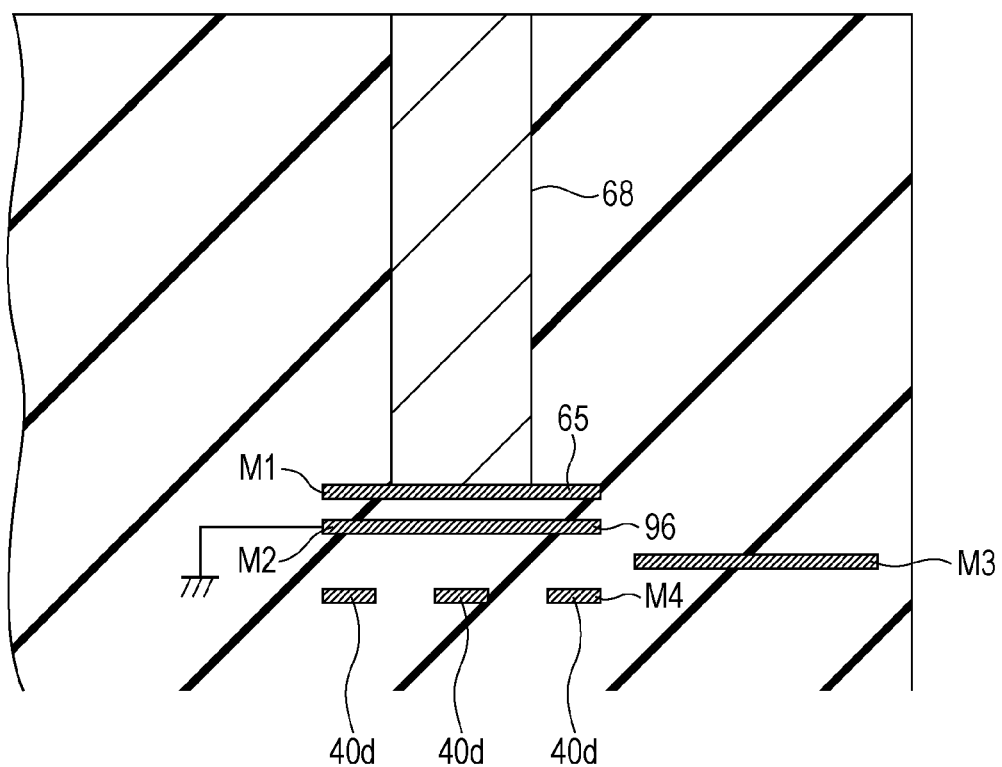
FIG. 38 is a schematic sectional view taken along the line XXXVIII-XXXVIII of FIG. 37.

FIGS. 37 and 38 are diagrams of a semiconductor device, that is, a MOS solid-state imaging device according to a sixth embodiment. In particular, FIGS. 37 and 38 show only the layout of a wiring connection section including a connection pads 65 and 63 electrically connecting the first semiconductor chip units 22 and the second semiconductor chip units 26 to each other.

In a solid-state imaging device 95 according to the sixth embodiment, as described above, the two semiconductor chip units 22 and 26 are bonded to each other, the semiconductor section of a part of the first semiconductor chip unit 22 is removed, both the semiconductor chip units 22 and 26 are connected to each other via the connection wiring 67 in the semiconductor-removed region 52. In this embodiment, since several configurations of the above-described embodiments are applied to the other configuration other than the layout of the wiring connection section, the detailed description thereof will not be repeated.

In the sixth embodiment, for example, the connection pad array 91 is formed such that the first connection pads 65 and the second connection pads 63 with the same regular octagonal shape as that of FIG. 31 are alternately arranged in the vertical and horizontal directions. The routing wirings 40d and 53d of four columns are connected to the four stages of the pairs of connection pads 89 of the connection pad array 91. The first connection pad 65 in the first semiconductor chip unit 22 is formed of the first layer metal M1 and the routing wiring 40d connected to the connection pad 65 is formed of the fourth layer metal M4. The second connection pad 63 in the second semiconductor chip unit 26 is formed of the fourth layer metal M14 and the routing wiring 53d connected to the connection pad 63 is formed of the first layer metal M11.

The routing wirings 40d in the first semiconductor chip unit 22 are disposed so as to cross below another first connection pad 65 which is not connected. Since the area of the connection pad 65 is relatively broad, there is a concern that coupling capacitance may occur between the connection pad 65 and the routing wiring 40d having different potential and crossing the connection pad 65. Accordingly, in this embodiment, a shield wiring 96 formed of a layer metal between the first connection pad 65 and the routing wiring 40d is formed between the first connection pad 65 and the routing wiring 40d. That is, the shield wiring 96 formed of the second or third layer metal, in this example, the second layer metal M2 is formed between the first connection pad 65 and the routing wiring 40d. For example, since three routing wirings 40d cross below the first connection pad 65 in some cases, as shown in FIG. 38, the shield wiring 96 is formed continuously to the four stages of the pairs of connection pads 89 so as to have a width corresponding to the width of the connection pad 65.

The routing wirings 53d in the second semiconductor chip unit 26 are disposed so as to cross below another second connection pad 63 which is not connected. Since the area of the second connection pad 63 is also broad, there is a concern that coupling capacitance may occur between the connection pad 63 and the routing wiring 53d having different potential and crossing the connection pad 63. Accordingly, a shield wiring formed of a layer metal between the second connection pad 63 and the routing wiring 53d is formed between the second connection pad 63 and the routing wiring 53d. That is, the shield wiring formed of the second or third layer metal, in this example, the third layer metal M13 is formed between the second connection pad 63 and the routing wiring 53d. For example, since three routing wirings 53d cross below the second connection pad 63 in some cases, the shield wiring is formed continuously to the four stages of the pairs of connection pads 89 so as to have a width corresponding to the width of the connection pad 63.

In the solid-state imaging device according to the sixth embodiment, the coupling capacitance is prevented from occurring between the connection pad 65 with the different potential and the routing wirings 40d by the shield wiring 96 disposed between the first connection pad 65 and the routing wirings 40d crossing below the connection pad 65. Further, the coupling capacitance is prevented from occurring between the connection pad 63 with the different potential and the routing wirings 53d by the shield wiring disposed between the second connection pad 63 and the routing wirings 53d crossing below the connection pad 63. Accordingly, the solid-state imaging device with the higher performance can be realized.

In the sixth embodiment, the advantage of reducing the parasitic capacitance can be obtained, as described in the first to third embodiment.

In the sixth embodiment, the advantage obtained from the shield wiring 96 can be obtained irrespective of the shape of the planar surface of the connection pad 65 and the layout of the connection pad 65.

8. Seventh Embodiment

Example of Configuration of Solid-State Imaging Device

Figure 39:
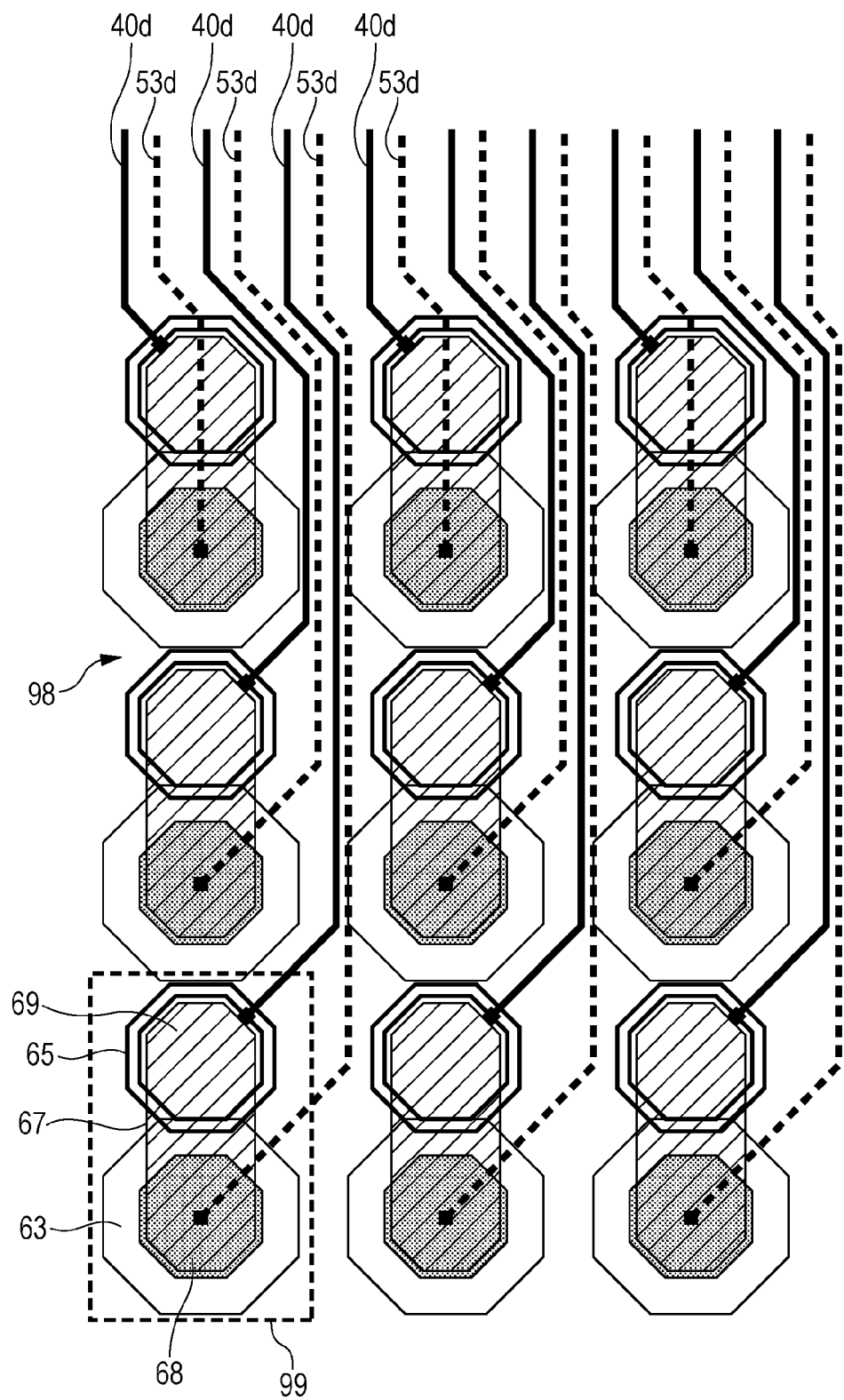
FIG. 39 is a diagram of the overall configuration of the main units of a solid-state imaging device according to a seventh embodiment of the disclosure.

FIG. 39 is a diagram of a semiconductor device according to an embodiment of the disclosure, that is, a MOS solid-state imaging device according to a seventh embodiment. In particular, FIG. 39 shows only the layout of a wiring connection section including the connection pads 65 and 63 electrically connecting the first semiconductor chip unit 22 and the second semiconductor chip unit 26 to each other.

In a solid-state imaging device 97 according to the seventh embodiment, as described above, the two semiconductor chip units 22 and 26 are bonded to each other, the semiconductor section of a part of the first semiconductor chip unit 22 is removed, both the semiconductor chip units 22 and 26 are connected to each other via the connection wiring 67 in the semiconductor-removed region 52. In this embodiment, since several configurations of the above-described embodiments are applied to the other configuration other than the layout of the wiring connection section, the detailed description thereof will not be repeated.

In the seventh embodiment, the pairs of first connection pads 65 and second connection pads 63 are arranged in a vertical direction (so-called longitudinal direction) in which the routing wirings 40d and 53d corresponding to the vertical signal lines extend. A connection pad array 98 is formed such that the plurality of pairs of connection pads 99 is arranged in the horizontal direction in which the routing wirings 40d and 53d are arranged and is arranged in a plurality of stages, in this example, three stages in the vertical direction.

For example, the first connection pads 65 and the second connection pads 63 have an octagonal shape and preferably have a regular octagonal shape in a plan view, as described in the fourth embodiment. The first connection pad 65 and the second connection pad 63 are electrically connected to each other via the connection wiring 67 including the connection conductor 68, the through connection conductor 69, and the connection conductor 71.

In the first semiconductor chip unit 22, the wirings 40 of the multi-layer wiring layer 41 can be formed of, a plurality of layers, for example, four-layer metals M1 to M4. At this time, the first connection pad 65 is preferably formed of the first layer metal M1, the routing wiring 40d connected to the connection pad 65 is preferably formed of the fourth layer metal M4. The embodiment of the disclosure is not limited thereto, but the first connection pad 65 and the routing wiring 40d may be any layer metal.

In the second semiconductor chip unit 26, the wirings 53 of the multi-layer wiring layer 55 can be formed of, a plurality of layers, for example, four-layer metals M11 to M14. At this time, the second connection pad 63 is preferably formed of the fourth layer metal M14, the routing wiring 53d connected to the connection pad 63 is preferably formed of the first layer metal M11. The embodiment of the disclosure is not limited thereto, but the second connection pad 63 and the routing wiring 53d may be any layer metal. The routing wirings 40d and 53d are connected every three columns to the three stages of the pairs of connection pads 99 of the connection pad array 98.

In the solid-state imaging device 97 according to the seventh embodiment, the wirings 40d and 53d can be routed by forming the connection pad array 98 in which the pairs of connection pads 99, in which the first connection pads 65 and the second connection pads 63 are arranged in the vertical direction, are arranged in the plurality of stages. In particular, since the wirings 40d and 53d can be routed even in the connection pads 65 and 63 having the area greater than the pixel area, it is possible to provide the solid-state imaging device with high performance. When the routing wirings 40d and 53d are disposed so as to cross the connection pads 65 and 63, respectively, the gap between the adjacent routing wirings can be enlarged with a sufficient space. Therefore, it is possible to reduce the adjacent coupling capacitance occurring in the gap between the routing wirings.

In the seventh embodiment, the adjacent coupling capacitance can be reduced likewise even when the configurations of the connection wirings of the first, second, and third embodiments are utilized.

In the seventh embodiment, the same advantages as those of the first to third embodiments can be obtained.

In the above-described example, the planar surface of the connection pads 65 and 63 has the octagonal shape, but may have a polygonal shape such as a rectangular shape or a hexagonal shape (preferably a regular hexagonal shape) or a circular shape. The cross-sectional shape of the connection conductor 68 and the through connection conductor 69 may be the same as the shape of the planar surface of the connection pads 65 and 63. The shape of the planar surface of the connection pads 65 and 63 and the cross-sectional shape of the connection conductor 68 and the through connection conductor 69 may be different from each other.

In the solid-state imaging device according to the above-described embodiments, the signal charges are set to electrons, the first conductive type is set to the p-type, and the second conductive type is set to the n-type. The signal charges may be set holes in the solid-state imaging device. In this case, the conductive types of the semiconductor substrate and the semiconductor well region or the semiconductor region are reversely set, and thus the n type is set to the first conductive type and the p type is set to the second conductive type. The n-channel transistor and the p-channel transistor can be also applied to the MOS transistors in the logic circuit.

9. Eighth Embodiment

Example of Configuration of Semiconductor Device

Figure 40:
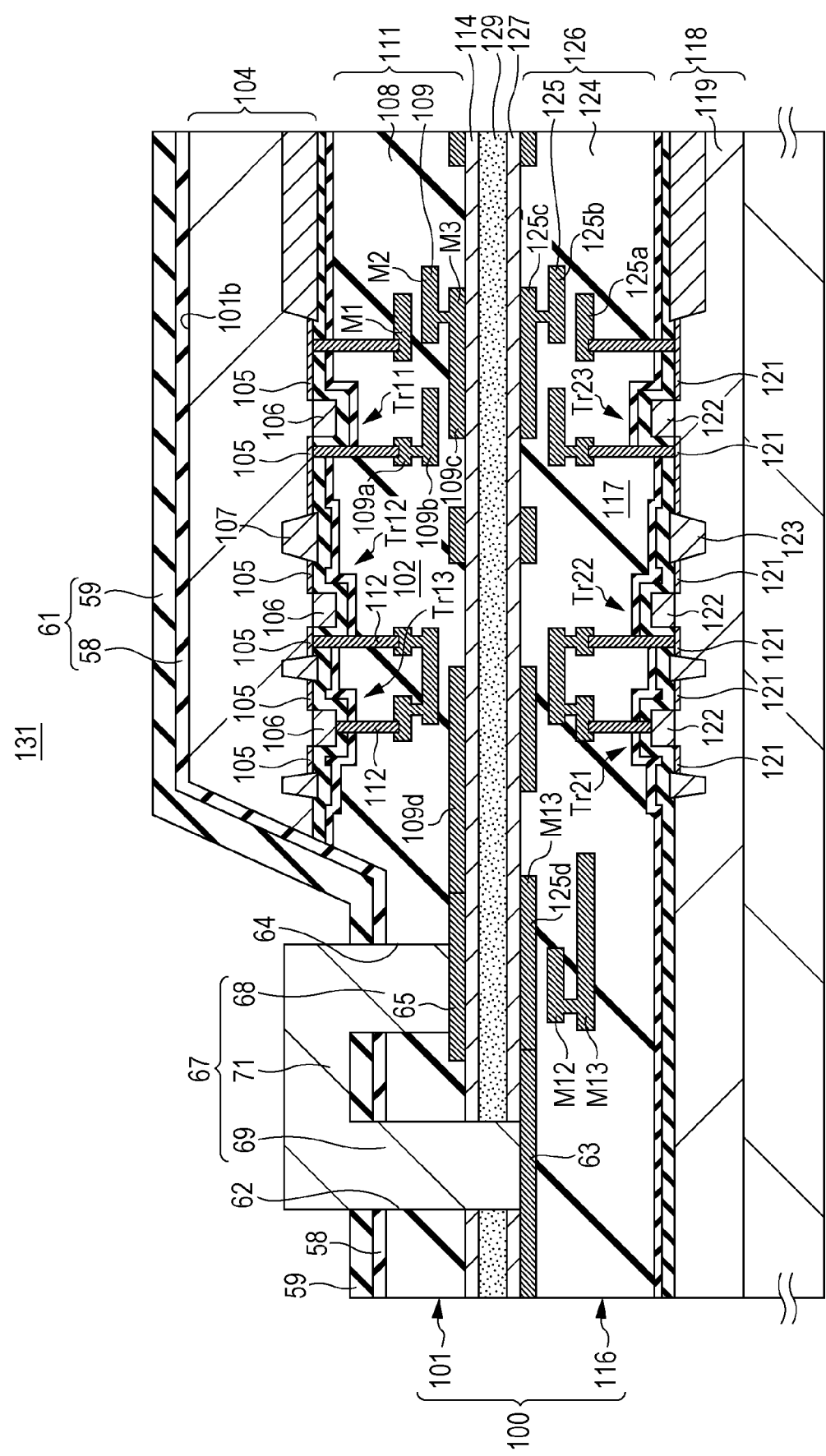
FIG. 40 is a diagram of the overall configuration of a semiconductor device according to an eighth embodiment of the disclosure.

FIG. 40 is a diagram of a semiconductor device according to an eighth embodiment of the disclosure. A semiconductor device 131 according to the eighth embodiment includes a stacked semiconductor chip 100 in which a first semiconductor chip unit 101 and a second semiconductor chip unit 116 are bonded to each other. A first semiconductor integrated circuit and a multi-layer wiring layer are formed in the first semiconductor chip unit 101. A second semiconductor integrated circuit and a multi-layer wiring layer are formed in the second semiconductor chip unit 116. The first semiconductor chip unit 101 and the second semiconductor chip unit 116 are bonded to each other so that the multi-layer wiring layers face each other. The semiconductor chip units are bonded by an adhesive layer 129 via protective films 114 and 127 in this example. Otherwise, the semiconductor chip units may be bonded to each other by plasma jointing.

In this embodiment, a semiconductor section of a part of the first semiconductor chip unit 101 is completely removed to form the semiconductor-removed region 52. In the semiconductor-removed region 52, a connection wiring 67 is formed to connect the first semiconductor chip unit 101 to the second semiconductor chip unit 116. The semiconductor-removed region 52 is a whole region which includes a part where each connection wiring 67 of the semiconductor integrated circuit is formed and is formed, for example, in the peripheral portion of the first semiconductor chip unit 101.

In the first semiconductor chip unit 101, the first semiconductor integrated circuit, in this example, the logic circuit 102 is formed in the thinned first semiconductor substrate 103. That is, a plurality of MOS transistors Tr11, Tr12, and Tr13 are formed in a semiconductor well region 104 formed in the semiconductor substrate (for example, a silicon substrate) 103. The MOS transistors Tr11 to Tr13 each include a pair of source/drain regions 105 and a gate electrode 106 formed with a gate insulation film interposed therebetween. The MOS transistors Tr11 to Tr13 are isolated by an element isolation region 107.

The representative MOS transistors Tr11 to Tr13 are illustrated. The logic circuit 102 can be formed by CMOS transistors. Therefore, the plurality of MOS transistors can be configured as n-channel MOS transistors or p-channel MOS transistors. Accordingly, when the n-channel MOS transistors are formed, the source/drain region is formed in the p-type semiconductor well region. When the p-channel MOS transistors are formed, the p-type source/drain regions is formed in the n-type semiconductor well region.

A multi-layer wiring layer 111, in which a plurality of layers, in this example, wirings 109 formed of three-layer metals are stacked with an inter-layer insulation film 108 interposed therebetween, is formed on the semiconductor substrate 103. The wirings 109 can be formed of, for example, Cu wirings. The MOS transistors Tr11 to Tr13 are connected to each other via the first layer wiring 109 and connection conductors 112. Further, the three-layered wirings 109 are connected to each other via connection conductors.

In the second semiconductor chip unit 116, the second semiconductor integrated circuit, in this example, the logic circuit 117 is formed in the second semiconductor substrate 118. That is, a plurality of MOS transistors Tr21, Tr22, and Tr23 are formed in a semiconductor well region 119 formed in the semiconductor substrate (for example, a silicon substrate) 118. The MOS transistors Tr21 to Tr23 each include a pair of source/drain regions 121 and a gate electrode 122 formed with a gate insulation film interposed therebetween. The MOS transistors Tr21 to Tr23 are isolated by an element isolation region 123.

The representative MOS transistors Tr21 to Tr23 are illustrated. The logic circuit 117 can be formed by CMOS transistors. Therefore, the plurality of MOS transistors can be configured as n-channel MOS transistors or p-channel MOS transistors. Accordingly, when the n-channel MOS transistors are formed, the source/drain region is formed in the p-type semiconductor well region. When the p-channel MOS transistors are formed, the p-type source/drain regions is formed in the n-type semiconductor well region.

A multi-layer wiring layer 126, in which a plurality of layers, in this example, wirings 125 formed of three-layer metals are stacked with an inter-layer insulation film 124 interposed therebetween, is formed on the semiconductor substrate 118. The wirings 125 can be formed of, for example, Cu wirings. The MOS transistors Tr21 to Tr23 are connected to each other via the first layer wiring 125 and connection conductors 120. Further, the three-layered wirings 125 are connected to each other via connection conductors 120. The semiconductor substrate 118 of the second chip unit 116 also serves as a supporting substrate of the thinned first semiconductor chip unit 101.

For example, as the first semiconductor integrated circuit, a semiconductor memory circuit can be used instead of the logic circuit 102. In this case, the logic circuit 117 serving as the second semiconductor integrated circuit is provided to perform signal processing of the semiconductor memory circuit.

In the semiconductor-removed region 52, the entire first semiconductor substrate 118 is removed by, for example, etching. A stacked insulation film 61 formed by, for example, a silicon oxide ($SiO_2$) film 58 and a silicon nitride (SiN) film 59 is formed by extending from the bottom surface and the side surface of the semiconductor-removed region 52 to the surface of the semiconductor substrate 118. The stacked insulation film 61 protects the surface of the semiconductor substrate 118 and the semiconductor substrate 118 exposed toward the side surface the semiconductor-removed region 52.

In the semiconductor-removed region 52, a connection hole 64 is formed so as to extend from the silicon nitride film 59 to the first connection pad 65 electrically connected to a wiring of the multi-layer wiring layer 111 in the first semiconductor chip unit 101, in this example, the routing wiring 109d formed of the third layer metal. Further, a through connection hole 62 is formed so as to be perforated through the first semiconductor chip unit 101 and to reach the second connection pad 63 electrically connected to a wiring of the multi-layer wiring layer 126 in the second semiconductor chip unit 116, in this example, a routing wiring 125d formed of the third layer metal.

The connection wiring 67 includes the connection conductor 68 buried in the connection holes 64 and 62 and electrically connected to the first connection pad 65, the through connection conductor 69 electrically connected to the second connection pad 63, and the connection conductor 71 electrically connecting the upper ends of the connection conductor 68 and the through connection conductor 69. The connection conductor 71 exposed to the outside of each connection wiring 67 serves as an electrode pad connected to an external wiring via the bonding wire.

The semiconductor device according to the eighth embodiment can be manufactured using the manufacturing method according to the above-described first embodiment. However, the pixel array and the control circuit of the first semiconductor chip unit according to the first embodiment are substituted by the first semiconductor integrated circuit and the logic circuit of the second semiconductor chip unit is substituted by the second semiconductor integrated circuit.

In the semiconductor device according to the eighth embodiment, the first and second semiconductor chip units 101 and 116 are bonded to each other, and thus the optimum processing techniques can be used in the formation of the first and second semiconductor integrated circuits. Accordingly, since the first and second semiconductor integrated circuits can exert the performance, it is possible to provide the semiconductor device with high performance.

In this embodiment, particularly, a part of the first semiconductor chip unit 101, that is, the semiconductor section of the region where the connection conductor 68 and the through connection conductor 69 are formed is completely removed. Since the connection conductor 68 and the through connection conductor 69 are formed in the semiconductor-removed region 52, the parasitic capacitance is reduced between the semiconductor substrate 104 and the connection conductor 68 and the through connection conductor 69, thereby providing the solid-state imaging device with more performance.

In the eighth embodiment, both the half-finished first semiconductor substrate 104 and the half-finished second semiconductor substrate 118 are bonded to each other before the formation of chips, and then the first semiconductor substrate 104 is thinned. That is, the second semiconductor substrate 118 is used as the supporting substrate of the first semiconductor substrate 104 when the first semiconductor substrate 104 is thinned. Thus, the members can be saved and the manufacturing steps can be reduced. In this embodiment, since the first semiconductor substrate 104 is thinned and the through connection holes 62 and the connection holes 64 are formed in the semiconductor-removed region 52 where the semiconductor section is removed, the aspect ratio of the holes is reduced and the connection holes 62 and 64 can be formed with high precision. Accordingly, the solid-state imaging apparatus with high performance can be manufactured with high precision.

10. Ninth Embodiment

Example of Configuration of Semiconductor Device

Figure 41:
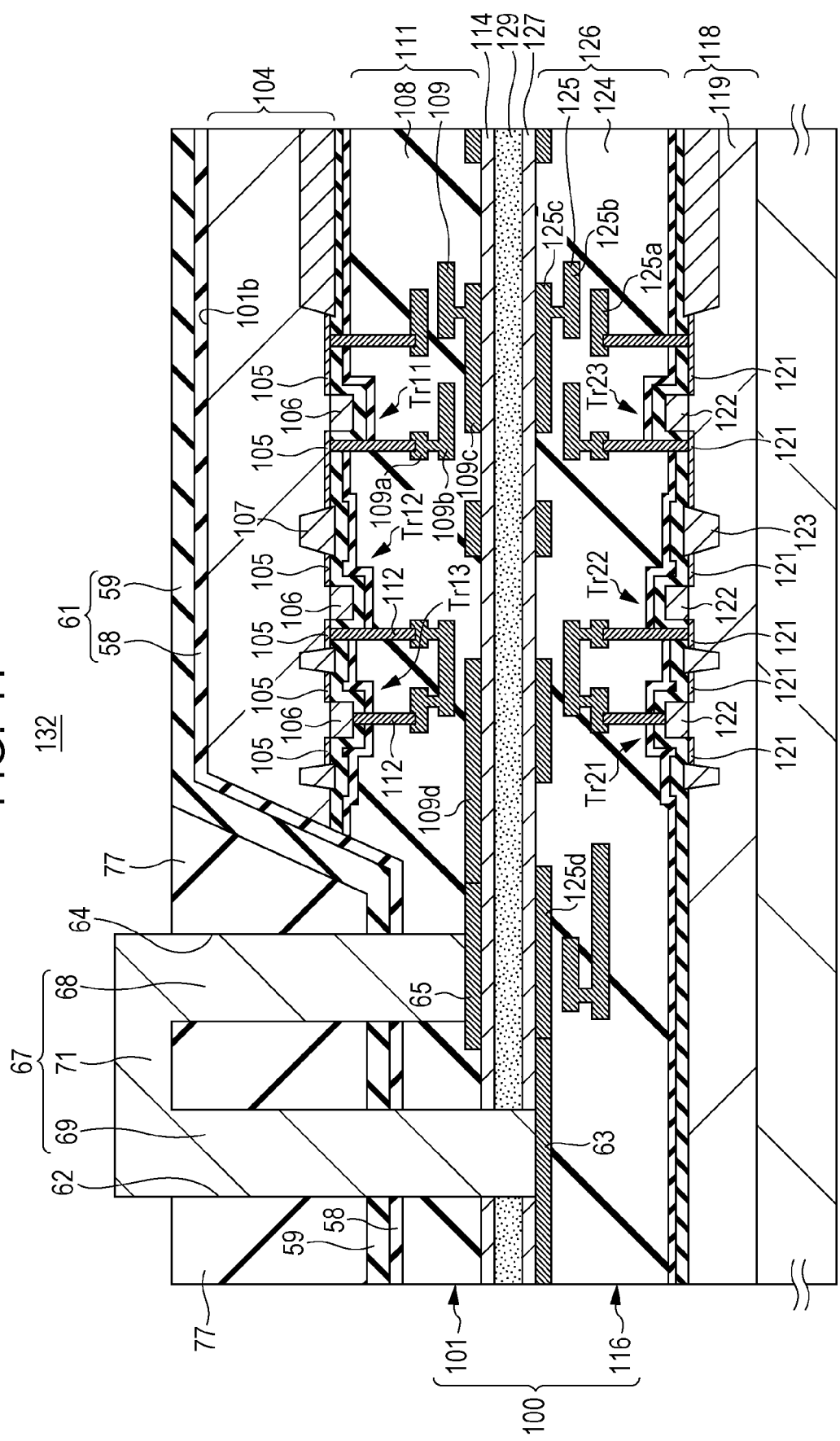
FIG. 41 is a diagram of the overall configuration of a semiconductor device according to a ninth embodiment of the disclosure.

FIG. 41 is a diagram of a semiconductor device according to a ninth embodiment of the disclosure. A semiconductor device 132 according to the ninth embodiment includes the stacked semiconductor chip 100 in which the first semiconductor chip unit 101 and the second semiconductor chip unit 116 are bonded to each other. A first semiconductor integrated circuit and a multi-layer wiring layer are formed in the first semiconductor chip unit 101. A second semiconductor integrated circuit and a multi-layer wiring layer are formed in the second semiconductor chip unit 116. The first semiconductor chip unit 101 and the second semiconductor chip unit 116 are bonded to each other so that the multi-layer wiring layers face each other.

In this embodiment, the semiconductor-removed region 52 where the semiconductor section of a part of the first semiconductor chip unit 101 is completely removed is formed and the stacked insulation film 61 extending from the inner surface of the semiconductor-removed region 52 to the rear surface of the semiconductor substrate 103 is formed. The flattened insulation film 77 flush with the surface of the stacked insulation film 61 on the semiconductor substrate 103 is formed in semiconductor-removed region 52. The etching rate of the flattened insulation film 77 is different from that of the silicon nitride film 59 on the surface of the stacked insulation film 61. For example, the flattened insulation film 77 is formed as an insulation film such as a silicon oxide film.

The connection holes 64 and the through connection holes 62 are formed so as to be perforated through the insulation film 77 and reach the first connection pad 65 and the second connection pad 63. The connection wiring 67 connecting the first connection pad 65 and the second connection pad 63 is formed through both the connection holes 64 and 62. The connection wiring 67 includes the connection conductor 68 electrically connected to the first connection pad 65, the through connection conductor 69 electrically connected to the second connection pad 63, and the connection conductor 71 electrically connecting the upper ends of the connection conductor 68 and the through connection conductor 69. The connection conductor 68 and the through connection conductor 69 are formed so as to be buried in the connection holes 64 and 62, respectively. The connection conductor 68, the through connection conductor 69, and the connection conductor 71 are integrally formed of metal. The connection conductor 71 is formed on the flattened insulation film 77.

The other configuration is the same as the configuration described in the eighth embodiment. The same reference numerals are given to constituent elements corresponding to those of FIG. 40 and the description thereof will not be repeated.

The semiconductor device 132 according to the ninth embodiment can be manufactured using the manufacturing method according to the above-described second embodiment. However, the pixel array and the control circuit of the first semiconductor chip unit according to the second embodiment are substituted by the first semiconductor integrated circuit and the logic circuit of the second semiconductor chip unit is substituted by the second semiconductor integrated circuit.

According to the solid-state imaging device 132 according to the ninth embodiment, a part of the first semiconductor chip unit 101, that is, the semiconductor section of the region where the connection wiring 67 is formed is completely removed and the insulation film 77 is buried in the removed semiconductor-removed region 52. Since the connection conductor 68 and the through connection conductor 69 are buried in the connection hole 64 and the through connection hole 62 formed in the insulation film 77, the connection conductors 68 and 69 are distant from the side surface of the semiconductor substrate 103 due to the insulation film 77. Therefore, the parasitic capacitance is reduced between the semiconductor substrate 103 and the connection conductors 68 and 69. Further, the inside of the semiconductor-removed region 52 is buried in the insulation film 77, the surface of the semiconductor substrate 103 facing the side wall of the semiconductor-removed region 52 can be reliably protected mechanically in cooperation with the stacked insulation film 61. Accordingly, the solid-state imaging device can be provided with more performed.

In this embodiment, since the first semiconductor substrate 103 is thinned and the through connection holes 62 and the connection holes 64 are formed, the aspect ratio of the holes is reduced and the connection holes 62 and 64 can be formed with high precision. Accordingly, the solid-state imaging apparatus with high performance can be manufactured with high precision.

Although the other description will not be made, the same advantages as those of the eighth embodiment can be obtained.

11. Tenth Embodiment

Example of Configuration of Semiconductor Device

Figure 42:
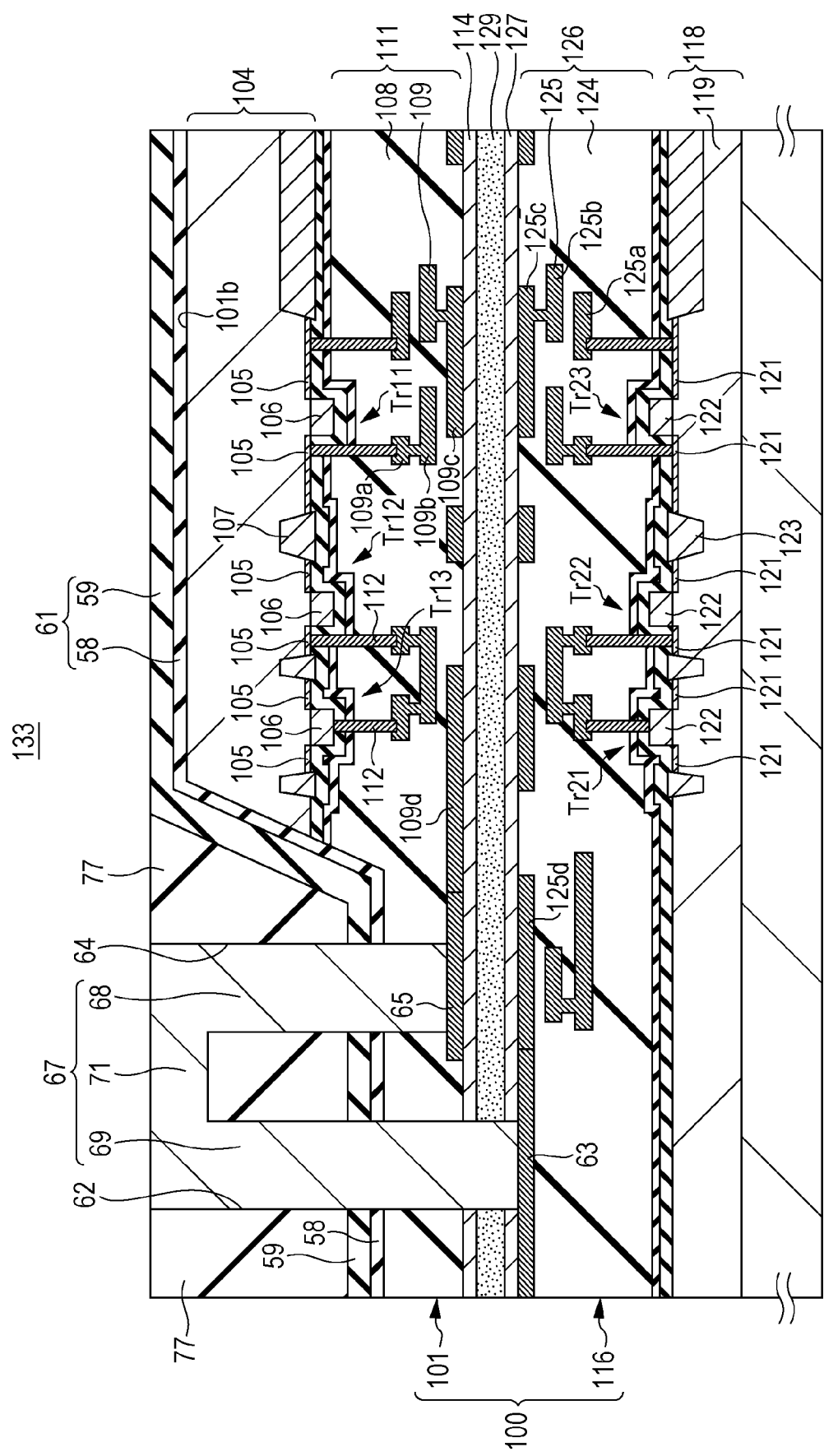
FIG. 42 is a diagram of the overall configuration of a semiconductor device according to a tenth embodiment of the disclosure.

FIG. 42 is a diagram of a semiconductor device according to a tenth embodiment of the disclosure. A semiconductor device 133 according to the tenth embodiment includes the stacked semiconductor chip 100 in which the first semiconductor chip unit 101 and the second semiconductor chip unit 116 are bonded to each other. A first semiconductor integrated circuit and a multi-layer wiring layer are formed in the first semiconductor chip unit 101. A second semiconductor integrated circuit and a multi-layer wiring layer are formed in the second semiconductor chip unit 116. The first semiconductor chip unit 101 and the second semiconductor chip unit 116 are bonded to each other so that the multi-layer wiring layers face each other.

In this embodiment, the semiconductor-removed region 52 where the semiconductor section of a part of the first semiconductor chip unit 101 is completely removed is formed and the stacked insulation film 61 extending from the inner surface of the semiconductor-removed region 52 to the rear surface of the semiconductor substrate 103 is formed. The flattened insulation film 77 flush with the surface of the stacked insulation film 61 on the semiconductor substrate 103 is formed in semiconductor-removed region 52 and the concave portion 81 with a certain depth from the surface is formed in a portion corresponding to the connection wiring 67 of the insulation film 77.

The connection holes 64 and the through connection holes 62 are formed so as to reach the first connection pad 65 and the second connection pad 63 through the insulation film 77 below the concave portion 81. The connection wiring 67 connecting the first connection pad 65 and the second connection pad 63 is formed through both the connection holes 64 and 62. The connection wiring 67 includes the connection conductor 68 electrically connected to the first connection pad 65, the through connection conductor 69 electrically connected to the second connection pad 63, and the connection conductor 71 electrically connecting the upper ends of both the connection conductor 68 and the through connection conductor 69. The connection conductor 68 and the through connection conductor 69 are formed so as to be buried in the connection holes 64 and 62, respectively. The connection conductor 68, the through connection conductor 69, and the connection conductor 71 are integrally formed of metal. The connection conductor 71 is buried in the concave portion 81 of the insulation film 77 and the surface of the connection conductor 71 is formed so as to be flush with the surface of the flattened insulation film 77.

The other configuration is the same as the configuration described in the eighth embodiment. The same reference numerals are given to constituent elements corresponding to those of FIG. 40 and the description thereof will not be repeated.

The semiconductor device 133 according to the tenth embodiment can be manufactured using the manufacturing method according to the above-described third embodiment. However, the pixel array and the control circuit of the first semiconductor chip unit according to the third embodiment are substituted by the first semiconductor integrated circuit and the logic circuit of the second semiconductor chip unit is substituted by the second semiconductor integrated circuit.

According to the solid-state imaging device 133 according to the tenth embodiment, a part of the first semiconductor chip unit 101, that is, the semiconductor section of the region where the connection wiring 67 is formed is completely removed and the insulation film 77 is buried in the removed semiconductor-removed region 52. The concave portion 81 is formed in the insulation film 77, the connection conductor 68 and the through connection conductor 69 are formed through the connection hole 64 and the through connection hole 62 formed in the insulation film 77 below the concave portion 81, and the connection wiring 67 is formed. Accordingly, since the connection conductors 68 and 69 are distant from the side surface of the semiconductor substrate 103 due to the insulation film 77, the parasitic capacitance is reduced between the semiconductor substrate 103 and the connection conductors 68 and 69. Further, the inside of the semiconductor-removed region 52 is buried in the insulation film 77, the surface of the semiconductor substrate 103 facing the side wall of the semiconductor-removed region 52 can be reliably protected mechanically in cooperation with the stacked insulation film 61. Accordingly, the solid-state imaging device can be provided with more performed.

Since the connection conductor 71 is buried in the concave portion 81 of the insulation film 77 and the connection conductor 71 is flattened so as to be flush with the surface of the insulation film 77, the solid-state imaging apparatus with less surface step difference can be formed.

In the tenth embodiment, the first semiconductor substrate 103 is thinned, the concave portion 81 is further formed in the insulation film 77, and the through connection holes 62 and the connection holes 64 are formed. Therefore, the aspect ratio of the holes is reduced and the connection hole 64 and the through connection hole 62 can be formed with high precision. Accordingly, the solid-state imaging apparatus with high performance can be manufactured with high precision.

Although the other description will not be made, the same advantages as those of the eighth embodiment can be obtained.

According to the above-described eighth to tenth embodiments, the two semiconductor chip units are bonded to each other. Further, the solid-state imaging device according to embodiments of the disclosure, three or more semiconductor chip units may be bonded to each other. Even in three or more semiconductor chip units bonded to each other, the above-described configuration can be applied in which the semiconductor section is completely removed in the connection portion between the first semiconductor chip unit including the first semiconductor integrated circuit and the second semiconductor chip unit including the second semiconductor integrated circuit. As the semiconductor integrated circuit, a memory circuit or another electric circuit other than the logic circuit can be applied.

As described above, the layouts of the connection pad arrays 91, 91A, 91B, and 98 described in the fourth to seventh embodiments are applied to the solid-state imaging device in which the semiconductor section is completed removed in the region where the connection wiring 67 described in the first to third embodiments is formed. The layouts of the connection pad arrays 91, 91A, 91B, and 98 are applicable to the semiconductor device according to the eighth to tenth embodiments. The layouts of the connection pad arrays 91, 91A, 91B, and 98 are not limited thereto, but may be applied to a case where the semiconductor near the connection wiring is not removed when another wafer or chip are boned and connection wiring is formed. For example, the layouts of the connection pad arrays 91, 91A, 91B, and 98 are applicable to a solid-state imaging device or the semiconductor integrated circuit (semiconductor device) in which the semiconductor section is not removed and a connection wiring is formed by perforating the semiconductor substrate and burying the connection conductor 68 and the through connection conductor 69 with the insulation film interposed therebetween.

Figure 43:
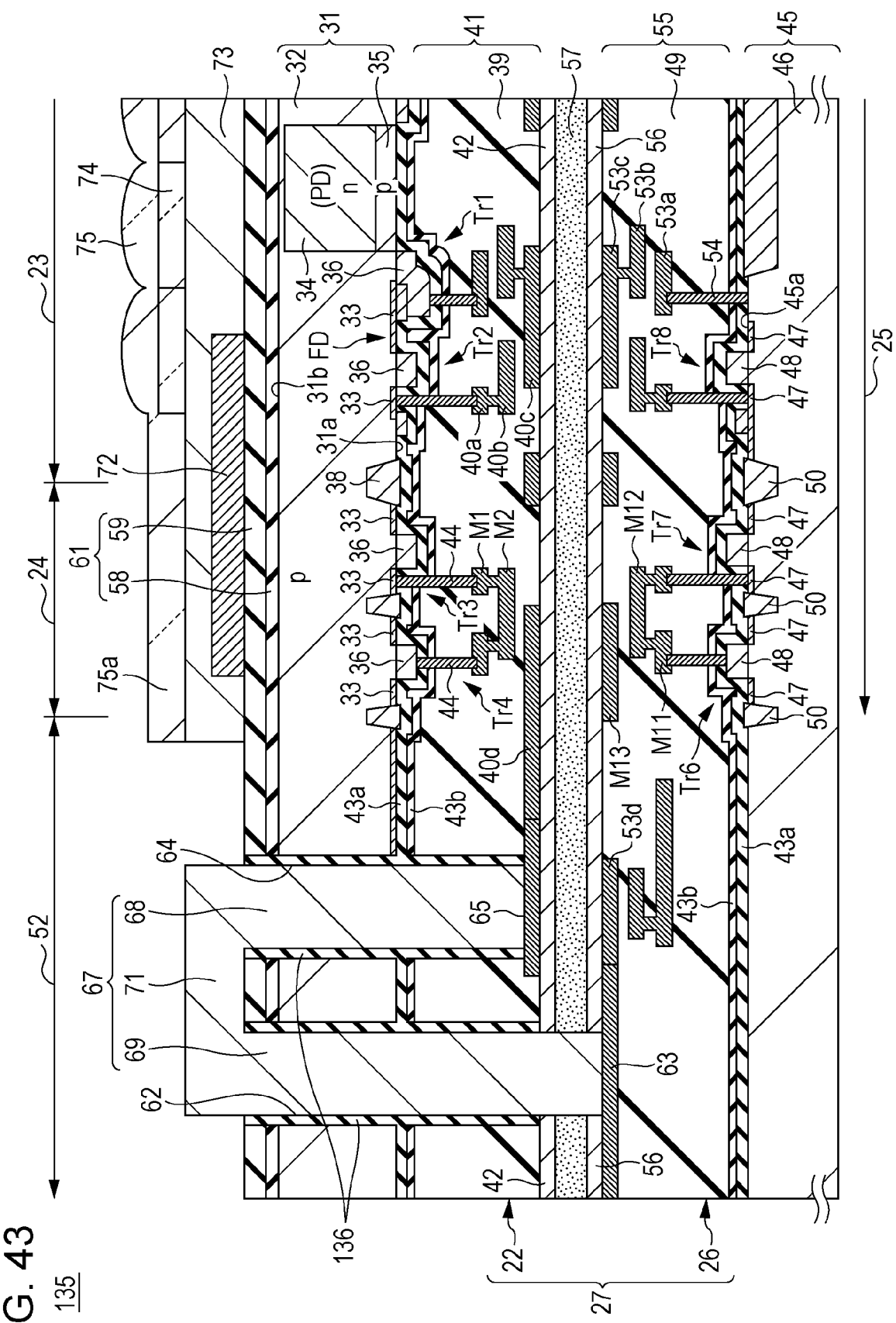
FIG. 43 is a diagram of the overall configuration of another example of a solid-state imaging device to which a layout of the connection pad is applied according to an embodiment of the disclosure.
Figure 44:
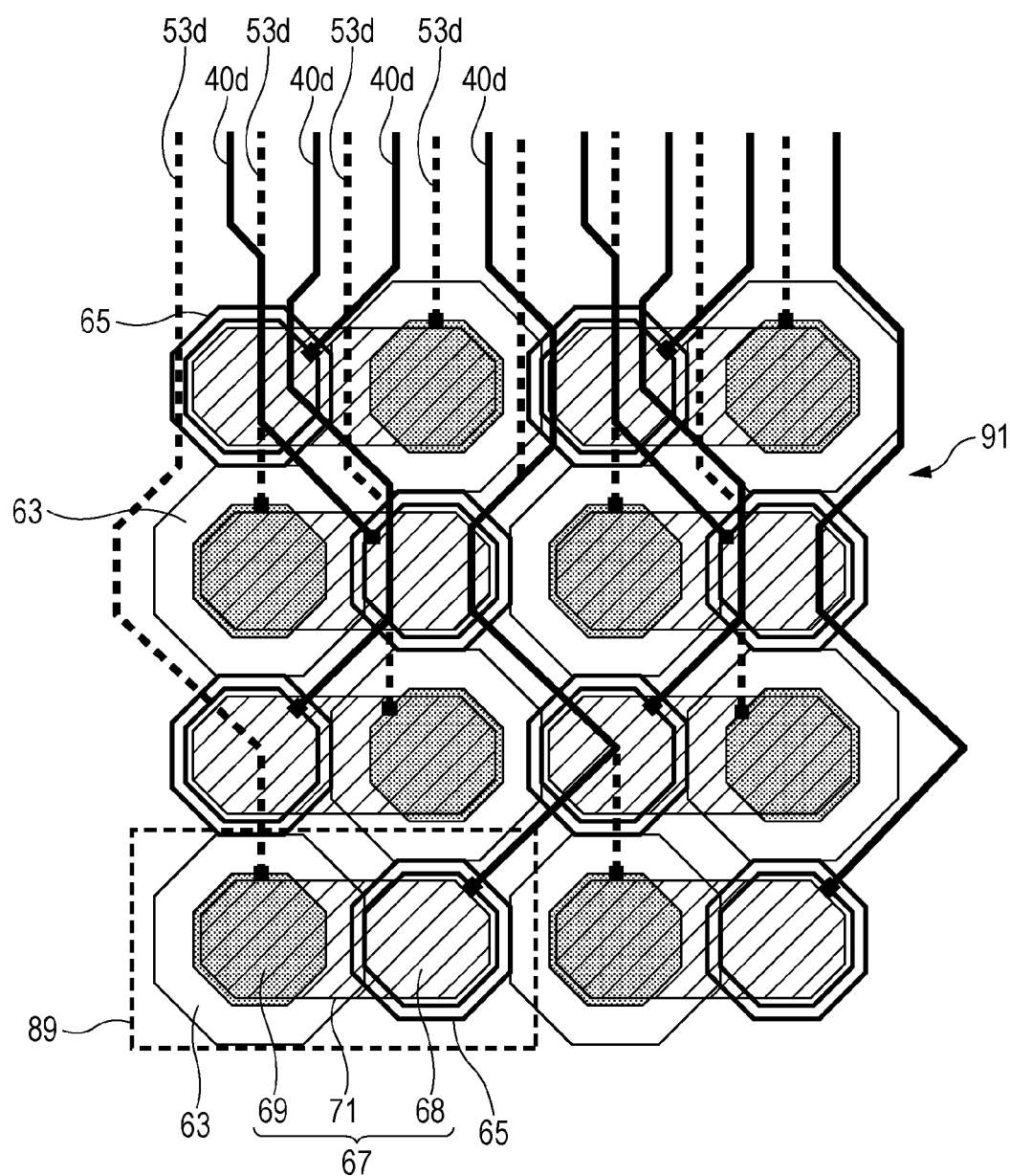
FIG. 44 is a schematic plan view of an example of the layout of the connection pad in the solid-state imaging device of FIG. 43.

FIGS. 43 and 44 are diagram of a solid-state imaging device in which the connection wiring is formed without removal of the semiconductor section and to which the connection pad layout is applied. A solid-state imaging device 135 according to this embodiment has a configuration in which the semiconductor section is not removed in the region where the connection wiring 67 is formed in the above-described second embodiment shown in FIG. 16. In this embodiment, the connection hole 64 perforated through the first semiconductor substrate 31 and reaching the first connection pad 65 is formed. Further, the through connection hole 62 perforated through first semiconductor chip 22 including the semiconductor substrate 31 and reaching the second connection pad 63 is formed. An insulation film 136 for insulation from the semiconductor substrate 31 is formed in the inner surface of each of the connection hole 64 and the through connection hole 62. A connection wiring is formed such that the connection conductor 68 and the through connection conductor 69 are buried in the connection hole 64 and the through connection hole 62 so as to be connected to the first connection pad 65 and the second connection pad 63, respectively, and are connected to each other by the connection conductor 71. The other configuration is the same as that of the second embodiment. The same reference numerals are given to the same constituent elements as those shown in FIG. 16, and the description thereof will not be repeated.

On the other hand, as shown in FIG. 44, in the solid-state imaging device 135 according to this embodiment, the layout of the wiring connection portion including the connection pads 63 and 65 has the same configuration as that shown in FIG. 31. That is, the connection pad array 91 is configured such that the pairs of connection pads 89 formed by the octagonal connection pads 63 and 65 are arranged densely in four stages. The other detailed configuration is the same as that described with reference to FIG. 31. The same reference numerals are given to the same constituent elements as those shown in FIG. 31, and the description thereof will not be repeated.

In the solid-state imaging device 135, as described with reference to FIG. 31, the gap between the adjacent routing wirings 40d and the gap between the routing wirings 53d are enlarged, thereby reducing the adjacent coupling capacitance.

Figure 45:
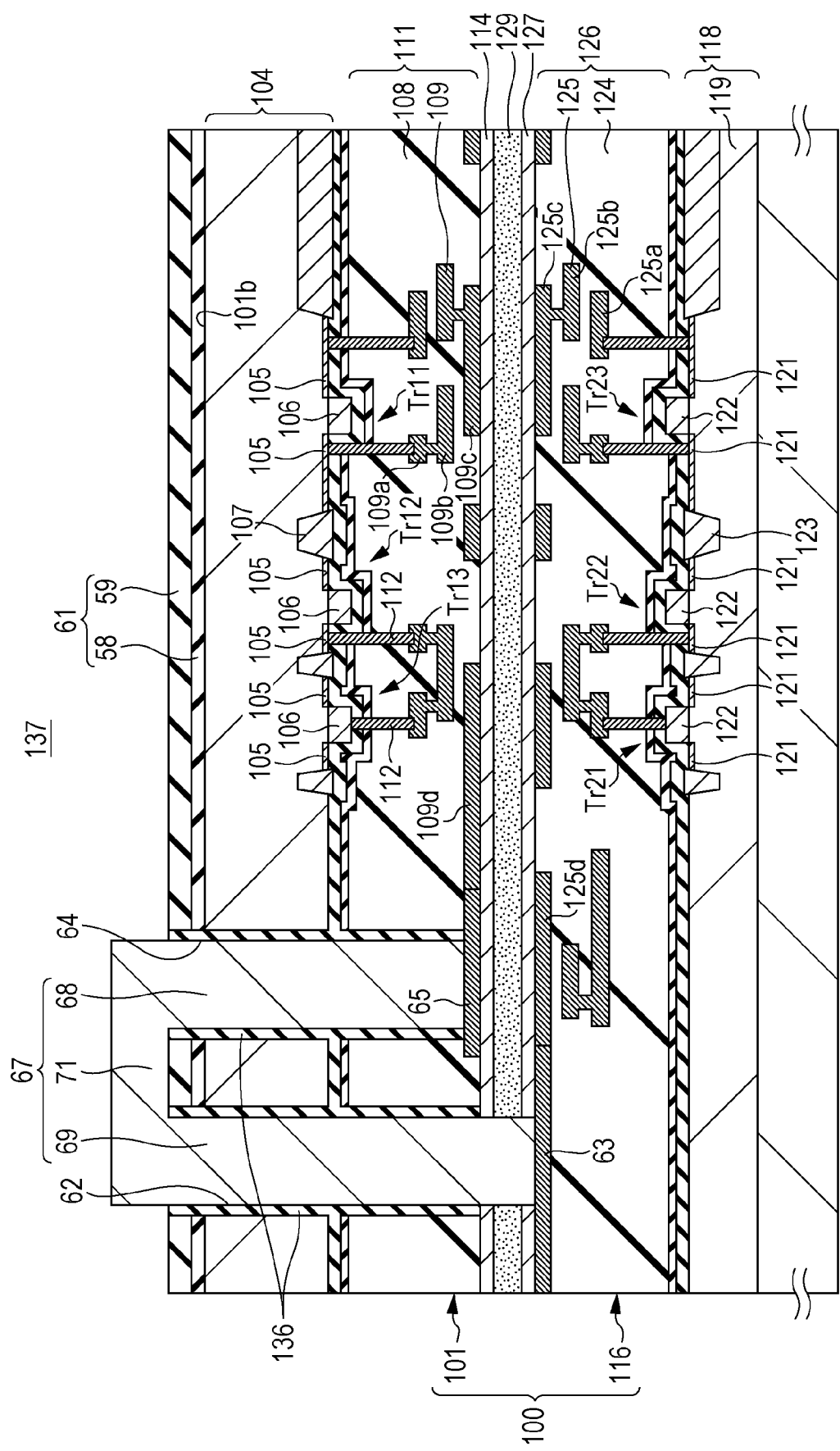
FIG. 45 is a diagram of the overall configuration of still another example of a solid-state imaging device to which a layout of the connection pad is applied according to the embodiment of the disclosure.
Figure 46:
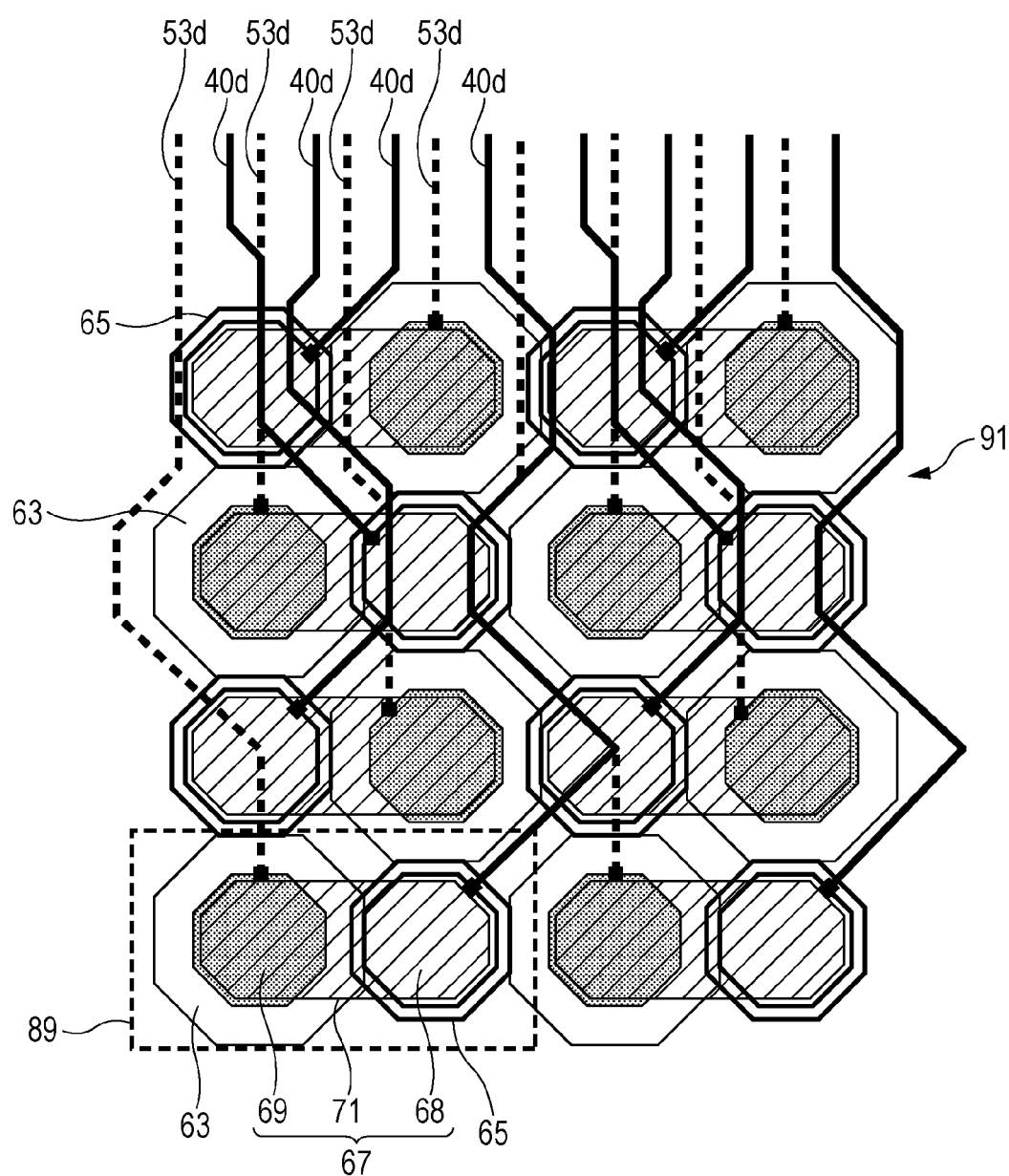
FIG. 46 is a schematic plan view of an example of the layout of the connection pad in the solid-state imaging device of FIG. 45.

FIGS. 45 and 46 are diagrams of a semiconductor device in which the connection wiring is formed without removal of the semiconductor section and the connection pad layout is applied to a semiconductor integrated circuit. A solid-state imaging device 137 according to this embodiment has a configuration in which the semiconductor section is not removed in the region where the connection wiring 67 is formed in the above-described ninth embodiment shown in FIG. 41. In this embodiment, the connection hole 64 perforated through the first semiconductor substrate 31 and reaching the first connection pad 65 is formed. Further, the through connection hole 62 perforated through first semiconductor chip 22 including the semiconductor substrate 31 and reaching the second connection pad 63 is formed. The insulation film 136 for insulation from the semiconductor substrate 31 is formed in the inner surface of each of the connection hole 64 and the through connection hole 62. A connection wiring is formed such that the connection conductor 68 and the through connection conductor 69 are buried in the connection hole 64 and the through connection hole 62 so as to be connected to the first connection pad 65 and the second connection pad 63, respectively, and are connected to each other by the connection conductor 71. The other configuration is the same as that of the sixth embodiment. The same reference numerals are given to the same constituent elements as those shown in FIG. 41, and the description thereof will not be repeated.

On the other hand, as shown in FIG. 46, in this embodiment, the layout of the wiring connection portion including the connection pads 63 and 65 has the same configuration as that shown in FIG. 31. That is, the connection pad array 91 is configured such that the pairs of connection pads 89 formed by the octagonal connection pads 63 and 65 are arranged densely in four stages. The other detailed configuration is the same as that described with reference to FIG. 31. The same reference numerals are given to the same constituent elements as those shown in FIG. 31, and the description thereof will not be repeated.

In the solid-state imaging device 137, as described with reference to FIG. 31, the gap between the adjacent routing wirings 40d and the gap between the routing wirings 53d are enlarged, thereby reducing the adjacent coupling capacitance.

In a solid-state imaging device in which the connection wiring is formed without removal of the semiconductor section and a semiconductor device including an integrated circuit, the layouts of the fifth embodiment (FIG. 36), the sixth embodiment (FIGS. 37 and 38), the seventh embodiment (FIG. 39), and the like can be applied to the layout of the connection pads.

In the above-described solid-state imaging device according to the embodiments, it is necessary to stabilize the potential of the semiconductor substrate, in which the pixel array 23 of the first semiconductor chip unit 22 is formed, or the semiconductor well region. That is, it is necessary to stabilize the potential (so-called substrate potential) of the semiconductor substrate or the semiconductor well region near the through connection conductor 69 and the connection conductor 68 even when the potentials of the through connection conductor 69 and the connection conductor 68 are varied. In order to stabilize the substrate potential, in this example, a contact unit is formed in the semiconductor well region 32 by an impurity diffusion layer. The contact unit is connected to an electrode pad unit formed near the first semiconductor chip unit 22 via the connection conductor 44 and the wiring 40. A power supply voltage or a ground voltage (0 V) is applied to the semiconductor well region 32 via the contact unit by supplying, for example, a power supply voltage VDD or the ground voltage (0 V) to the electrode pad unit. Therefore, the substrate potential of the semiconductor well region is stabilized. For example, when the semiconductor substrate or the semiconductor well region is of an n-type, the power supply voltage is supplied. When the semiconductor substrate or the semiconductor well region is of a p-type, the ground voltage is supplied.

In the above-described solid-state imaging device according to the embodiments, a protective diode is installed so that the transistors in the logic circuit do not receive plasma damage when the connection wiring 67 formed by the through connection conductor 69 and the connection conductor 68 is processed. When the connection wiring 67 is formed, the connection holes 62 and 65 reaching the pads 63 and 65 are formed by plasma etching. However, excessive plasma ions are charged particularly to the connection pads 63 in the logic circuit in the plasma processing. When the charged excessive plasma ions are applied to the transistors in the logic circuit via the wirings 53, the transistors receive so-called plasma damage. The protective diode is used to prevent the plasma damage.

In this embodiment, the protective diode is formed in each logic circuit forming each column circuit unit of the column signal processing circuit 5. As described above, the routing wiring corresponding to each vertical signal line is connected to the through connection conductor 69 and the connection conductor 68 of each connection wiring 67 via each of the connection pads 63 and 65. In the second semiconductor chip unit 26, the protective diode is formed for each column circuit unit in the semiconductor substrate 45 in which the MOS transistors of the column circuit unit are formed. Each protective diode is connected to the same routing wiring to which the gate electrode of the MOS transistor of the column circuit unit is connected. The protective diode connected to the routing wiring is installed close to the connection pad 63 from the MOS transistor of the column circuit unit. In the plasma processing, the charges of the excessive plasma ions charged in the connection pad unit 63 in the logic circuit flow to the protective diode and no damage is caused in the column circuit unit. Accordingly, it is possible to prevent the plasma damage to the column circuit unit in the processing of the connection wiring 67. Further, the same protective diode can be provided not only to prevent the plasma image to the column circuit unit but also to prevent the plasma damage to the MOS transistors forming another peripheral circuit.

Figure 47:
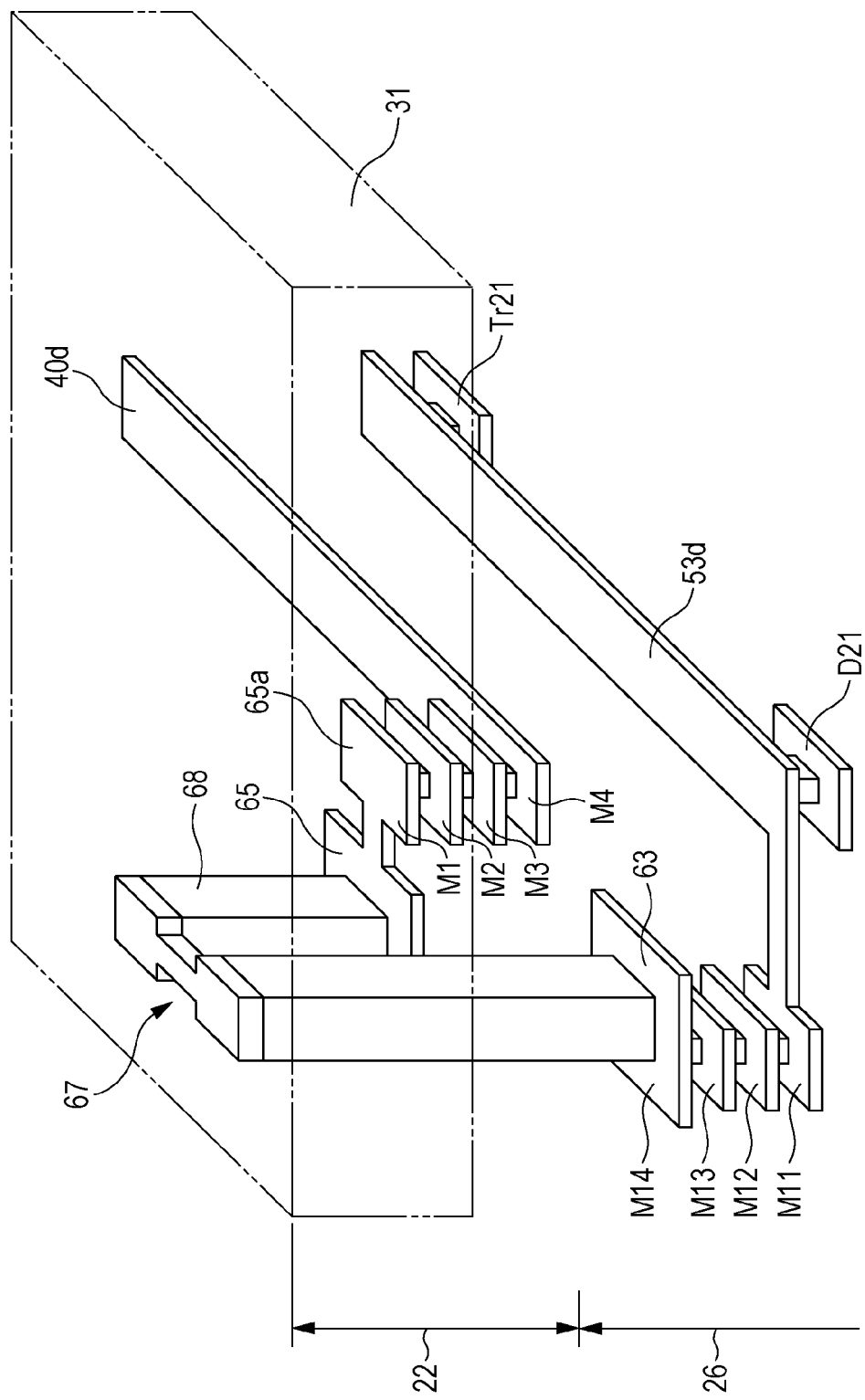
FIG. 47 is a diagram of the overall configuration of a solid-state imaging device including a protective diode according to an embodiment of the disclosure.

A specific example will be described with reference to the schematic diagram of FIG. 47. Here, the example is applied to the solid-state imaging device 135 in which the semiconductor section is not removed in the region where the above-described connection wiring 67 shown in FIG. 43. In this example, the first semiconductor chip unit 22 and the second semiconductor chip unit 26 are electrically connected to each other via the connection wiring 67. In the first semiconductor chip unit 22, the connection conductor 68 of the connection wiring 67 is perforated through the first semiconductor substrate 31 and is connected to the first connection pad 65 formed of the first layer metal M1 of the multi-layer wiring layer 41. The first connection pad 65 is connected to the routing wiring 40d formed of the fourth layer metal M4 through an extension portion 65a of the first layer metal M1, a via conductor 88, the second layer metal M2, a via conductor 88, the third layer metal M3, and a via conductor 88. The routing wiring 40d corresponds to the vertical signal line, as described above.

In the second semiconductor chip unit 26, the connection conductor 69 of the connection wiring 67 is perforated through the first semiconductor substrate 22 and is connected to the second connection pad 63 formed of the fourth layer metal M14 of the multi-layer wiring layer 55. The second connection pad 63 is connected to the routing wiring 53d formed of the first layer metal M11 through a via conductor 88, the third layer metal M13, a via conductor 88, the second layer metal M12, and a via conductor 88. The routing wiring 53d corresponds to the vertical signal line, as described above.

The connection pads 65 and 63 are preferably formed of, for example, an Al film. The reason for using the Al film is as follows. That is, the connection hole 64 and the through connection hole 62 burying the connection conductor 68 and the through connection conductor 69, respectively, are formed by plasma etching by the use of a CF gas. Since the plasma processing is overetching and the connection pads 65 and 63 are exposed to the plasma, a reactant which may not be removed as a Cu film is attached to the surface of the connection pads 65 and 63. The electric connection between the connection pads 65 and 63 and the connection conductor 68 and the through connection conductor 69 by Cu due to the reactant may not be satisfactorily realized. In the case of the Al film, however, since the reactant is not attached, the electric connection between the connection pads 65 and 63 and the connection conductor 68 and the through connection conductor 69 can be satisfactorily realized.

In the case of the Al film, a film configuration having a Ti film or a TiN film on the Al film is provided. A metal (M2 to M4) other than the metal M1 of the connection pad 65 and the metal (M13 to M11) other than the metal M14 of the connection pad 63 are formed of a Cu film.

For example, as described below, when the connection wiring 67 is disposed between a comparator and a counter circuit, a MOS transistor forming a counter circuit operating at high speed is connected to the vertical signal lines. The MOS transistor is formed of the high-speed transistor Tr21 operating at high speed. The high-speed transistor Tr21 is also referred to as a minimum transistor and the gate insulation film is thin. Accordingly, the high-speed transistor Tr21 is connected to the routing wiring 53d serving as the vertical signal line in the second semiconductor chip 26.

In the plasma processing, excessive current flows to the routing wiring 53d via the connection pad 63 and the gate insulation film of the high-speed transistor Tr21 forming the counter circuit may be broken down, that is, damaged. Therefore, a protective diode D21 having a pn junction is connected to the region of the routing wiring 53d closer to the connection pad 63 than the high-speed transistor Tr21. Even when the excessive current flows to the routing wiring 53d in the plasma processing, the excessive current flows toward the substrate via the protective diode D21 and it is possible to prevent the damage to the high-speed transistor Tr21 by the protective diode D21.

In the above-described sixth embodiment (see FIG. 38), the adjacent coupling capacitance is prevented from occurring by disposing the shield wiring 96 between the first connection pad 65 and the routing wiring (vertical signal line) 40d having different potential and crossing immediately below the first connection pad 65. Although not illustrated, the adjacent coupling capacitance is prevented from occurring by disposing the shield wiring between the second connection pad 63 and the routing wiring (vertical signal line) 53d having different potential and crossing immediately below the second connection pad 63.

In the above-described solid-state imaging device, with the first semiconductor chip unit 22 and the second semiconductor chip unit 26, it is preferable to electrically shield the gap between the adjacent routing wirings and the gap between the adjacent routing wirings and the connection conductor or the through connection conductor. Further, in accordance with the arrangement of the pairs of connection pads, it is preferable to electromagnetically shield the gap between the connection conductor and the through connection conductor adjacent to each other, the gap between the adjacent connection conductors, and the gap between the adjacent through connection conductors. In this case, the corresponding shield wirings can be arranged using the metal wirings of the layers of the multi-layer wiring layer.

Although not illustrated, the shield wirings are arranged by other layer metals between the adjacent routing wirings, in the same layer as the routing wirings, or near the routing wirings. The ground potential is applied to the shield wirings. Thus, it is possible to reduce the adjacent coupling capacitance between the adjacent routing wirings.

When the connection pads and the routing wirings are formed by the metals of the same layer, the shield wirings are arranged by the metals of other layers between the adjacent connection conductors 68 and the routing wirings 40d, in the same layer as the wirings 40d, or near the wirings 40d. Further, the shield wirings are arranged by the metals of other layers between the adjacent through connection conductors 69 and the routing wirings 53d, in the same layer as the wirings 53d, or near the wirings 53d. The ground potential is applied to the shield wirings. Thus, it is possible to reduce the adjacent coupling capacitance between the adjacent routing wirings 40d and the connection conductors 68 and between the adjacent routing wirings 53d and the through connection conductors 69.

Figure 48:
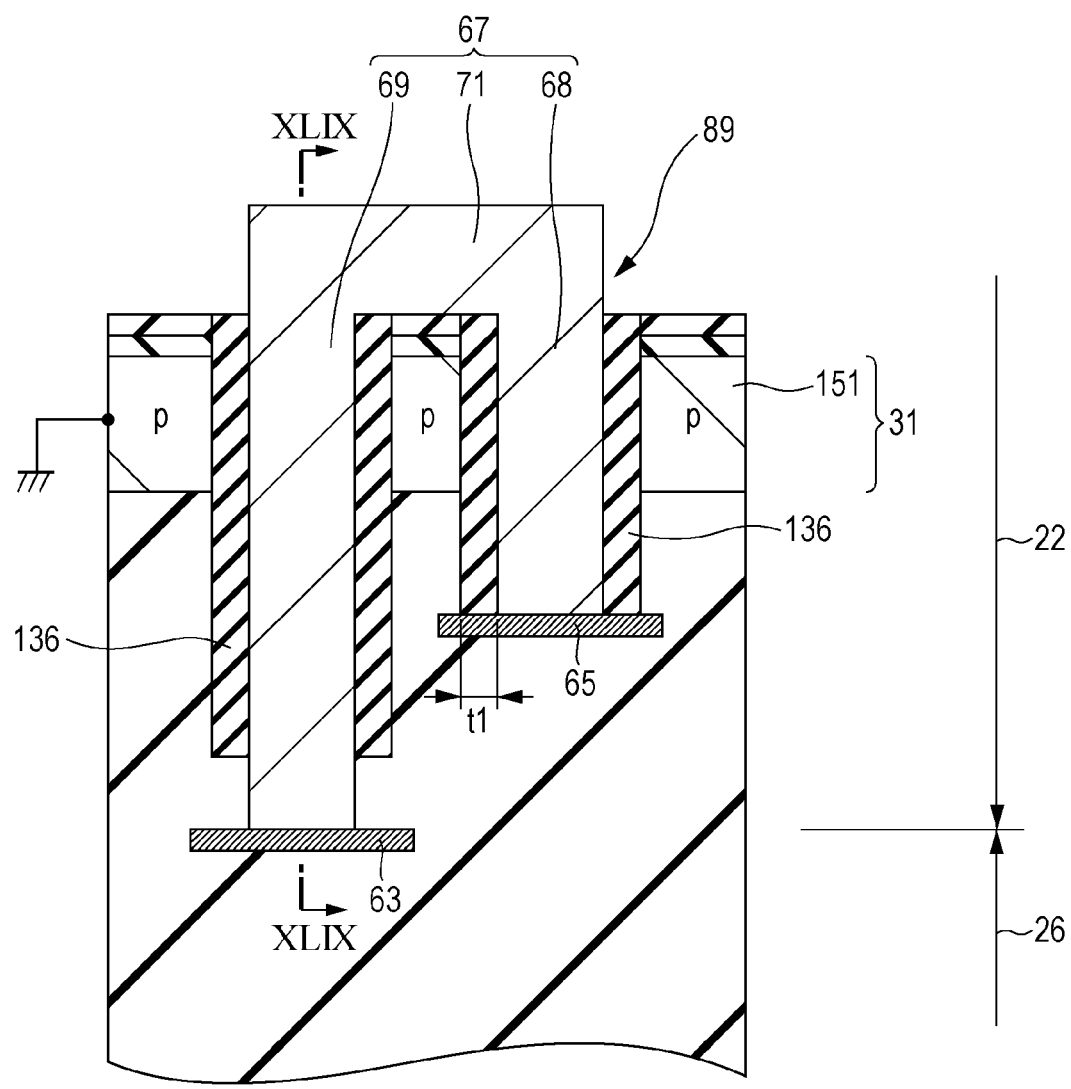
FIG. 48 is a schematic sectional view of the main units in an example of the regions of the connection wirings according to an embodiment of the disclosure.
Figure 49:
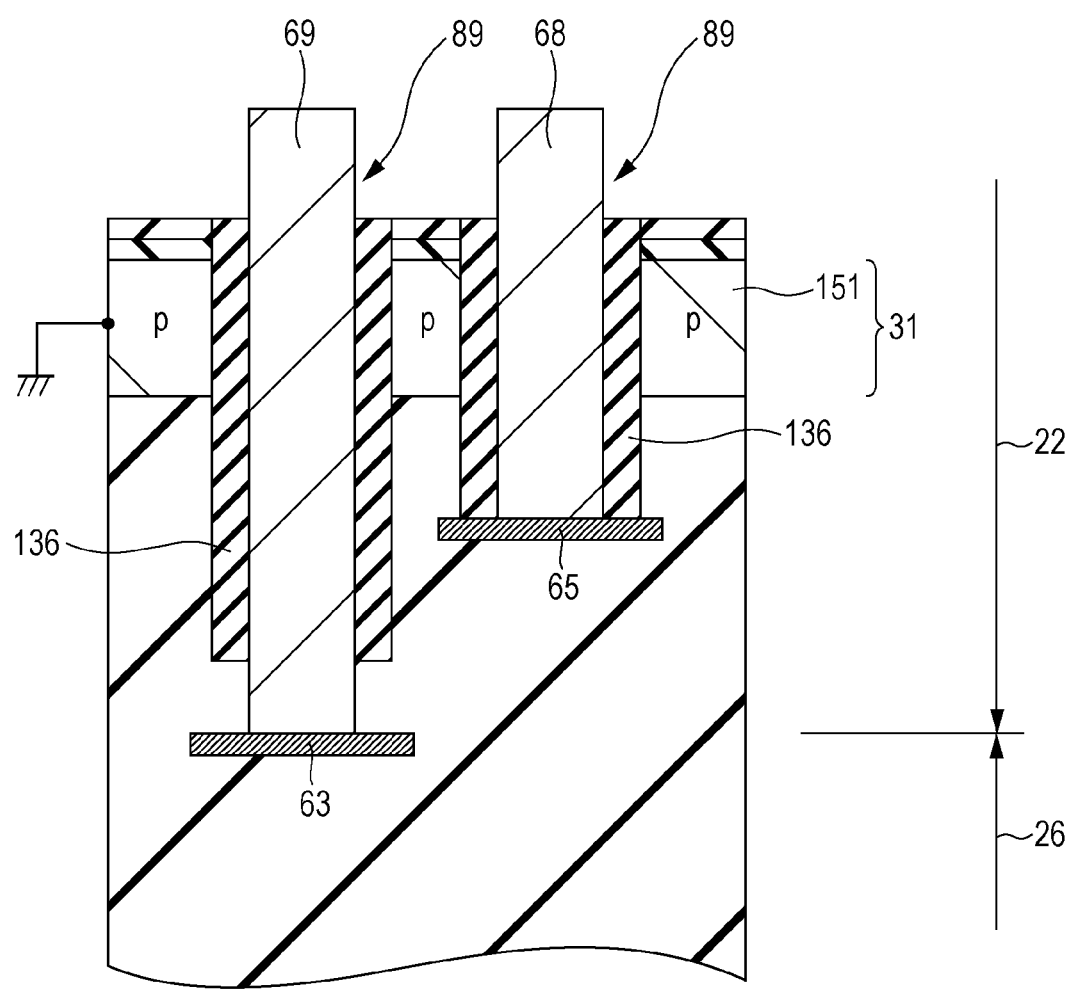
FIG. 49 is a schematic sectional view taken along the line XXXXIX-XXXXIX of FIG. 48.

In the connection wiring region where the plurality of connection wirings 67 is formed, it is possible to reduce the adjacent coupling capacitance by forming a conductive type semiconductor impurity region so as to surround the through connection conductor and the connection conductor with an insulation film interposed therebetween. That is, it is possible to reduce the adjacent coupling capacitance between the adjacent through connection conductor and connection conductor, between the adjacent through connection conductors, or between the adjacent connection conductors. FIGS. 48 and 49 (sectional view taken along the line XXXXIX-XXXXIX of FIG. 49) are schematic diagrams of the example. In this example, the solid-state imaging device 135 in FIG. 43 is used.

In FIGS. 48 and 49, the pairs of connection pads 89 are alternately arranged reversely, as shown in FIG. 37. In the connection wiring region, a p-type semiconductor region 151 is formed in a region surrounding the connection conductor 68 and the through connection conductor 69 of the semiconductor substrate 31 and the p-type semiconductor region 151 is grounded. The p-type semiconductor region 151 is electrically isolated from the connection conductor 68 and the through connection conductor 69 by the insulation film 136. In this configuration, the grounded p-type semiconductor region 151 functions as a shield layer, and thus it is possible to reduce the adjacent coupling capacitance between the adjacent connection conductor 68 and through connection conductor 69. The p-type semiconductor region 151 can be simultaneously formed with the p-type semiconductor region of the element isolation region when an impurity diffusion layer, that is, a p-type semiconductor region is used as the element isolation region isolating the photodiodes PD of the respective pixels.

When the grounded p-type semiconductor region 151 is used as the shield layer, the ground capacity tends to increase. The ground capacity is suppressed by controlling a film thickness t1 of the insulation film 136. The film thickness t1 can be set in the range from 50 nm to 300 nm, for example, can be set to about 100 nm. The larger the film thickness t1 is, the smaller the ground capacity [fF] is. However, when the film thickness t1 is equal to or greater than 300 nm, the ground capacity is not nearly varied.

Figure 50:
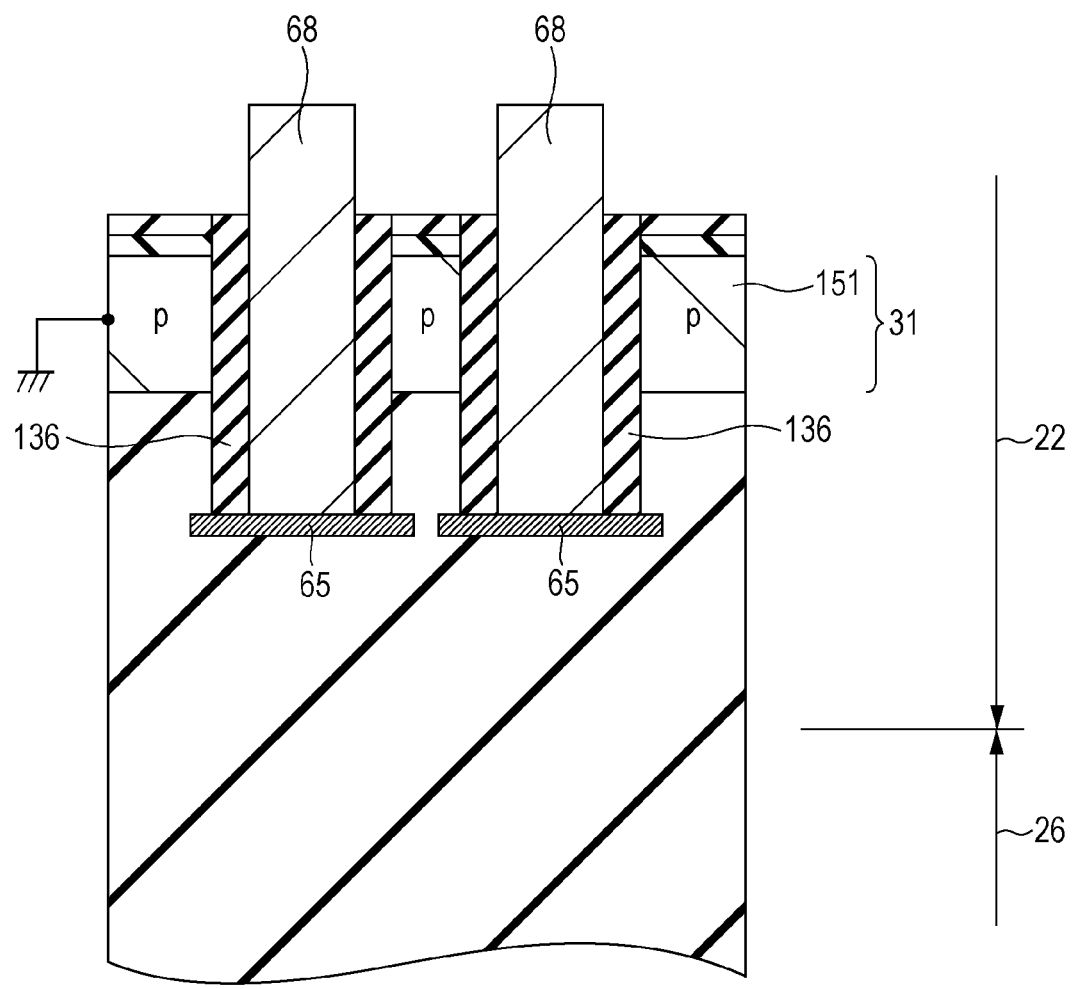
FIG. 50 is a schematic sectional view of the main units in an example of the region of connection conductors adjacent to each other according to an embodiment of the disclosure.
Figure 51:
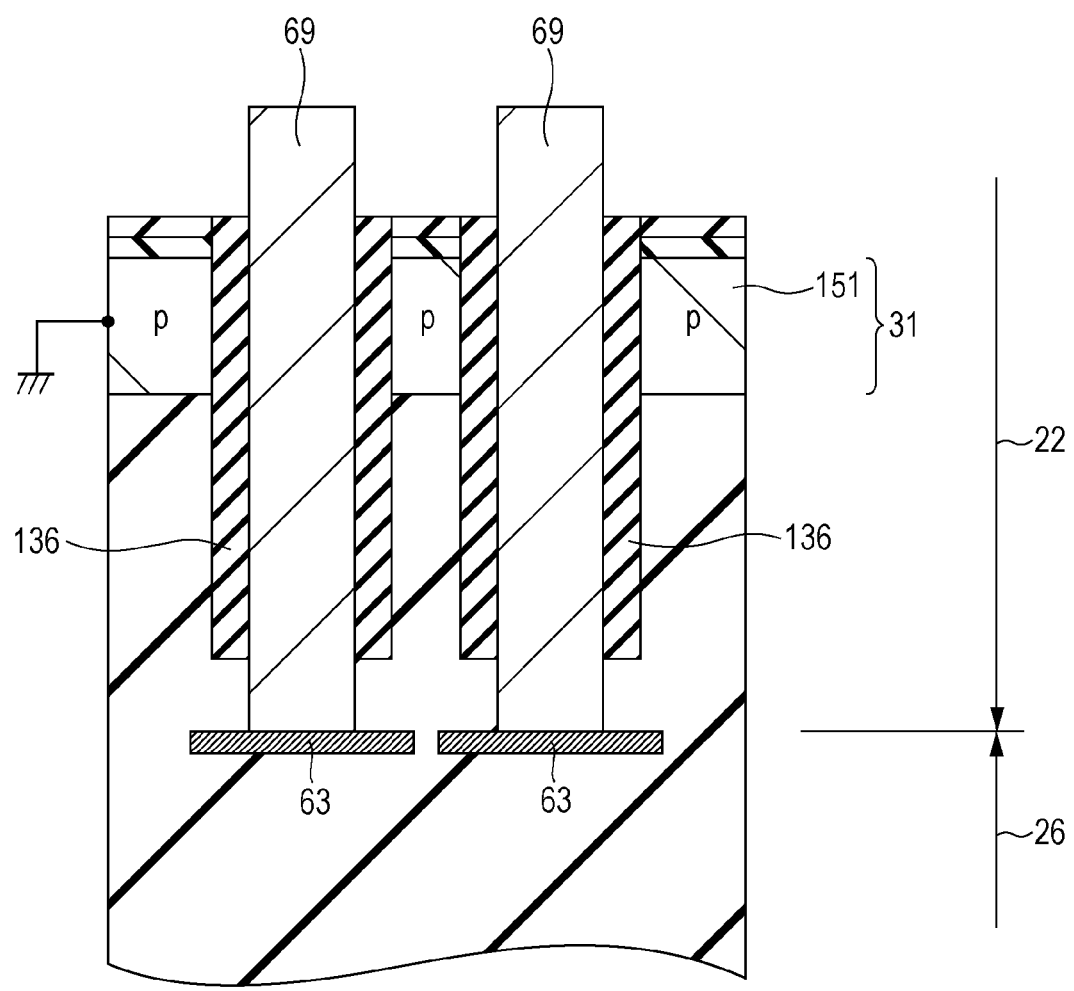
FIG. 51 is a schematic sectional view of the main units in an example of the region configuration of through connection conductors adjacent to each other according to an embodiment of the disclosure.

In the arrangement of the pairs of connection pads 99 shown in FIG. 39, the connection conductor 68 and the through connection conductor 69 adjacent to each other in the vertical direction are configured as in FIG. 49. The connection conductors 68 adjacent to each other in the transverse direction and the through connection conductors 69 adjacent to each other in the transverse direction are configured, as in FIGS. 50 and 51, respectively. In FIGS. 50 and 51, the same reference numerals are given to the same constituent elements as those of FIG. 49 and the description thereof will not be repeated.

Although not illustrated, a contact unit (substrate contact unit) formed by an impurity diffusion layer is formed in the p-type semiconductor region 151 in order to stabilize the potential of the p-type semiconductor region 151 near the connection conductor 68 and the through connection conductor 69, that is, the so-called substrate potential. The contact unit is formed so as to surround the connection wiring region corresponding to the plurality of connection pad arrays and can be connected to the electrode pad on the first semiconductor chip unit 22. By supplying the ground voltage (0 V) to the electrode pad, it is possible to stabilize the substrate potential of the p-type semiconductor region 151 near the connection conductor 68 and the through connection conductor 69.

The semiconductor substrate 31 of the first semiconductor chip unit 22 is formed by setting the n-type semiconductor substrate as a start material. The semiconductor substrate 45 of the second semiconductor chip unit 26 is formed by setting the p-type semiconductor substrate as a start material. When the control circuit 24 and the pixel array 23 shown in FIG. 2B are formed in the first semiconductor chip unit 22, the n-type substrate is present between the p-type semiconductor well region of the pixel array 23 and the p-type semiconductor well region of the control circuit 24. Accordingly, in the first semiconductor chip unit 22, voltages for stabilizing the corresponding potential are supplied from the electrode pads to the p-type semiconductor well region, the n-type semiconductor substrate, the p-type semiconductor region 151 via the substrate contact units. In the second semiconductor chip unit 26, voltages for stabilizing the corresponding potential are supplied to the p-type semiconductor substrate and the n-type semiconductor well region in which the p-channel MOS transistor is formed via the respective substrate contact units.

When the substrate contact units in the first semiconductor chip unit 22 and the second semiconductor chip unit 26 are all connected to, for example, the electrode pads of the surface of the first semiconductor chip unit 22, the connection is realized via separate through connection conductors, connection conductors, and metal wirings of a layer.

When the substrate contact units in the first semiconductor chip unit 22 and the second semiconductor chip unit 26 are all connected to, for example, the electrode pads of the surface of the second semiconductor chip unit 26, the connection is realized via separate through connection conductors, connection conductors, and metal wirings of a layer.

Figure 52:
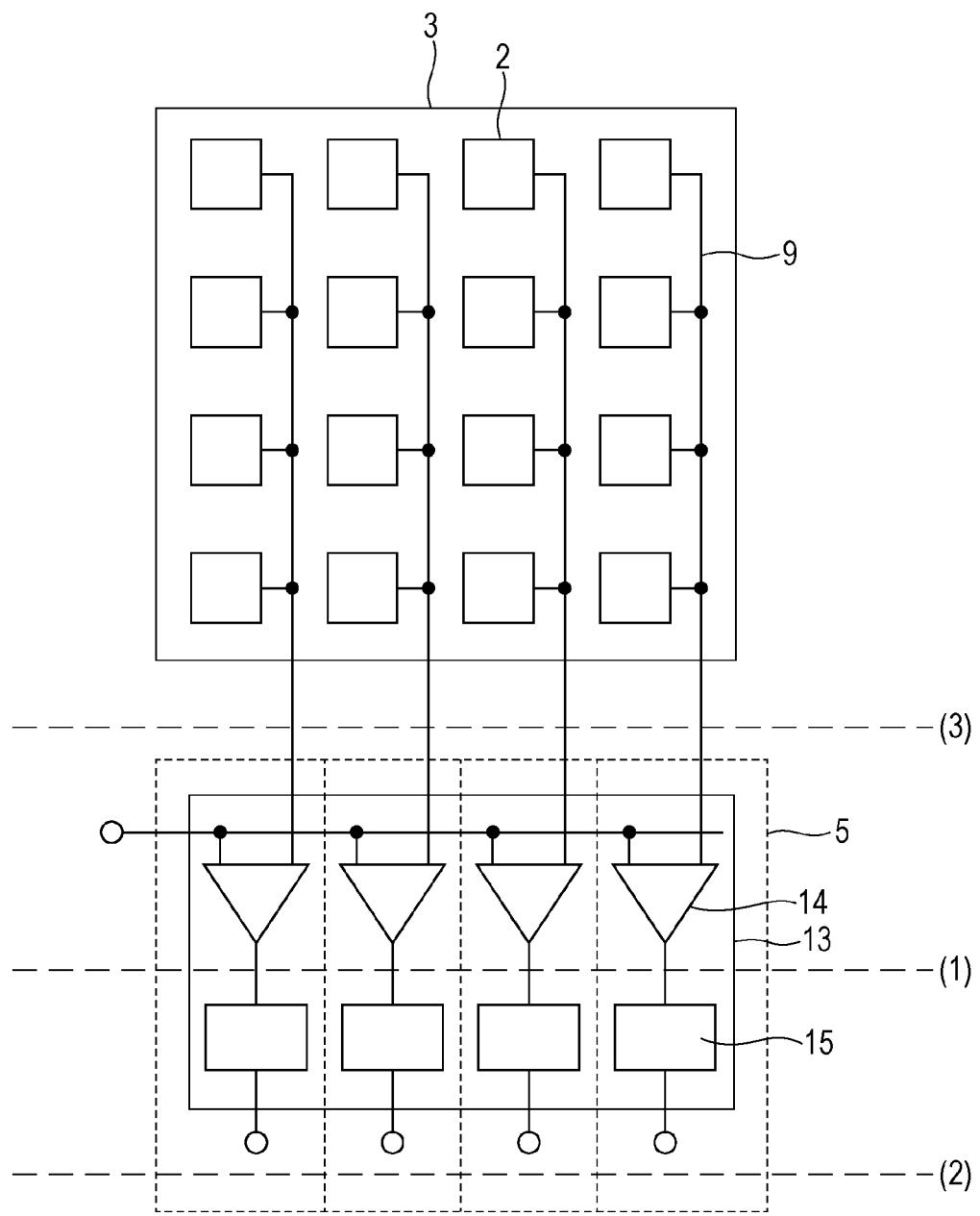
FIG. 52 is a schematic diagram of the insertion positions of connection wirings on a circuit between semiconductor chips according to an embodiment of the disclosure.

Next, a insertion portion of the connection wiring 67 formed by the connection conductor 68 and the through connection conductor 69 described above on a circuit of the solid-state imaging device will be described. FIG. 52 is a schematic diagram of the main units of the solid-state imaging device. The solid-state imaging device includes the pixel array 3 in which the plurality of pixels 2 is arranged in a matrix form, as described above. The column signal processing circuit 5 is connected to the vertical signal lines 9 corresponding to each column of the pixels 2. The column signal processing circuit 5 includes a column ADC unit 13. The column ADC unit 13 converts an analog signal into a digital signal over time from conversion start to determination in which a reference voltage (lamp voltage) is identical to a signal voltage to be processed. In principle, the column ADC unit 13 includes a comparator (voltage comparator) 14 and a count circuit 15. The column ADC unit 13 supplies the lamp voltage to the comparator 14 and starts counting with a reference signal supplied to the count circuit 15. By comparing an analog image signal input via the vertical signal line 9, the column ADC unit 13 performs AD conversion until a pulse signal can be obtained.

In this embodiment, the connection wiring 67 is disposed at a position (1) between the comparator 14 and the counter circuit 15 in FIG. 52. In this case, the circuit configuration of the comparator 14 is formed by the pixel array 3 and the first semiconductor chip unit 22. The second semiconductor chip unit 26 has a circuit configuration after the counter circuit 15. The control circuit can be formed in the first semiconductor chip unit 22 or the second semiconductor chip unit 26. The first semiconductor chip unit 22 and the second semiconductor chip unit 26 may be connected to each other by the connection wiring 67 including the connection conductor 68 and the through connection conductor 69.

Since the counter circuit 15 rapidly performs processing, a high-speed transistor which can operate at high speed is necessary even for the transistor of the counter circuit 15. The high-speed transistor has to be manufactured by an advanced equipment. According to the above-described configuration, the first semiconductor chip unit 22 having the circuit configuration up to the comparator 14 and the second semiconductor chip unit 26 having the circuit configuration after the counter circuit 15 can be separately manufactured by advanced equipments, respectively.

In FIG. 52, the connection wiring 67 can be disposed at position (3) or position (2) in consideration of the performance (image quality) of the solid-state imaging device. That is, the connection wiring 67 can be disposed at position (3) between the pixel array 3 and the column signal processing circuit 5. In this case, the pixel array 3 is formed in the first semiconductor chip unit 22 and the signal processing circuit including the column signal processing circuit 5 is formed in the second semiconductor chip unit 26. Then, the first semiconductor chip unit 22 and the second semiconductor chip unit 26 are connected to each other by the connection wiring 67 including the connection conductor 68 and the through connection conductor 69.

Further, the connection wiring 67 can be disposed at position (2) of the output of the counter circuit 15. In this case, the circuit configuration up to the counter circuit 15 and the pixel array 3 are formed in the first semiconductor chip unit 22. In the second semiconductor chip unit 26, the signal processing circuit after the output of the counter circuit 15 is formed. Then, the first semiconductor chip unit 22 and the second semiconductor chip unit 26 are connected to each other by the connection wiring 67 including the connection conductor 68 and the through connection conductor 69.

The configuration in which the above-described protective diode D21, the configuration in which the p-type semiconductor region 151 near the connection wiring 67 in FIGS. 48 and 51 is provided, the configuration of the substrate contact unit, the configuration of each shield wiring for reducing the adjacent coupling capacitance, and the like can be applied to the above-described embodiments.

12. Eleventh Embodiment

Example of Electronic Apparatus

The solid-state imaging device according to the above-described embodiments of the disclosure can be applied to electronic apparatuses such as camera systems such as digital cameras or video cameras, portable telephones with an imaging function, and other apparatuses with an imaging function.

Figure 53:
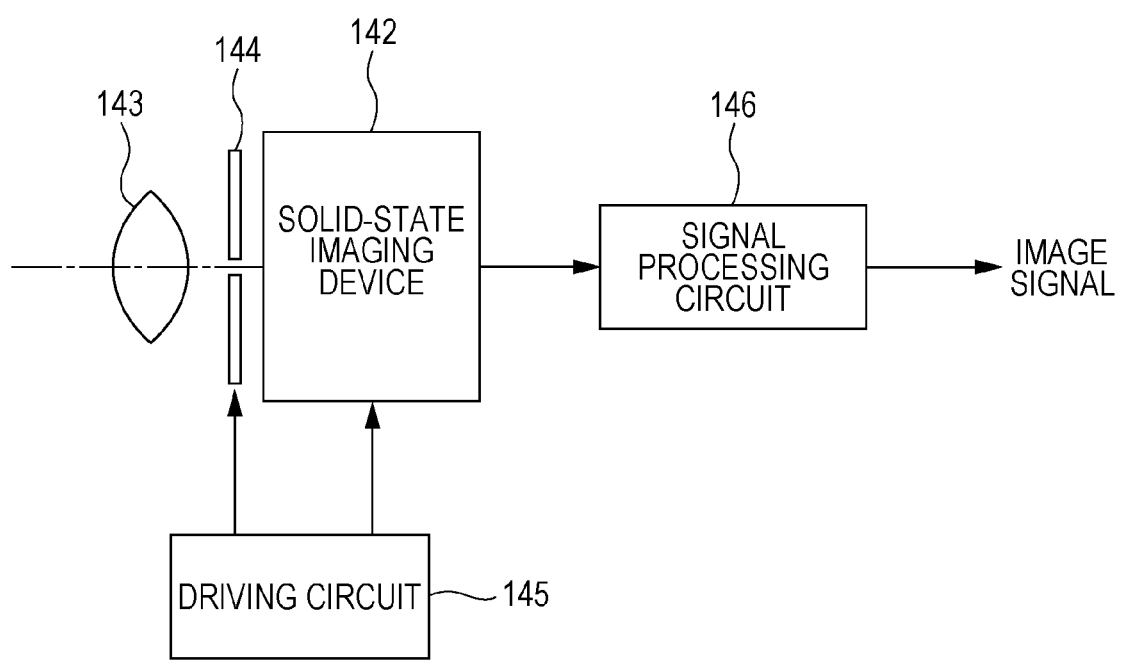
FIG. 53 is a diagram of the overall configuration of an electronic apparatus according to the eleventh embodiment of the disclosure.

FIG. 53 is a diagram of a camera as an example of an electronic apparatus according to an eleventh embodiment of the disclosure. The camera according to this embodiment is an example of a video camera capable of imaging a still image and a video. A camera 141 according to this embodiment includes a solid-state imaging device 142, an optical system 143 guiding incident light toward a light-receiving sensor unit of the solid-state imaging device 142, and a shutter device 144. The camera 141 includes a driving circuit 145 driving the solid-state imaging device 142 and a signal processing circuit 146 processing a signal output from the solid-state imaging device 142.

As the solid-state imaging device 142, one of the solid-state imaging devices according to the above-described embodiments is applied. The optical system (optical lens) 143 images image light (incident light) from a subject on an imaging surface of the solid-state imaging device 142. Thus, signal charges are accumulated for a given period in the solid-state imaging device 142. The optical system 143 may be an optical lens system including a plurality of optical lenses. The shutter device 144 controls a light-emitting period and a light-blocking period for the solid-state imaging device 142. The driving circuit 145 supplies a driving signal for controlling a transmission operation of the solid-state imaging device 142 and a shutter operation of the shutter device 144. The signal transmission of the solid-state imaging device 142 is performed by the driving signal (timing signal) supplied from the driving circuit 145. The signal processing circuit 146 performs various kinds of signal processing. An image signal subjected to the signal processing is stored in a storage medium such as memory or is output to a monitor.

In the electronic apparatus such as the camera according to the eleventh embodiment, it is possible to realize the solid-state imaging device 142 and thus to provide the electronic apparatus with high reliability.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device, comprising:
a first substrate including a pixel array and first connection pads;
a second substrate bonded to the first substrate, the second substrate including second connection pads and a logic circuit for driving the pixel array; and
connection wirings that electrically connect the first connection pads to the second connection pads,
wherein, in a plan view, pairs of connection pads form a connection pad array, each pair of connection pads including one of the first connection pads and one of the second connection pads, and
wherein, in the plan view, at least one of the first connection pads partially overlaps at least one of the second connection pads.

2. The semiconductor device of claim 1, wherein, in the plan view, the first connection pads and the second connection pads have a same shape.

3. The semiconductor device of claim 2, wherein the same shape is an octagonal shape.

4. The semiconductor device of claim 1, wherein, in the plan view, each pair of connection pads is a stage in which the one of the first connection pads and the one of the second connection pads are adjacent to one another in a first direction, and wherein the connection pad array includes two stages in the first direction and four stages in a second direction.

5. The semiconductor device of claim 4, wherein each of the two stages has a pitch in the connection pad array, wherein the first substrate further comprises first vertical signal lines, wherein the second substrate further comprises second vertical signal lines, and wherein, in the plan view, the first and second vertical signal lines are arranged within the pitch.

6. The semiconductor device of claim 5, wherein the first substrate further comprises:
a shield wiring between the first connection pads and the first vertical signal lines to shield the first vertical signal lines from a coupling capacitance.

7. The semiconductor device of claim 6, wherein a width of the shield wiring is the same as a width of each of the first connection pads.

8. The semiconductor device of claim 4, wherein positions of the first connection pads and the second connection pads are swapped for alternate stages in the second direction.

9. The semiconductor device of claim 1, wherein, in the plan view, a surface area of each second connection pad is greater than a surface area of each first connection pad.

10. The semiconductor device of claim 1, wherein the connection pad array includes a first connection pad array and a second connection pad array, wherein, in the plan view, the first connection pad array is located at a first side of the pixel array and the second connection pad array is located at a second side of the pixel array, wherein the first side is opposite the second side.

11. The semiconductor device of claim 1, wherein, in the plan view, each pair of connection pads is a stage in which the one of the first connection pads and the one of the second connection pads are adjacent to one another in a first direction, and wherein the connection pad array includes three stages in a second direction and three stages in the first direction to form three columns and three rows of stages.

12. The semiconductor device of claim 11, wherein, in the plan view, vertical signal lines electrically connected to stages in a first column are between the pairs of connection pads in the first column and the pairs of connection pads in a second column, wherein the second column is adjacent to the first column.

13. An electronic apparatus, comprising:
   a semiconductor device, including:
      a first substrate including a pixel array and first connection pads;
      a second substrate bonded to the first substrate, the second substrate including second connection pads and a logic circuit for driving the pixel array; and
      connection wirings that electrically connect the first connection pads to the second connection pads,
      wherein, in a plan view, pairs of connection pads form a connection pad array, each pair of connection pads including one of the first connection pads and one of the second connection pads, and
      wherein, in the plan view, at least one of the first connection pads partially overlaps at least one of the second connection pads; and
   an optical system that guides light to the pixel array.

* * * * *